United States Patent
Horsky et al.

(10) Patent No.: US 7,528,550 B2
(45) Date of Patent: *May 5, 2009

(54) ION IMPLANTATION SYSTEM AND CONTROL METHOD

(75) Inventors: Thomas N. Horsky, Boxborough, MA (US); Brian C. Cohen, San Clemente, CA (US); Wade A. Krull, Marblehead, MA (US); George P. Sacco, Jr., Wakefield, MA (US)

(73) Assignee: SemEquip, Inc., Billerica, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/648,282

(22) Filed: Dec. 29, 2006

(65) Prior Publication Data

US 2007/0176115 A1 Aug. 2, 2007

Related U.S. Application Data

(63) Continuation of application No. 11/365,719, filed on Mar. 1, 2006, which is a continuation of application No. 10/433,493, filed as application No. PCT/US2001/18822 on Jun. 12, 2001, now Pat. No. 7,064,491, which is a continuation of application No. PCT/US2000/33786, filed on Dec. 13, 2000, and a continuation-in-part of application No. 09/736,097, filed on Dec. 13, 2000, now Pat. No. 6,452,338.

(60) Provisional application No. 60/267,260, filed on Feb. 7, 2001, provisional application No. 60/257,322, filed on Dec. 19, 2000, provisional application No. 60/250,080, filed on Nov. 30, 2000.

(51) Int. Cl.
*H01J 27/00* (2006.01)

(52) U.S. Cl. ............... 315/111.81; 315/111.91; 250/423 R; 250/427

(58) Field of Classification Search ........... 315/111.81, 315/111.21, 111.91, 111.41, 111.51, 111.61; 250/423 R, 427, 423 F, 492.1, 492.2, 492.3
See application file for complete search history.

(56) References Cited

U.S. PATENT DOCUMENTS 3,408,494 A  10/1968  Llewell (Continued)

FOREIGN PATENT DOCUMENTS

JP  S48-47890  7/1973

(Continued)

OTHER PUBLICATIONS

U.S. Appl. No. 11/647,801, filed Dec. 29, 2007, Horsky et al.
U.S. Appl. No. 11/365,719, filed Mar. 1, 2006, Horsky et al.

*Primary Examiner*—David Hung Vu
(74) *Attorney, Agent, or Firm*—John S. Paniaguas; Katten Muchin Rosenman LLP

(57) ABSTRACT

An ion implantation is disclosed that includes an ionization chamber having a restricted outlet aperture and configured so that the gas or vapor in the ionization chamber is at a pressure substantially higher than the pressure within an extraction region into which the ions are to be extracted external to the ionization chamber. The vapor is ionized by direct electron impact ionization by an electron source that is in a region adjacent the outlet aperture of the ionization chamber to produce ions from the molecules of the gas or vapor to a density of at least $10^{10}$ cm$^{-3}$ at the aperture while maintaining conditions that limit the transverse kinetic energy of the ions to less than about 0.7 eV. The beam is transported to a target surface and the ions of the transported ion beam are implanted into the target.

36 Claims, 31 Drawing Sheets

U.S. PATENT DOCUMENTS

| | | | |
|---|---|---|---|
| 3,908,183 | A | 9/1975 | Ennis, Jr. |
| 3,915,757 | A | 10/1975 | Engel |
| 4,883,968 | A | 11/1989 | Hipple et al. |
| 4,904,902 | A | 2/1990 | Tamai et al. |
| 5,293,508 | A | 3/1994 | Shiratake et al. |
| 5,387,843 | A * | 2/1995 | Nagayama et al. ..... 315/111.81 |
| 5,420,415 | A | 5/1995 | Trueira |
| 5,420,437 | A * | 5/1995 | Siess ...................... 250/492.3 |
| 5,523,652 | A | 6/1996 | Sferlazzo et al. |
| 5,539,203 | A | 7/1996 | Ohdomari |
| 5,563,418 | A | 10/1996 | Leung |
| 5,668,368 | A | 9/1997 | Sakai et al. |
| 5,760,405 | A | 6/1998 | King et al. |
| 5,857,889 | A * | 1/1999 | Abbott ........................ 445/49 |
| 5,914,494 | A * | 6/1999 | Abbott .................. 250/492.21 |
| 6,016,036 | A | 1/2000 | Brailove |
| 6,022,258 | A * | 2/2000 | Abbott et al. ................. 445/49 |
| 6,130,436 | A | 10/2000 | Renau et al. |
| 6,137,231 | A | 10/2000 | Anders et al. |
| 6,239,440 | B1 * | 5/2001 | Abbott .................. 250/423 R |
| 6,242,750 | B1 * | 6/2001 | Takahashi et al. ...... 250/492.21 |
| 6,294,862 | B1 | 9/2001 | Brailove et al. |
| 6,388,381 | B2 | 5/2002 | Anders |
| 6,583,428 | B1 * | 6/2003 | Chipman et al. ........ 250/492.21 |
| 7,022,999 | B2 * | 4/2006 | Horsky et al. ................ 250/427 |
| 7,185,602 | B2 * | 3/2007 | Horsky et al. ......... 118/723 HC |

FOREIGN PATENT DOCUMENTS

| | | |
|---|---|---|
| JP | S61-253734 | 11/1986 |
| JP | S63-84863 | 4/1988 |
| JP | H3-276546 | 12/1991 |
| JP | 4006740 | 1/1992 |
| JP | 53114945 | 11/1993 |
| JP | 7153419 | 6/1995 |
| JP | 8017376 | 1/1996 |
| JP | H8-298247 | 11/1996 |
| JP | 11086778 | 3/1999 |
| JP | 2000-268740 | 9/2000 |
| WO | WO 97/32335 | 9/1997 |

* cited by examiner

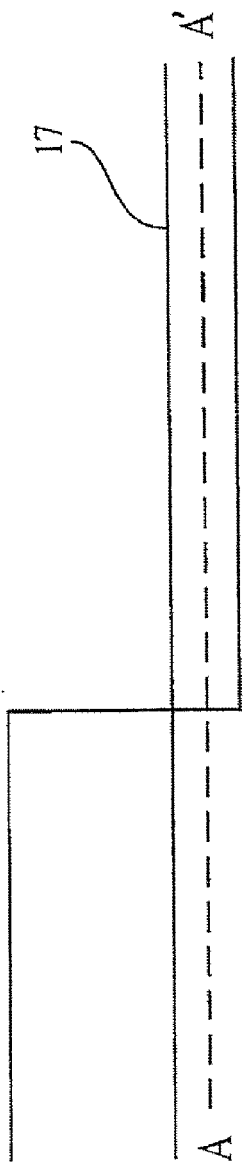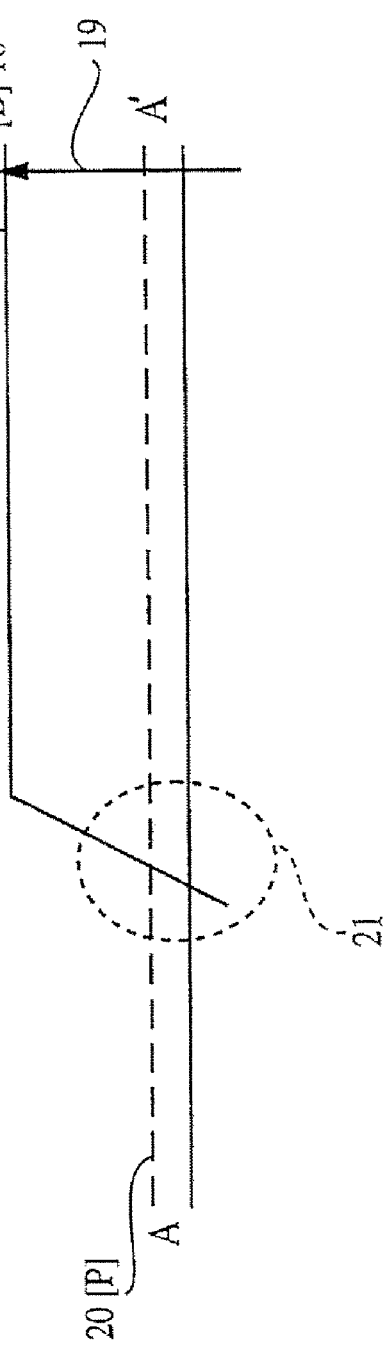
FIG. 14a
FIG. 14b

ION IMPLANTATION SYSTEM AND CONTROL METHOD

CROSS REFERENCE TO RELATED APPLICATIONS

This application is a continuation of U.S. patent application Ser. No. 11/365,719, filed on Mar. 1, 2006, which is a continuation of U.S. patent application Ser. No. 10/433,493, filed Jan. 8, 2004, now U.S. Pat. No. 7,064,491, which is a U.S. national phase of PCT Application No. PCT/US01/18822, filed Jun. 12, 2001, which is a continuation of PCT Application No. PCT/US00/33786, filed Dec. 13, 2000, which claims priority and benefit of U.S. Provisional Patent Application No. 60/267,260 filed on Feb. 2, 2001, U.S. Provisional Patent Application No. 60/257,322 filed on Dec. 19, 2000, U.S. Provisional Patent Application No. 60/250,080 filed on Nov. 30, 2000, and is a continuation-in-part of U.S. patent application Ser. No. 09/736,097, filed Dec. 13, 2000, now U.S. Pat. No. 6,452,338.

TECHNICAL FIELD

This invention relates to ion sources, implantation, and more particularly to ion implantation with high brightness, low emittance ion sources, acceleration-deceleration transport systems and improved ion source constructions.

BACKGROUND

The following patent applications, herein incorporated by reference, describe the background of this invention: Provisional Patent Application Ser. No. 60/267,260, inventor Thomas N. Horsky, filed Feb. 7, 2001, entitled Ion Source for Ion Implantation; Provisional Patent Application Ser. No. 60/257,322, inventor Thomas N. Horsky, filed Dec. 19, 2000, entitled Ion Implantation; PCT Application Serial Number US00/33786, inventor Thomas N. Horsky, filed Dec. 13, 2000, entitled Ion Implantation Ion Source, System and Method and filed Nov. 30, 2000, having the same reference. The referenced patent, for U.S. Purposes, is a continuation in part of my U.S. Provisional Applications 60/170,473 filed Dec. 13, 1999 60/170,473, now expired.

Background: Ion Implantation

Ion implantation has been a key technology in semiconductor device manufacturing for more than twenty years, and is currently used to fabricate the p-n junctions in transistors, particularly for CMOS devices such as memory and logic chips. By creating positively-charged ions containing the dopant elements (for example, $^{75}$As, $^{11}$B, $^{115}$In, $^{31}$P, or $^{121}$Sb) required for fabricating the transistors in, for example, silicon substrates, the ion implanters can selectively control both the energy (hence implantation depth) and ion current (hence dose) introduced into the transistor structures. Ion implanters have traditionally used ion sources which generate ribbon beams of up to about 50 mm in length; these beams are transported to the substrate and the required dose and dose uniformity is accomplished by electromagnetic scanning of the ribbon across the substrate, mechanical scanning of the substrate across the beam, or both.

With the recent advent of 300 mm-diameter silicon substrates in chip manufacturing, there has been a keen interest in producing ribbons of larger extent than has heretofore been possible with conventional ion implanter designs, in order to increase wafer throughput when using these larger substrates. Taller ribbon beams enable higher dose rates, since more ion current can be transported through the implanter beam line due to reduced space charge blowup of the extended ribbon beam. Many of these new implanter designs also incorporate a serial (one wafer at a time) process chamber, which offers high tilt capability (e.g., up to 60 degrees from substrate normal). The ion beam is typically electromagnetically scanned across the wafer, which is mechanically scanned in the orthogonal direction, to ensure dose uniformity. In order to meet implant dose uniformity and repeatability specifications, the ion beam must have excellent angular and spatial uniformity (angular uniformity of beam on wafer of <1 deg, for example). The production of beams possessing these characteristics imposes severe constraints on the beam transport optics of the implanter, and the use of large-emittance plasma-based ion sources often results in increased beam diameter and beam angular divergence, causing beam loss during transport due to vignetting of the beam by apertures within the beam line. Currently, the generation of high current ion beams at low (<2 keV) energy is problematic in serial implanters, such that wafer throughput is unacceptably low for certain low-energy implants (for example, in the creation of source and drain structures in leading-edge CMOS processes). Similar transport problems exist for batch implanters (processing many wafers mounted on a spinning disk), particularly at low beam energies.

While it is possible to design beam transport optics which are nearly aberration-free, the beam characteristics (spatial extent and angular divergence) are nonetheless determined to a large extent by the emittance properties of the ion source (i.e., the beam properties at ion extraction which determine the extent to which the implanter optics can focus and control the beam as emitted from the ion source). Arc-discharge plasma sources which are currently in use have poor emittance, and therefore limit the ability of ion implanters to produce well-focused, collimated, and controllable ion beams.

Background: Ion Implantation Sources

The standard ion source technology of the implanter industry is the Enhanced Bernas source. As illustrated in FIG. 1, this is an arc discharge source which incorporates a reflex geometry: a hot filament cathode immersed in the ionization chamber (where the dopant feed gas resides) emits thermionic electrons confined by a magnetic field, and are reflected from an anticathode located at the opposite end of the chamber. Thus, the electrons execute helical trajectories between the cathode and anticathode, and generate a high-density plasma (on the order of $10^{12}$ ions/cm$^2$). This so-called "plasma column" is parallel to an ion extraction aperture slot from which the ions are extracted by beam-forming optics. By generating a high-density plasma and sustaining discharge currents as high as 10A, the Enhanced Bernas source efficiently dissociates tightly-bound molecular species such as $BF_3$. However, the emittance of this source is large due to the following plasma-related effects:

1) The plasma potential (typically about 5 V) introduces a random component of velocity to the ions, which directly translates into increased angular dispersion of the extracted ions.
2) The temperature of the ions and electrons within the plasma can reach 10,000 K, introducing a thermal velocity which adds to (1), and also introduces an energy spread of several eV to the ions (according to a Maxwell-Boltzmann distribution), making the beam exhibit chromatic aberrations.

3) Coulomb scattering between the ions in the plasma introduces an additional non-thermal spread in the ion energy.
4) A high extracted current density is needed due to a predominance of unwanted ions (i.e., fragments such as $BF^+$, $BF_2^+$, and $F-$ in a $BF_3$ plasma), increasing space-charge forces at extraction and causing emittance growth.
5) The presence of a strong magnetic field, required for operation of all arc discharge sources, causes beam deflection and hence further emittance growth of the extracted ion beam, especially at low beam energy.
6) High-frequency noise present in the plasma is propagated into the beam as high-frequency fluctuations in beam current and in beam potential. This time-varying beam potential makes charge compensation in the beam plasma difficult to maintain, since it can cause a significant steady or even abrupt loss of the low-energy electrons which normally orbit the beam (being trapped by the positive beam potential), leading to space-charge blowup of the ion beam.
7) The ion extraction aperture cannot be significantly elongated beyond, say, 75 mm (typical length is between 20 mm and 50 mm), since this requires a significant elongation of the plasma column. Bernas sources become unstable if the separation between cathode and anticathode is large, and larger cathode-anticathode separations requires a much higher arc discharge current in order to maintain a stable plasma, increasing power consumption.

Background: Ion Deceleration

Ion implanters or conventional design exhibit poor transmission of low-energy boron at energies below a few keV, with the result that these boron beam currents are too small to be cost-effective in manufacturing semiconductor chips using sub-0.18 micron design rules. Next-generation implanters which have been long-in-planning, and which were introduced into the capital equipment market within the last few years incorporate a different principle of ion optics, attempting to solve this low-energy transmission problem. To counter the effects of space charge repulsion between ions, which dominates beam transport at low energies, a so-called "decel" (i.e. deceleration) approach has been developed to allow the ion beam to be extracted and transported through the implanter at a higher energy than the desired implantation energy so that space charge effects are not so detrimental, and by introducing a deceleration stage late in the beam-line, but upstream from the wafer target, reducing the ions to the desired implant energy as the ions approach the wafer target. For example, the ion beam can be extracted and transported at 2 keV, but decelerated to 500 eV before the ions reach the wafer, achieving a much higher beam current than is obtainable with space-charge-limited beams in beam lines of a conventional, non-deceleration design. Unfortunately, this method of employing deceleration still has posed significant problems which have detracted from its production-worthiness. As the ion beam passes through the deceleration lens to the wafer, the ion beam becomes spatially non-uniform to a great degree, and the ions impact the substrate with a wide distribution of angles of incidence relative to the wafer surface, with potential so-called channeling effects. The spatial and angular dose uniformity of a decelerated beam is typically much worse than in conventional, non-deceleration ion implantation. This makes it difficult to achieve a uniform dose, and introduces the need to take other steps which affects cost and throughput. Compounding the problem is the fact that the grossly non-uniform profile of the ion beam also interferes significantly with accurate dosimetry of the implant, since ion implanters typically sample only a portion of an ion beam at or behind the plane of the wafer. Dosimetry is used to control the degree of implant within a desired range. The accuracy problems with dosimetry produced by partial sampling of a severely extended and non-uniform distribution of ion current in the beam of an acceleration/deceleration implantation system thus also affects the accuracy of the implant, the capital cost of the implant system, the quality of the wafers, and throughput of the system.

Another, quite different approach for shallow, low energy implants has been proposed (but not implemented in current production) it is that of using molecular ion beams (having clusters of the dopant atom of interest) in conventional implanters that do not have a deceleration stage. Decaborane is one example of such molecular material.

Chip manufactures are currently moving to 300 mm-diameter silicon substrates for fabricating Complimentary Metal-Oxide-Semiconductor (CMOS) memory and logic chips to reduce manufacturing cost over that attainable with 200 mm substrates. Though such a shift in wafer size requires building new factories populated with new semiconductor manufacturing tools for processing the larger-diameter wafers, the potential reduction per die is about a factor of two. Thus, the expenditure of billions of US dollars for these facilities has been hoped to enable lower-cost manufacturing, and ultimately a huge competitive advantage for volume manufacturing of both commodity and leading-edge semiconductor chips. Such a cost reduction can only be fully realized if the throughput of wafer units of the fab tools (the tools the fabrication facility) is the same for 300 mm as 200 mm substrates, which been to some extent been assumed would be the case. Unfortunately, in the case ion implantation to fabricate ultra-shallow (and ultra high density) semiconductor junctions, even the last acceleration/deceleration implanters continue to be dose-rate-limited in their wafer throughput, so that there has been essentially little or no net increase in productivity of semiconductor dies by use of the lager wafers. This is a potentially difficult situation for the chip manufacturer: if many more implanters must be put into production to make up their reduced output, the potential cost reduction per die sought by use of the larger wafer geometry cannot be realized due to the increased cost of performing these critical implants (more investment in capital equipment, fab floor space, maintenance cost, etc.).

Background: Ion Doping

Over the last decade, implantation systems have been developed for the ion implantation of very large substrates from which flat-panel displays are manufactured. These "Ion Doping" systems deliver long ribbon ion beams to the glass or quartz substrates, which are typically mechanically scanned across a stationary ion beam. The substrate dimension can be as large as a meter, and so the ion ribbon beam must likewise be long enough to ensure uniform doping (typically wider than the substrate). In order to generate such long ribbon beams, large-volume "bucket" sources are used. Bucket sources in a rectangular or cylindrical geometry are chambers surrounded by ail array of permanent magnets which provide magnetic confinement for the enclosed plasma through the creation of cusp magnetic fields. The plasma is generated by one or more RF antennas which couple RF power to the plasma. An extraction lens forms the ribbon beam from the large-diameter source.

Because of the size of the ion doping system, mass analysis is not used, therefore all ion species created in the bucket source are transported to and implanted into the substrate. This creates many process-related problems including variations in ion implantation depth, and also the implantation of unwanted species. Bucket sources are also particularly susceptible to the accumulation of deposits within their large ionization volume, hence the potential of severe cross-contamination between n- and p-type dopants requires the use of dedicated-use ion doping systems: the user must purchase one tool for p-type (e.g., boron from diborane gas) and a second complete tool for n-type (e.g., phosphorus from phosphene gas) dopants. This requirement not only doubles the customer's capital equipment costs, but substantially increases the risk of reduced product yield, since moving the substrates between systems requires further wafer handling steps and increased exposure of the substrates to atmosphere.

Thus, the prior art bucket source technology suffers from the following limitations:

(1) Large footprint (width, height and length).
(2) High degree of expense and complexity.
(3) Low ion production efficiency due to the loss of B (from $B_2H_6$ feed gas) and P (from $PH_3$ feed gas) to the walls of the ion source due to the very large wall surface area and large volume of the source.
(4) Contamination and particulate problems associated with the rapid accumulation of deposits within the ion source associated with (3), reducing product yield.
(5) Production of many unwanted ions which are implanted into the substrate, resulting in a lack of implantation process control and a concomitant degradation of device characteristics. For example, significant fractions of $H^{30}$ and $BH_x^+$, as well as $B_2H_x^+$, are produced in the $B_2H_6$ plasma commonly used to implant boron, a p-type dopant.
(6) Implantation of large currents of $H^{30}$ (a result of (5)) during the implantation process limits attainable dose rate and hence throughput, since the total ion current delivered to the substrate must be held below a certain limit to prevent overheating of the substrate.

SUMMARY

In one aspect, the invention provides a method of ion implantation by producing a high brightness ion beam that extends along an axis by ionizing molecules of a gas or vapor, the molecules containing an implantable species. The method includes providing an ionization chamber having a restricted outlet aperture; providing in the ionization chamber the gas or vapor at a pressure substantially higher than the pressure within an extraction region into which the ions are to be extracted external to the ionization chamber, by direct electron impact ionization by primary electrons, ionizing the gas or vapor in a region adjacent the outlet aperture of the ionization chamber in a manner to produce ions from the molecules of the gas or vapor to a density of at least about $10^{10}$ cm$^{-3}$ at the aperture while maintaining conditions that limit the transverse kinetic energy of the ions to less than about 0.7 eV, the width of the ionization volume adjacent the aperture, in which said density of ions is formed, being limited to a width less than about three times the corresponding width of the outlet aperture; and conditions within the ionization chamber being maintained to prevent formation of an arc discharge, by an extraction system, extracting ions formed within the ionization chamber via the outlet aperture into the extraction region downstream of the aperture, thereafter, with ion beam optics, transporting the beam to a target surface, and implanting the ions of the transported ion beam into the target.

Variations of this aspect of the invention may include one or more of the following features. Conditions are maintained within the ionization chamber to prevent formation of a plasma. The brightness of the ion beam upon extraction is more than about 1 mA-cm$^{-2}$-deg$^{-2}$×($E_0$/E), where E is the beam energy, and $E_0$=10 keV. The x-emittance of the beam upon extraction is less than about 70 mm-mrad×($E_0$/E)$^{1/2}$ (where E is the beam energy and $E_0$=10 keV), for an ion current density of at least 1 mA/cm$^2$, even for an ion mass of 120 amu. The beam noise of the stream of ions extracted through the outlet aperture is maintained below 1%. The field strength of any magnetic field present in the ionization chamber is less than 70 gauss. The field strength of any magnetic field present in the ionization chamber is less than 20 gauss. There is substantially no magnetic field present in the ionization chamber. Any magnetic field present in the extraction region has a field strength of less than about 20 gauss. The consumption of the gas or vapor is maintained less than 10 sccm. The primary electrons are introduced into the ionization chamber by electron optics in a directed beam generated external to the ionization chamber. The molecules to be ionized respectively comprise or consist of at least two atoms of the implantable species.

In another aspect, the invention provides a method of ion implantation including producing a high brightness ion beam that extends along an axis by providing an ionization chamber having an outlet aperture, providing in the ion chamber molecules of a gas or vapor, in which each molecule to be ionized comprises or consists of at least two atoms of an implantable species, ionizing the molecules and extracting ions formed from said molecules under conditions to produce a beam having, upon extraction, a brightness of upon extraction is more than about 1 mA-cm$^{-2}$-deg$^{-2}$×($E_0$/E), where E is the beam energy, and $E_0$=10 keV and an x-emittance of less than about 70 mm-mrad×($E_0$/E)$^{1/2}$ (where E is the beam energy and $E_0$=10 keV), for an ion current density of at least 1 mA/cm$^2$, even for an ion mass of 120 amu, thereafter, with ion beam optics, transporting the beam to a target surface, and implanting the ions of the transported ion beam into the target.

Variations of this or any other aspect of the invention may include one or more of the following features. The molecules are dimers. The molecules comprise decaborane. The method is conducted in a manner to cause the high brightness ion beam to have a low angular divergence at contact with the target of less than about one degree relative to the axis. The step of implanting the ions of the transported ion beam into the target is employed to cause the high brightness, low divergence beam to form a drain extension region of a transistor structure on the target, in which the transistor structure comprises a source, a gate and a drain. The target further comprises a well dopant and the gate of the transistor structure has a gatelength of 0.20 um or less, the drain extension intersecting the gate at a lateral junction edge, the drain extension having a lateral abruptness of 3 nm/decade or less, wherein lateral abruptness is defined as the lateral extent required to accomplish a one decade change in the volume concentration of the implanted species at the lateral junction edge, the junction edge being defined as the region where the volume concentrations of the implanted ions and the well dopant are equal. The drain extension has a lateral abruptness of 2 nm/decade or less. The ions of the high brightness, low angular divergence beam are implanted at opposite ends of the gate, sharply defining a channel beneath the gate. Sharply defining the channel beneath the gate includes sharply defining the length of the channel.

In another aspect, the invention provides an ion implantation system for implanting at a desired low implant energy into a target substrate comprising an ion source for producing molecular ions (based on a molecule having a cluster of atoms of the desired species to be implanted), an acceleration stage enabling the ions to be accelerated to a transport energy substantially greater than the desired implant energy, and prior to the target substrate, a deceleration stage for lowering the energy of the ions to the desired implant energy.

Variations of this aspect of the invention may include one or more of the following features. The ion source includes an electron gun for producing a beam of electrons at controlled energy adapted to ionize the molecules by direct electron impact ionization. The energy of the electrons is between about 20 eV and 500 eV. The gun is arranged relative to an ion chamber to cause the beam of electrons to transit the chamber to a beam dump. A lengthy elongated ionization chamber has a correspondingly elongated slot-form extraction aperture, and electron optics following the aperture are constructed to reduce the length of the profile of the resultant beam, relative to the corresponding length of the extraction aperture, prior to the beam entering the analyzer. The electron optics comprises a telescope. The extraction aperture of the ionization chamber is of the order of about 6 inches in length. The ion implantation system is constructed for batch operation, a set of wafers being mounted on a carrier that moves relative to the beam to effect scanning. The ion implantation system is constructed as a serial ion implanter, The ion source has a vaporizer mounted integrally with an ionization chamber of the ion source, and temperature control system for the temperature of the vaporizer. The ionization chamber electron gun and a beam dump to which the beam of electrons is directed are each thermally isolated from the ionization chamber. The ion source is a decaborane source and the electron given is constructed to produce a beam of electron energy between about 50 and 1000 eV. The ion source is a source of $As_2^+$ ions. The ion source is a source of $P_2^+$ ions. The ion source is a source of $B_2^+$ ions. The ion source is a source of $In_2^+$ ions. The ion source is a source of $Sb_2^+$ ions.

In another aspect, the invention provides a method of conducting ion implantation by use of the ion implantation systems of any of the other aspects of the invention.

In another aspect, the invention provides a method of ion implantation of ions at a desired implant energy on a target substrate. The method including forming molecular ions (based on a molecule having a cluster of atoms of the desired species to be implanted, accelerating the ions to and transporting the ions at an energy substantially above the implant energy, and prior to implant upon the substrate, decelerating the ions to the implant energy.

Variations of this aspect of the invention may include one or more of the following features. The ions are decaborane. The ions are $P_2^+$ ions. The ions are $B_2^+$ ions. The ions are $In_2^+$ ions. The ions are $Sb_2^+$.

In another aspect, the invention provides an ion implantation system including an ion implanter having an ion extraction system; an ion source capable of providing ions in commercial ion current levels to the ion extraction system, the ion source including an ionization chamber defined by walls enclosing an ionization volume, one of said walls defining an extraction aperture of a length and width sized and arranged to enable the ion current to be extracted from said ionization volume by said extraction system; an electron gun constructed, sized and arranged with respect to the ionization chamber to project a directional beam of primary electrons along an axis through the ionization chamber; and a beam dump aligned with the electron gun to receive the directional beam, the beam dump being maintained at a substantial positive voltage relative to the emitter voltage of the electron beam gun, the axis of the beam path of said primary electrons extending in a direction generally adjacent to the aperture, the electron beam having a dimension in the direction corresponding to the direction of the width of the extraction aperture that is about the same as or larger than the width of the aperture.

Variations of this aspect of the invention may include one or more of the following features. The ion implantation system further includes a vaporizer arranged to introduce vapor to the ionization volume. The ion implantation system further includes a gas passage for introducing gas from a gas source to the ionization volume. The ion implantation system further includes a control system enabling control of an energy associated with the primary electrons to idolize individual vapor or gas molecules principally by collisions with primary electrons from the electron gun. The vapor comprises decaborane, The directional beam is a ribbon ion beam. The ribbon beam is of shorter extent than the length of the ion extraction aperture. The ribbon beam is longer than the ion extraction aperture. The ribbon beam is about the same length as the length of the ion extraction aperture. The length of the aperture is at least as long as the length or width of a target substrate.

In another aspect, the invention provides a method of irradiating an extended panel of predetermined dimensions, the method comprising generating a ribbon ion beam with the ion implantation system of any of the other aspects of the invention, and directing the ribbon ion beam onto a surface of the extended panel.

Variations of this aspect of the invention may include one or more of the following features. The extended panel is a flat panel, the method including irradiating the flat panel across substantially an entire panel surface. The ribbon ion beam produced is stationary, the flat panel being mechanically scanned across the beam to accomplish ion doping of the panel. The length of the ribbon beam is longer than the flat panel substrate dimension orthogonal to the scan direction.

Electron-Beam Ion Source for Ion Implantation Advantages

In one aspect, the present invention reduces or eliminates the above-described problems associated with conventional ion implantation sources. The disclosed solution has the following features which result in an exceptionally low-emittance ion source, ideally suited to the requirements of next-generation ion implanters:

1) There is no plasma, hence no plasma potential.
2) The ion density is low (on the order of $10^{11}$ cm$^{-2}$ or less), reducing coulomb scattering between ions, and the resultant ion energy spread, to a negligible degree.
3) Gas molecules are ionized by direct electron impact ionization, resulting in "cold" ions which possess thermal energies approximately equal to that of the neutral gas molecules, that is, <<1 eV. This results in a highly monochromatic source of ions, and enables low angular divergence in the extracted ion beam.
4) By tuning the electron impact energy, a high percentage of the dopant ions of interest can be produced, minimizing space-charge effects.
5) Molecular ions, which are typically dissociated in an arc discharge, are preserved to a high degree. For example, when using phosphene ($PH_3$) feed gas, a large percentage of the $PH_3^+$ ion can be produced (e.g., 50% of total extracted current). As another example, decaborane ($B_{10}H_{14}$) can be used to produce a large fraction (>70%) of the decaborane ion, $B_{10}H_x^+$. This ion is very important for implanting boron at very low (<1 keV) energies, and its use can greatly increase the implanted boron dose rate. Plasma-based ion sources such as the Enhanced Bernas source cannot produce decaborane ions since plasma effects and elevated wall temperature cause dissociation and subsequent loss of the decaborane molecule.

6) A magnetic field is not required.

7) The high-frequency noise observed in arc discharge sources is absent, preserving to a much higher degree space charge compensation by low-energy electrons in the beam plasma.

8) The dimension of the ion extraction aperture is scalable over a broad range, from 12 mm to 300 mm or greater, for example. This leads to greater extracted currents, and improved compatibility with next-generation ion implanter designs. In fact, this feature enables ion implanter designs not possible with previous ion source designs.

Acceleration/Deceleration Ion Implantation Advantages

According to one aspect of the invention, I provide a technique for obtaining a great increase in low-energy beam current and higher quality and higher production rates for low energy ion implantation, by novel combination of acceleration/deceleration ion implantation with molecular ions as the species being implanted. By this combination, I realize conditions that alleviate the aforementioned non-uniformity and dosimetry problems that have been seen as being inherent in acceleration/deceleration ion implantation systems.

In molecular ion implantation in such systems, an ion beam is formed from a compound which contains multiple atoms of the dopant of interest (for example, B, As, P, Sb, or In) to produce both a shallower implantation profile and a higher effective dose rate than possible with conventional monomer (i.e., single atom) ion implantation. As an important example applied to low-energy boron implantation, rather than implanting an ion current I of monomer $B^+$ ions at an energy E, a decaborane molecular ion, $B_{10}H_x^+$, is implanted at an energy 10×E and an ion current of 0.10×I. Extending this example, a 5 keV, 1 mA $B_{10}H_x^+$ ion beam is process-equivalent to a 500 eV, 10 mA $B^+$ ion beam. The resulting implantation depth and dopant concentration (dose) of these two methods have been shown to be equivalent, but the decaborane implantation technique has significant advantages. Since the transport energy (mass×velocity$^2$) of the decaborane ion is ten times that of the dose-equivalent boron ion, and the ion current is one-tenth that of the boron current, the space charge forces responsible for beam blowup and the resulting beam loss are much reduced relative to monatomic boron implantation. As mentioned above, this approach has been proposed to increase useful boron dose rates of conventional (i.e. non-deceleration) ion implanters. In one aspect, my contribution is the specialized use of molecular (cluster) ions in acceleration/deceleration ion implantation to realize unexpected advantages.

According to a preferred embodiment of the present invention, decaborane ions are employed in an acceleration/deceleration ion implanter, gaining a large increase in useful boron dose rate, and, heretofore unappreciated by those of ordinary skill, avoiding the substantial degradation of beam profile characteristics at the wafer that are inherent in decelerating monomer boron ions prior to implantation. Also according to the invention, other important molecular dopants can achieve similar effects. An explanation of the improvement is based on the following considerations.

It is well-known that space-charge effects impose limits on attainable beam currents in the initial ion extraction stage of a conventional (i.e., non deceleration) ion beam implanter as well as in the beam transport stage. Considering the ion extraction stage, the relative improvements enabled by molecular implantation can be quantified by investigating the Child-Langmuir limit, that is, the maximum space charge-limited ion current density which can be utilized by the extraction optics of the ion implanter. Although this limit depends somewhat on the design of the implanter optics, it has been recognized to be usefully approximated as follows:

$$J_{max}=1.721(Q/A)^{1/2}U^{3/2}d^{-2}, \quad (1)$$

where $J_{max}$ is in mA/cm$^2$, Q is the ion charge state, A is the ion mass in amu, U is the extraction voltage in kV, and d is the gap width in cm. In practice, the electrostatic extraction optics used by many ion implanters can be made to approach this limit. By extension of equation (1), the following figure of merit, Δ, which quantifies the easing of space-charge limitations in the case of molecular implantation relative to monatomic implantation, can be expressed as:

$$\Delta=n(U_n/U_I)^{3/2}(m_n/m_I)^{-1/2}, \quad (2)$$

where Δ is the relative improvement in dose rate molecular compound of mass $m_n$ and containing It atoms of the dopant of interest at an accelerating potential $U_m$, relative to a monatomic implant of an atom of mass $m_I$ at an accelerating potential $U_I$. In the case where $U_I$ is adjusted to give the same implantation depth into the substrate as the monomer implant, equation (2) reduces to:

$$\Delta=n^2. \quad (3)$$

Thus, up to a factor of 100 increase in dose rate can be accomplished by substituting decaborane for boron at ion extraction in a conventional (non deceleration) system.

I realize that the deceleration stage of an acceleration/deceleration implantation system has a similarity to the operation of extraction optics of an extraction stage that is crucially relevant to the issue; both employ a strong focusing field over a short distance. I realize that equation (1) has a sufficient degree of validity for the deceleration stage to enable comparison of its performance with molecular ions and with monomer ions. Hence, I realize equation (3) can also be used to evaluate the deceleration stage. Using this mode of analysis, for example, a conventional acceleration/deceleration implanter can deliver up to about 2 mA of boron monomer to the wafer at an implantation energy of 500 eV, albeit with the significant non-uniformity and dosimetry problems mentioned; but by the novel substitution of decaborane $(B_{10}H_x^+)$ for boron monomer in the acceleration/deceleration ion implanter, made possible in a production worthy system by using the techniques described in my above referenced patent applications the same dose rate can be accomplished by implanting 0.2 mA of decaborane at 5 keV. This reduces sensitivity to space-charge to such an extent in the deceleration stage that the usual degradation of beam profile that occurs with deceleration, and implant uniformity, angular integrity, aid dosimetry of an acceleration/deceleration system are greatly improved.

This novel accel/molecular ion combination (acceleration/deceleration ion implantation, using a beam of molecular (cluster) ions), can be employed to increase the low-energy boron dose rate to new proportions, never before possible in ion implantation. For example, one can envision extracting more than 3 mA of decaborane at 20 keV, and decelerating the decaborane ions down to 5 keV (a 4:1 deceleration) to achieve a dose rate of up to 30 mA at an effective implantation energy of 500 eV! such a large effective boron dose rate easily enables high dose implants such as PMOS source/drain extensions at a mechanical throughput limit in excess of 200 wafers per hour (200 WPH), even for 300 mm-diameter substrates (for reference, 2 mA of conventional boron will produce a wafer throughput of about 25 WPH at a dose of 8E14). As I will discuss later, such high beam currents will also enable novel, important processes for ultra-shallow junction formation.

Such an acceleration/deceleration system can also be used for dimer implantation. Ion beams consisting of dimers (typically not heretofore recognized as suitable ion implantation materials), can be utilized to reap above-described benefits with other dopant species, using the production-worthy vaporization and ionization techniques provided in my above-referenced patent application. Ion beams of, for example, $As_2^+$, $P_2^+$, $B_2^+$, $In_2^+$, or $Sb_2^+$ can be formed, and according to my realization of the beneficial applicability of equation (3) to the deceleration stage, can yield a factor of 4 improvement in the decelerated beams, increasing maximum dose rate and reducing non-uniformity and dosimetry problems in the manner previously described for decaborane implantation. Table Ia below lists materials suitable for dimer implantation as applied to the present invention.

TABLE Ia

| Compound | Melting Pt (deg C.) | Dopant | Phase |
|---|---|---|---|
| $As_2O_3$ | 315 | $As_2$ | Solid |
| $P_2O_5$ | 340 | $P_2$ | Solid |
| $B_2H_6$ | — | $B_2$ | Gas |
| $In_2(SO_4)_3 X H_2O$ | 250 | $In_2$ | Solid |
| $Sb_2O_5$ | 380 | $Sb_2$ | Solid |

As part of the system and method, such dimer compounds are vaporized at temperatures below their melting points, and the vapor is ionized principally by impact action of a broad electron beam transiting a volume containing the vapor.

The use of the disclosed systems for acceleration/deceleration implantation of decaborane, etc. enables new processes in semiconductor manufacturing. Another aspect of the invention is the realization that one or more costly steps can be eliminated from many implant sequences, or their cost reduced, or the quality of the implant sequence improved, by using in the sequence, the combination decel/molecular ion method and system described above.

For example, such a system can be used for the amelioration of transient enhanced diffusion (TED). In the creation of ultra-shallow p-n junctions in CMOS manufacturing, special attention is given to forming PMOS source/drain (S/D) structures. Boron is the only p-type dopant having a high enough solid solubility to form S/D structures with the required electrical conductivity; however boron will diffuse rapidly in the silicon substrate during the anneal ("activation") cycle that is required to process the wafers. This anomalous boron diffusion, called transient enhanced diffusion (TED), limits the attainable parameters, in particular the abruptness of the p-n junction. TED is believed to be mediated (detrimentally increased) by defects created in the silicon during the implantation process.

In forming leading-edge, ultra-shallow semiconductor chip devices, manufacturers wish to use very low-energy (sub-keV) boron implants to form very shallow as-implanted boron profiles, so that the activated profile is largely determined by TED. In order to reduce the extent of TED, a low thermal budget spike anneal (i.e., rapid thermal annealing or RTA) is being used in conjunction whit sub-keV implants to achieve more shallow p-n junctions. Recently, it has been proposed that a boron implantation energy of 500 eV is probably the lowest energy boron implant employable in order to minimize the depth of the activated p-n junction, since TED is expected to dominate the profile at this and lower energies after activation. However, I regard this conjecture to be far from proven in manufacturing, since the effects of TED reduce somewhat linearly as the boron implantation depth is decreased. This advantageous "shallowness" effect upon TED is believed to stem from the fact that the exposed silicon surface acts as a "sink", or getter, for defects during TED, so that the shallower the implant, the less the extent of TED.

Since wafer throughput unfortunately is already far below mechanical limit when performing 500 eV boron implants, even in ion implanters using deceleration, and since reducing the implantation energy below 500 eV causes the wafer throughput to drop further dramatically, such sub-500 eV implants using conventional boron implantation are unlikely to be used in manufacturing. Such effects of reduced throughput are, of course, much more harmful economically for the 300 mm manufacturing that is requiring great capital cost for new fabs and equipment.

However, by employing the new system and method provided here, commercially advantageous throughput of ultra shallow implants can be achieved, with "shallowness" amelioration of the TED problem, and thus achievable density and performance of implanted devices can be extended to new regimes of quality and smallness of size.

The disclosed acceleration/deceleration systems can also reduce the need to pre-amorphicize. To assist in limiting the depth of the as-implanted boron profile, pre-amorphization (destruction of the crystal lattice) implants have often been performed in advance of the boron implant to limit channeling, and thus increase the as-implanted depth profile. Amorphization is accomplished by implants of high doses of germanium or silicon beams. This is an expensive added process which increases the cost and complexity of manufacturing ultra-shallow p-n junctions.

I conceive that new process advantages can be obtained in this respect as well by special use of the cluster molecule dopants in an acceleration/deceleration machine in the manner described. That is to say, not only can improved boron dose rate, shallower implants and improved device performance be achieved, but also the damage characteristics of this new molecular implantation system makes possible elimination of the expensive Ge or Si pre-amorphization implant steps. It is known that high density ion clusters such as decaborane cause damage to the local crystal structure upon impact with the silicon surface due to the inelastic nature of the collision. At sufficiently high dose rates (achievable with the present invention, e.g., between 0.5 and 3 mA of decaborane), the resulting damage profile can obviate or reduce the need for a separate pre-amorphization implant, eliminating or reducing the cost of this expensive step in the manufacturing process.

Thus, boron implants at production-worthy wafer throughputs with acceleration/deceleration systems employing decaborane ions can be performed for both 200 mm and 300 mm substrates at energies as low as 100 eV. Since TED effects will be further reduced at these extremely low implantation energies, shallower p-n junctions can be fabricated than heretofore possible.

By ionizing the molecule to produce the molecular ions by primary electron-impact, heat sensitive ion source materials can be employed, especially solid decaborane and the dimers mentioned above.

By employing a broad beam of electrons directed adjacent to a greatly elongated extraction aperture, and employing telescopic optics to reduce the dimension of the beam prior to the beam entering the analyzer of the beam line.

The invention makes possible:

1) Production-worthy wafer throughput for boron implants using decaborane ions at implantation energies between 100 eV and 1 keV, for 200 mm and 300 mm wafers;

2) By use of a high dose rate of decaborane (e.g., between about $2 \times 10^{15}$ and $2 \times 10^{16}$ decaborane ions per second), producing enough crystal structural damage to obviate or reduce the need for costly pre-amorphization implants;

3) By using extremely low implantation energy (between about 1 keV and 5 keV decaborane energy, equivalent to between 100 eV and 500 eV boron energy) ultra-shallow junctions by a reduction in the broadening of the activated boron profile due to TED.

4) By use of other cluster molecules, including novel dimer materials, achieving similar advantageous results with other implant species.

Thus, fewer steps, significant cost reduction, shallower and more dense p-n junctions, and improved device performance can be achieved than heretofore possible.

Electron-Beam Ion Source for Ion Doping Advantages

In another aspect, the present invention can be implemented into an ion doping system as a replacement for the above-described bucket source. The disclosed ion doping system offers the following advantages:

(1) Small footprint—the electron-beam ion source is a small-volume source, and is elongated in only one direction, the desired length of the ribbon beam.

(2) Reduced cost—because of its compact size and scalability, the present invention is simpler and significantly less expensive than the prior art.

(3) High efficiency—because of its smaller volume and reduced surface area, loss of the ions of interest to the walls of the ionization volume is substantially reduced relative to the prior art.

(4) Improved process control—a higher percentage of ions produced are the desired ions. This leads to reduced deposition (fewer ions are produced in the first place to achieve a given ion beam current), higher ion production efficiency of the dopant ion of interest, and much better control of the implantation process. Since the majority of ions produced from the electron-beam ion source are the ions of interest, the implantation profile and dose accuracy is much improved relative to the prior art.

(5) Higher throughput—the present invention increases throughput due to its ability to produce higher dopant ion currents than the prior art.

(6) Soft ionization—the present invention enables the efficient production of molecular ions such as decaborane, which offer significant advantages in throughput and efficiency in ion doping applications over, for example, diborane.

Reduced capital equipment cost, less fab floor space occupied, and higher product yield—due to its small footprint and reduced complexity, the present invention also enables a single ion doping system to be constructed with two ion sources, one for p-type dopants, and one for n-type dopants. Using simple dual slit optics, the ion doping system can switch between the two ion sources while processing a lot of substrates. This relieves the high equipment cost of two dedicated systems, halves costly fab floor space, and reduces the risk to product yield which is presently a consequence of prior art ion doping systems.

DESCRIPTION OF DRAWINGS

FIG. 14a is a general schematic illustration of a gate edge and drain extension layer formed by boron ion implantation of a previously phosphorus doped silicon substrate while FIG. 14b is a graphical illustration of boron and phosphorus ion concentrations taken along section AA of FIG. 14a and charted on a logarithmic scale.

DETAILED DESCRIPTION

The following terms and definitions apply throughout the application.

Transverse kinetic energy ($E_T$): The component of kinetic energy transverse to the direction of beam propagation, i.e., the direction of the extraction field. $E_T = \frac{1}{2} m v_T^2$, where $v_T$ is the component of velocity orthogonal to the beam direction.

Beam noise (N): Fluctuation in beam current intensity as a percentage of average current level, above a frequency of 100 Hz.

Emittance ($\epsilon$): The total emittance $\epsilon$ is the product of the two emittances, $\epsilon = \epsilon_x \epsilon_y$, where in the case of vertically-oriented slot lenses, $\epsilon_x$ is the emittance in the horizontal direction (along the slot width), and $\epsilon_y$ is the emittance in the vertical direction. For any lens geometry, $\epsilon^x$, and $\epsilon_y$ are defined along the two orthogonal directions normal to the direction of beam propagation. The emittance components $e_i$ are defined as follows:

$\epsilon_x = 2\kappa \Delta x \alpha_x$, $\epsilon_y = 2\kappa \Delta y \alpha_y$, where $\kappa = (E_0/E)^{1/2}$, where $E$ is the beam energy and $E_0 = 10$ keV;

$\alpha_x$ and $\alpha_y$ are the beam divergence half-angles into the x- and y-directions, respectively; and $\Delta x$ and $\Delta y$ are the beam dimensions in the x- and y-directions, respectively, and the emittance variables are all measured at the same z-position along the direction of propagation, and are chosen to contain at least 70% of the beam current. Emittance components $e_i$ are expressed in units of mm-mrad or in cm-deg.

Brightness (B): B is the beam current I divided by total beam emittance: $B = I/\epsilon_x \epsilon_y$.

Plasma is defined as a region containing the ionization volume which is substantially electrically neutral, containing electrons and ions contributing approximately equal charge densities opposite in sign.

Ion Implantation Sources

Figure 1:
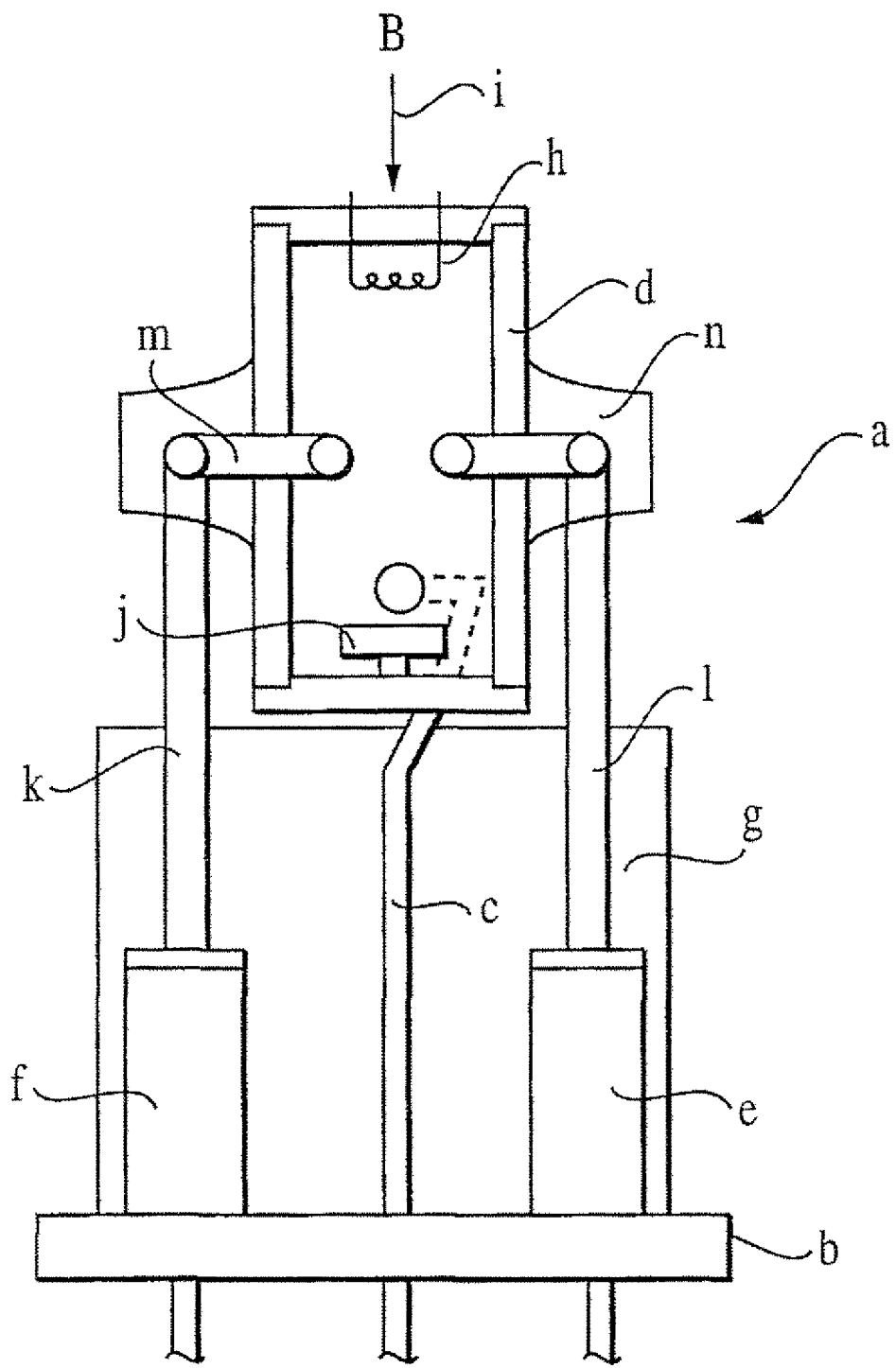
FIG. 1 is a schematic view of a prior art source for ion implantation.
Figure 2:
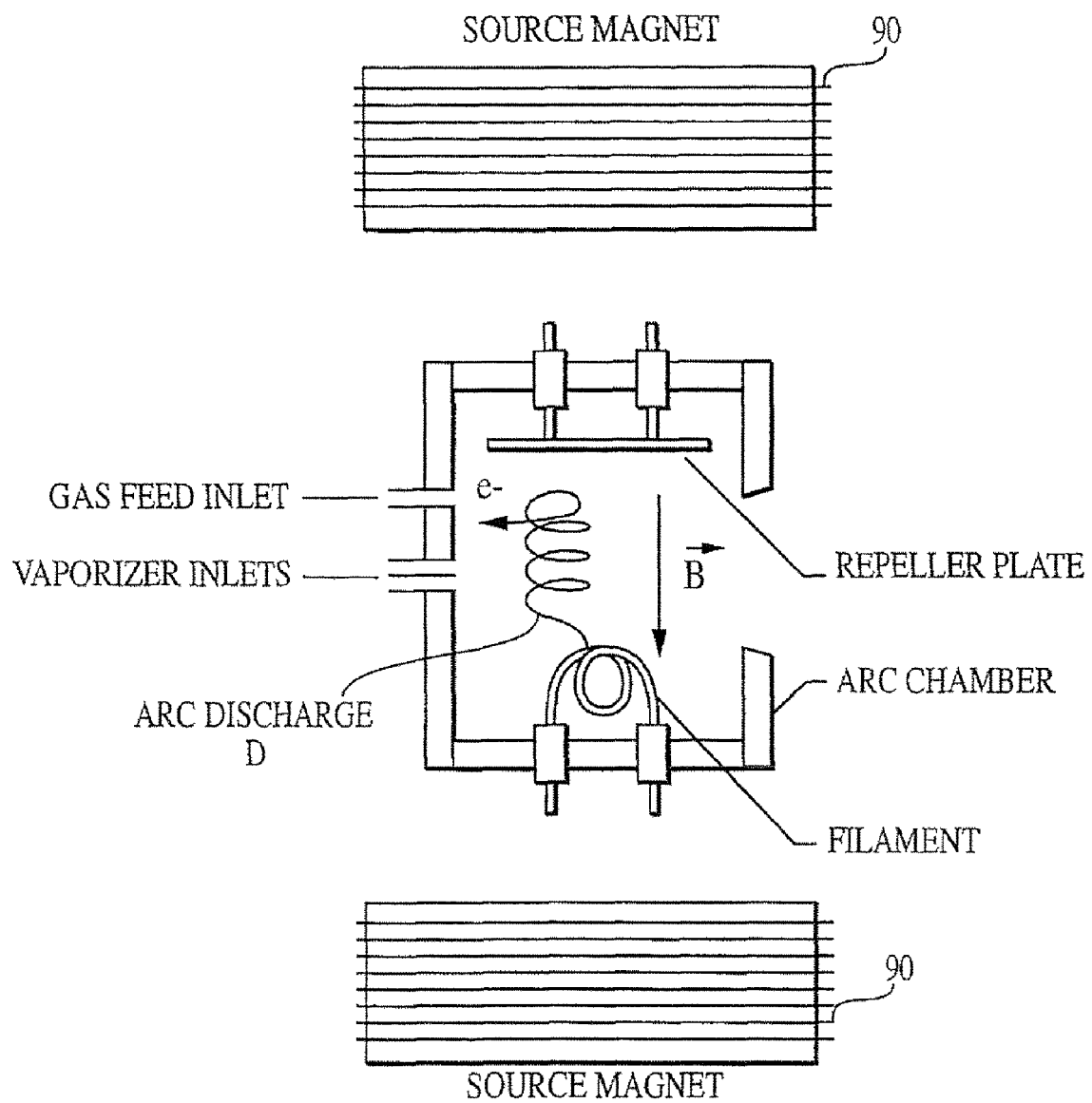
FIG. 2 is an enlarged schematic view of a portion of the prior art source for ion implantation of FIG. 1.

Referring now to the attached figures, a conventional ion source used in ion implantation is shown in FIGS. 1 and 2.

The Enhanced Bernas source is commonly used in high current, high energy, and medium current ion implanters. The ion source a is mounted to the vacuum system of the ion implanter through a mounting flange b which also accommodates vacuum feedthroughs for cooling water, thermocouples, dopant gas feed, $N_2$ cooling gas, and power. The dopant gas feed c feeds gas into the arc chamber d in which the gas is ionized. Also provided are dual vaporizer ovens e, f in which solid feed materials such as As, $Sb_2O_3$, and P may be vaporized. The ovens, gas feed, and cooling lines are contained within a cooled machined aluminum block g. The water cooling is required to limit the temperature excursion of the aluminum block g while the vaporizers, which operate between 100 C and 800 C, are active, and also to counteract radiative heating by the arc chamber d when the source is active. The arc chamber d is mounted to, but in poor thermal contact with, the aluminum block g. The ion source a is an arc discharge source, which means that it operates by sustaining a continuous arc discharge between an immersed hot-filament cathode h and the internal walls of the arc chamber d. Since this arc can typically dissipate in excess of 300 W, and since the arc chamber d cools only through radiation, the arc chamber can reach a temperature in excess of 800 C during operation.

The gas introduced to arc chamber d is ionized through electron impact with the electron current, or arc, discharged between the cathode h and the arc chamber d. To increase ionization efficiency, a uniform magnetic field i is established along the axis joining the cathode h and an anticathode j by external magnet coils 90, shown in FIG. 2, to provide confinement of the arc electrons. An anticathode or repeller electrode j (located within the arc chamber d but at the end opposite the cathode h) is typically held at the same electric potential as the cathode h, and serves to reflect the arc electrons confined by the magnetic field i back toward the cathode h and back again repeatedly. The trajectory of the thus-confined electrons is helical, resulting in a cylindrical plasma column between the cathode h and anticathode j. FIG. 2 shows a possible electron trajectory between cathode and anticathode, which is helical due to the confining magnetic field B. The plasma density within the plasma column is typically high, on the order of $10^{12}$ per cubic centimeter; this enables further ionizations of the neutral and ionized components within the plasma column by charge-exchange interactions, and also allows for the production of a high current density of extracted ions. The cathode h is typically a hot filament or indirectly-heated cathode, which thermionically emits electrons when heated by an external power supply. It and the anticathode are typically held at a voltage $V_c$ between 60V and 150V below the potential of the ionization chamber d. High discharge currents D can be obtained by this approach, up to 10 A. Once an arc discharge plasma is initiated, the plasma develops a sheath adjacent to the surface of the cathode h (since the cathode h is immersed within the arc chamber and is thus in contact with the resulting plasma). This sheath provides a high electric field to efficiently extract the thermionic electron current for the arc; high discharge currents can be obtained by this method.

The discharge power P dissipated in the arc chamber is $P = DV_c$, or hundreds of watts in addition to the heat dissipated by the arc, the hot cathode h also radiates power to the arc chamber d walls. Thus, the arc chamber d provides a high temperature environment for the dopant plasma, which also boosts ionization efficiency relative to a cold environment by increasing the gas pressure within the arc chamber d, and by reducing condensation of dopant material on the hot chamber walls.

If the solid source vaporizer ovens e or f are used, the vaporized material feeds into the arc chamber d through vaporizer feeds k and l, and into plenums m and n. The plenums serve to diffuse the vaporized material into the arc chamber d, and are at about the same temperature as the arc chamber d. Radiative thermal loading of the vaporizers by the arc chamber also typically prevents the vaporizers from providing a stable temperature environment for the solid feed materials contained therein below about 100 C. Thus, only solid dopant feed materials that both vaporize at temperatures >100 C and decompose at temperatures >800 C (the nominal wall temperature of a Bernas source) can be vaporized and introduced by this method.

Figure 3:
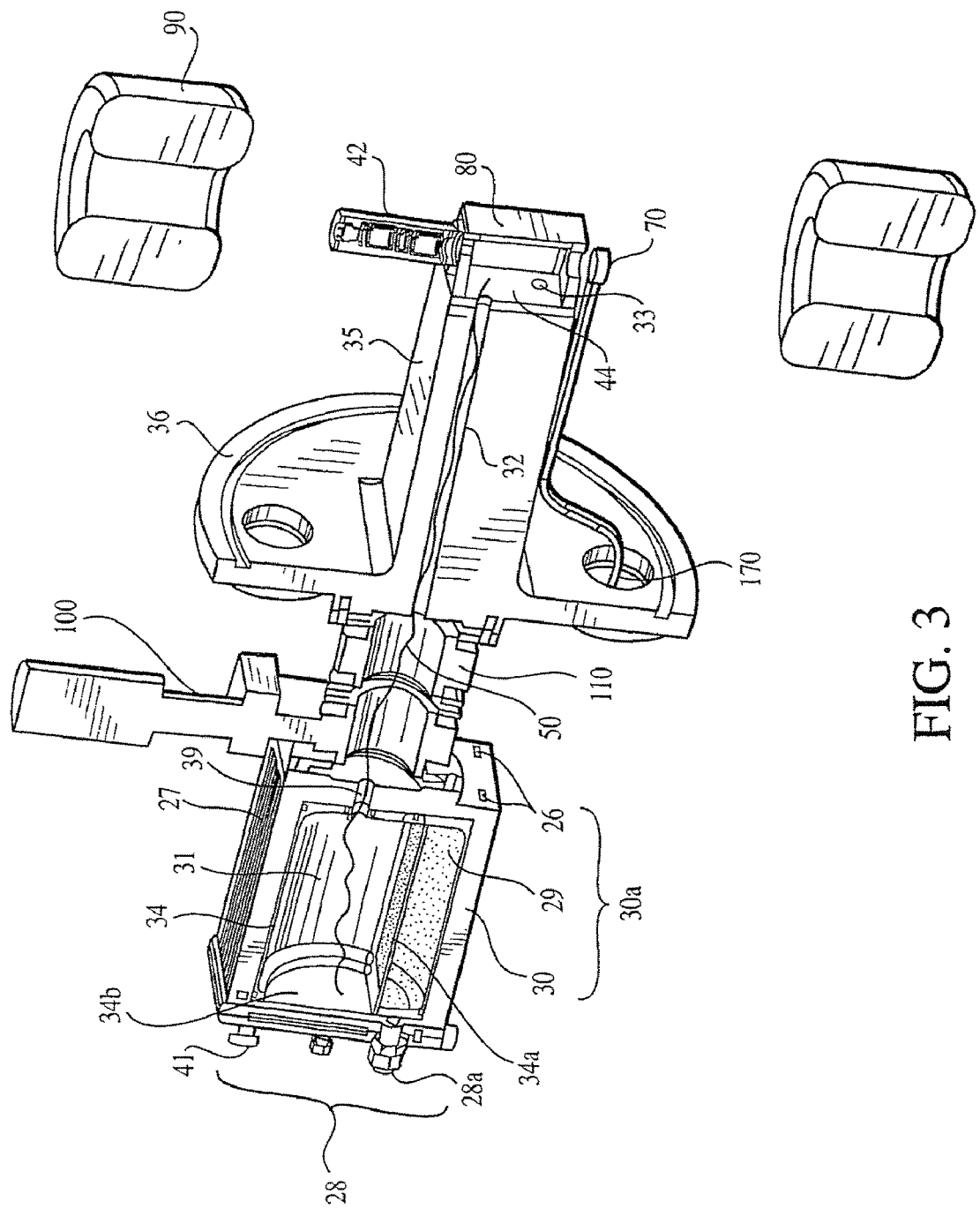
FIG. 3 is a diagrammatic view of an ion implantation source of the present invention, shown in a cutaway view down the center axis of the source, so the internal components can be seen.

FIG. 3 shows one embodiment of the present invention, certain aspects of which are also described in the above-referenced patent applications, shown in a cutaway view down the center axis of the source, so the internal components can be seen. The external vaporizer 28 is comprised of vaporizer body 30 and crucible 31 in which solid source feed material 29 such as decaborane resides. Resistive heaters are imbedded into the vaporizer body 30, and water cooling channels 26 and convective gas cooling channels 27 are in intimate contact with vaporizer body 30, and are used in combination to provide a uniform operating temperature above room temperature to the crucible 31. Thermal conduction between the crucible 31 and the temperature-controlled vaporizer body 30 is provided by pressurized gas introduced by a gas feed 41 into the crucible-vaporizer body interface 34, while the temperature of the vaporizer housing is monitored through a thermocouple. Vaporized decaborane or other vaporized material 50 is fed through vaporizer exit channel 39 and through heated gate valves 100 and 110 into the ionization chamber 44 through conductance channel 32. The source mounting flange 36 and source block 35 are also temperature controlled to a temperature near or above the vaporizer temperature.

The ion source gas delivery system includes two conduits that feed the ionization chamber from two separate sources. The first is a small diameter, low-conductance path from a pressurized gas source such as a gas cylinder. The second is from a high-conductance path from a low-temperature vaporizer, which vaporizes solid material. Regardless of the source, the gas delivery system maintains a gas concentration of a few millitorr in the ionization chamber. The vaporizer maintains tight temperature control of its surfaces that contact the solid material, in order to maintain stable concentrations of gas in the ionization chamber.

Referring again to FIG. 3, the vaporizer assembly, 30a, is comprised of a heated and cooled body, 30 and a removable crucible, 34. Access to the crucible is made possible by removing the end plate, 28 on the back of the vaporizer.

Once the crucible is removed from the vaporizer, it can be recharged by removing its cover, 34b that is elastomerically sealed to the end of the crucible and raising the grate, 34a, which contains the solid, 29.

After recharge the crucible is inserted in the body and a gas seal is made to the bore, 39, at the front end of the body. This bore, 39 is the exit for the vaporized gas. The mechanical fit between the crucible and the body is precisely maintained to achieve temperature uniformity of the crucible. The gap is filled with a gas (cool gas) to facilitate thermal transfer between the two surfaces. The cool gas enters the gap through an end plate fitting, 28a.

Temperature control is performed using PID closed loop control of resistive elements that are imbedded in the body. The body material is highly thermally conductive to maintain temperature uniformity. A small thermal leak is intentionally applied to the body to create stability in the control system using external air channels. The air channels 27 pass around the vaporizer body and are covered by plates that are not shown. Air is ducted to the channels within a manifold system, which is integrated into the vaporizer end plate, 28, to provide slight convective cooling. The air is fed through the inlet after proceeding past a metering valve used for flow control. The air discharges from the assembly into house exhaust.

In addition to the air-cooling, there are also provisions for liquid cooling the vaporizer body. Coolant is ducted through a 1-meter long 6 mm diameter bore that travels back and forth throughout the body. Connections are made through fittings mounted to body ports, 26. The liquid cooling provides rapid cooling of the vaporizer assembly to provide quick service turnaround and also to change solid species.

Figure 4:
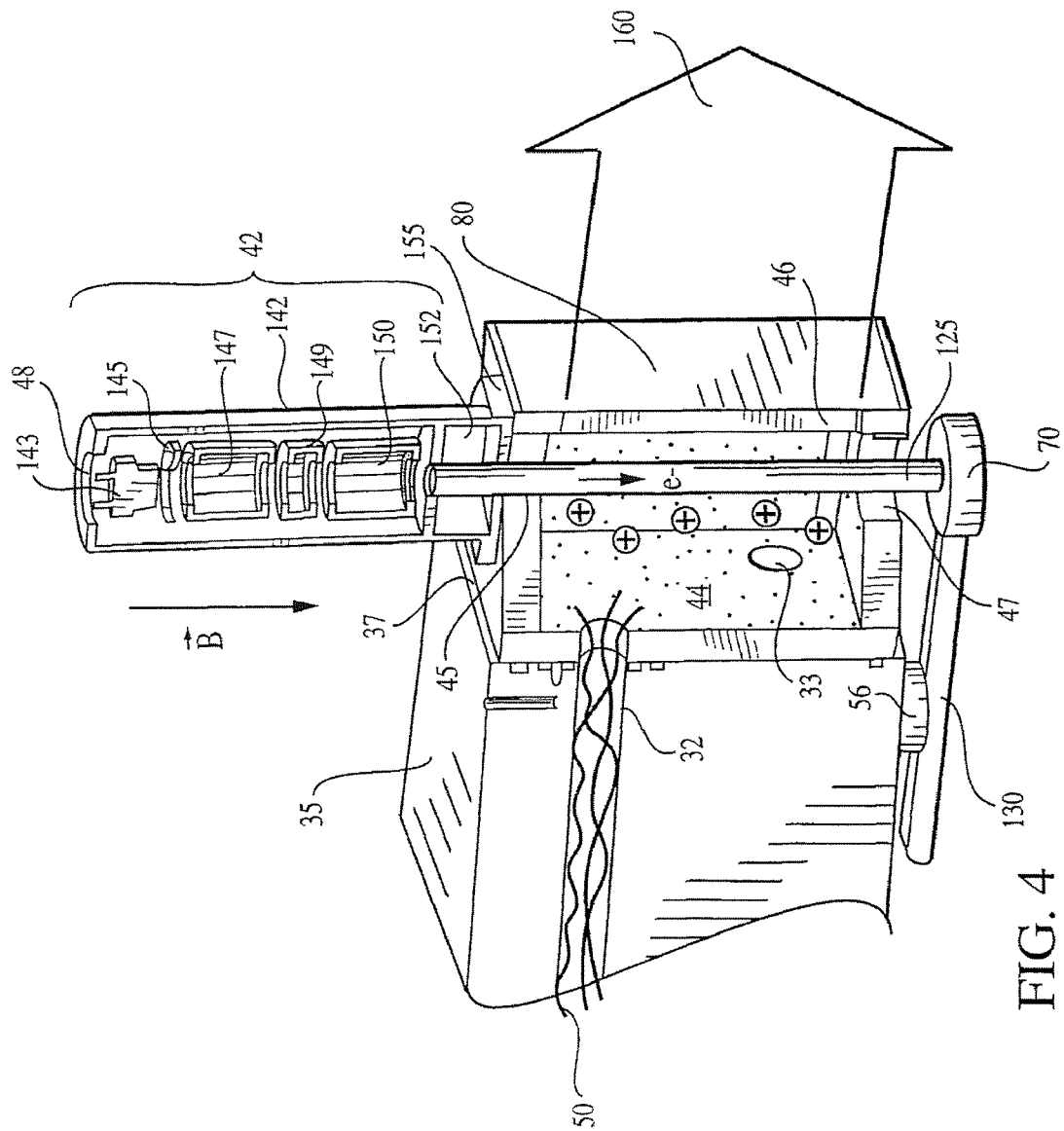
FIG. 4 is a magnified diagrammatic view of the ionization chamber of the ion implantation source of FIG. 3.

Referring now to FIG. 4, ionization chamber 44 is in good thermal contact with block 35 through pressurized gas conducted through a conduit into the interface 36 between ionization chamber 44 and block 35. Gaseous materials, for example process gases such as $PH_3$ which are held in gas cylinders, can be fed into the ionization chamber 44 through gas feed 33. Typically, the gas pressure within the ionization chamber 44 is approximately $1 \times 10^{-3}$ Torr, while the region external to the ionization chamber 44 is approximately $1 \times 10^{-3}$ Torr. Referring now to FIG. 4, the electron beam 125 produced by electron gun 42 enters the ionization chamber 44 through electron beam entrance aperture 45, and transits the ionization chamber 44 parallel to and in close proximity to the ion extraction aperture slot 46 contained within ion extraction aperture plate 80, exiting the ionization chamber 44 through electron beam exit aperture 47 and intercepted by beam dump 70. Beam dump 70 is water cooled through water cooled holder 130, which carries electrically resistive (>10 MΩ-cm) de-ionized water. The beam dump is electrically isolated by insulating standoff 56, so that the e-beam current intercepted by beam dump 70 can be monitored externally at HV water feedthrough 170. The ion extraction aperture 80 is electrically isolated from ionization chamber 44 by an electrically insulating, thermally conductive gasket, and biased to a negative potential relative to ionization chamber 44. This bias of ion extraction aperture 80 establishes an electric drift field which attracts the ions towards the aperture 80, and provides a drift velocity to the otherwise thermal ions, enabling higher extracted ion currents than possible in the absence of a drift field. Typical dimensions for some of the ion source structures are: a 7.5 mm diameter round electron entrance aperture 45, a 10 mm diameter electron beam exit aperture 47, a 25 mm diameter by 65 mm long electron gun assembly 42, and a 67 mm tall ionization chamber 44. Cutout 48 in the gun housing 142 enable the portion of the electron gun assembly 42 which contains the cathode to be exposed to the vacuum environment of the source housing, extending the service lifetime of the cathode 143.

The electron gun optics consist of the cathode 143, beam shaping electrode 145, first anode 147, focus electrode 149, second anode 150, and exit lens 152. This lens system extracts a space charge-limited electron current, and the downstream four-element lens comprised of first anode 147, focus electrode 149, second anode 150, and exit lens 152 both collimates and accelerates the electron beam to the desired final energy. Thermionic electrons are emitted by the hot cathode 143, which may be constructed of refractory metal or $LaB_6$, for example, and may be heated directly or indirectly. The electrons are accelerated across the first anode gap in a Pierce geometry, the equipotentials between cathode 143 and first anode 147 being shaped by the conical beam-shaping electrode 145 and first anode, which maximizes the output current by allowing for space-charge effects. They can be extracted at tip to 5 keV, and decelerated to a final energy which is variable between about 70 eV and 2000 eV by the downstream optics.

Figure 4A:
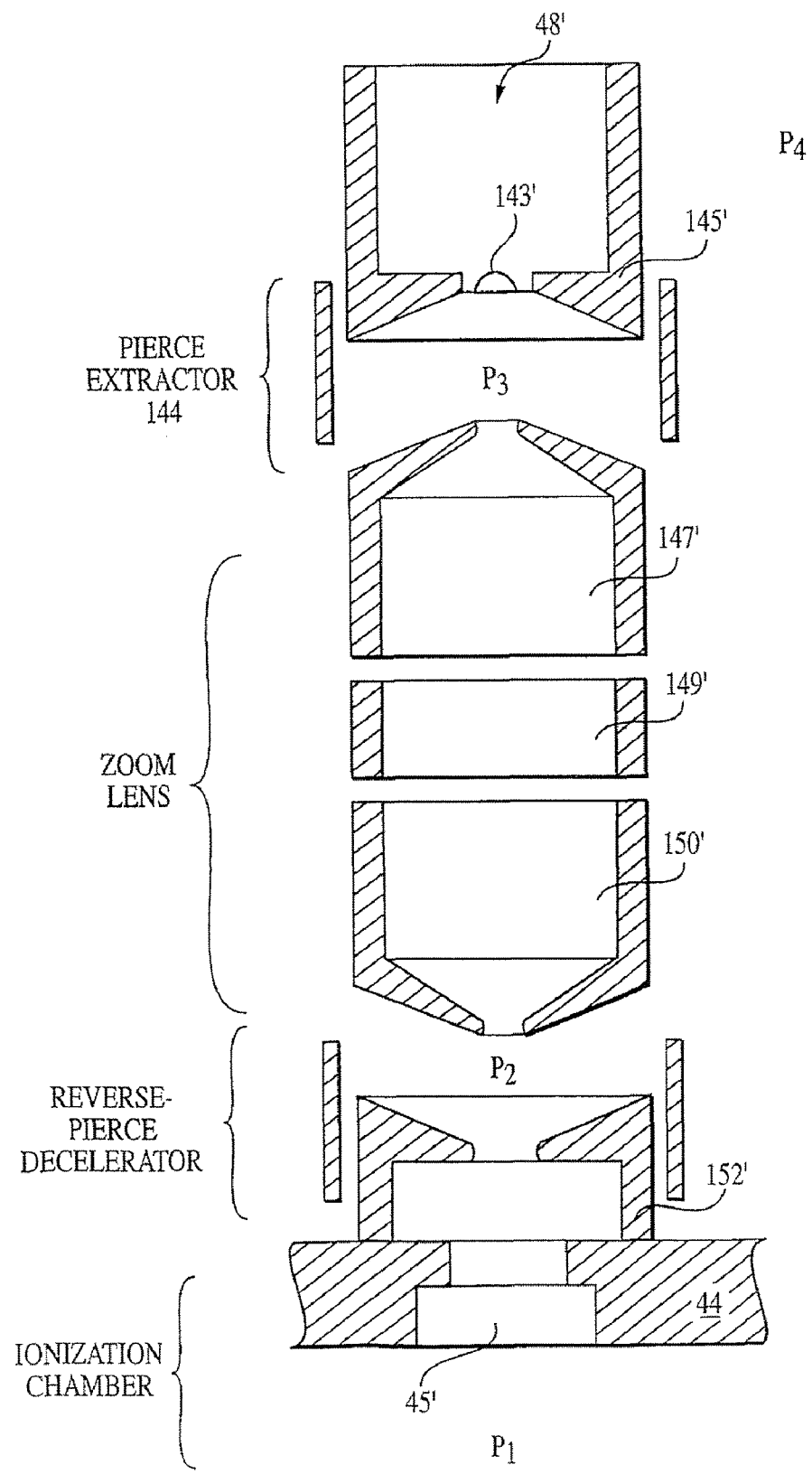
FIG. 4a is a diagrammatic view of FIG. 4a of a preferred embodiment of the electron optics of the ion implantation source of FIG. 3.

FIG. 4a shows a preferred embodiment of the electron optics, in which the second anode 150' and exit lens 152 are shaped according to a Pierce geometry. This Pierce geometry is inverted from the geometry of the Pierce extractor 144 defined by lenses 145' and 147', so that the lens 153 defined by the concatenation of 150' and 152' can be efficiently used as a deceleration lens, introducing a low-energy (e.g., 100 eV or less), generally collimated electron beam into the ionization chamber 44. The incorporation of a "reverse Pierce" geometry for the deceleration lens 153 helps correct for a space charge-limited electron beam, so that a higher and more collimated low energy electron flux may be introduced into the ionization chamber 44 than otherwise possible. For example, the electron beam may be extracted into lens 147' at 1 keV, propagate into lens 150' at 500 eV, and decelerate to 100 eV within lens 152', enabling a higher electron current than if the beam were extracted at 100 eV at the extractor 144.

The space charge forces present within the electron gun optics and especially within the deceleration lens 153 can be further ameliorated by the intentional production of positive ions along the electron beam path. The positive space charge of the ions compensates for the negative space charge of the electrons, reducing the net coulomb repulsion between electrons within the beam, thus reducing beam blow-up and enabling higher electron currents than otherwise possible. This is an effective means for reducing space charge forces: since the ions are heavy and slow-moving, their depletion rate is low, and a reasonable charge balance can be maintained if the rate of ion production is similar to the ion loss rate. The ion production rate at any point in the electron beam path is proportional to the local pressure of ionizable gas at that point. For example, consider local gas pressures P1>P2>P3>P4 shown in FIG. 4a (I note that it is possible to control the local pressures Pi by tailoring the conductance between individual lens elements and the ambient vacuum). Further consider the predominant gas species being decaborane ($B_{10}H_{14}$), a large, heavy molecule with a large electron-impact ionization cross section for the production of positive ions. Within the ionization chamber 44, P1 is highest, approximately $10^{-3}$ Torr, so that space charge compensation is very effective. This ensures uniform propagation of the electron beam within the primary ionization region, ensuring good uniformity of the ion density adjacent to the ion extraction aperture 46, and hence a uniform ion density in the extracted ion beam. P4 is the ambient pressure of the source vacuum housing (nominally $10^{-5}$ Torr or less), and because the gas within the ionization chamber 44 propagates through electron beam entrance aperture 45', a large pressure gradient is established between these extreme. Since the deceleration lens 153 is close to 45', P2 is relatively high, and space charge repulsion is reduced substantially. The region P3 is adjacent to the cathode 143', hence it is desired to maintain P3 close to P4, i.e., at a sufficiently low pressure that the arrival rate of decaborane molecules to the cathode surface is less than tile desorption rate of decaborane byproducts which can deposit on the cathode surface. This is particularly important for low-temperature cathodes such as $LaB_6$, and for field emitter cathodes. In general, refractory metal cathodes operate at sufficiently high temperatures that deposition of cracked process gases is not a problem.

Figure 5:
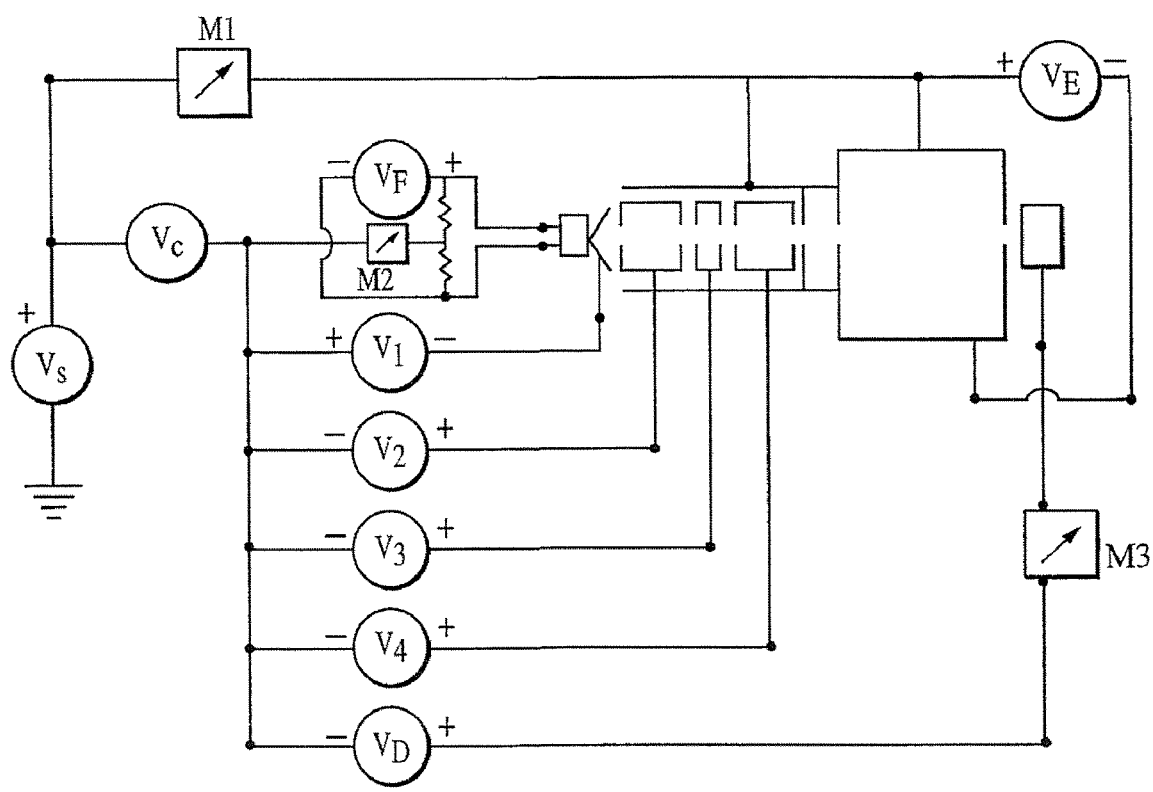
FIG. 5 is a schematic diagram of the biasing scheme of power supplies which provide voltage to the ion implantation source of FIG. 3.

FIG. 5 shows the biasing scheme of power supplies which provide voltage to the electron gun elements and to the ion source, and dedicated meters. The symbols used in FIG. 5 have the following significance:

$V_S$ (source V): 0-40 kV pos @ 100 mA. Sets ion beam energy, biases ionization chamber relative to ground.

$V_C$ (cathode V): 0-2 kV neg @ 100 mA. Sets electron beam energy, biases cathode relative to ionization chamber.

$V_F$ (filament V): 0-5 V @ 50 A. Provides heater current to directly- or indirectly-heated cathode emitter.

$V_E$ (extraction aperture V): 0-20 V neg @ 100 mA. Biases ion extraction aperture relative to ionization chamber.

$V_I$ (Cathode shield V): 0-50 V neg @ 10 mA. Biases beam-shaping electrode relative to cathode.

V2 (anode V): 0-5 keV pos @ 50 mA. Biases first anode relative to cathode.

V3 (focus V): 0-5 keV pos @ 10 mA. Biases focus electrode relative to cathode.

V4 (exit lens V): 0-2 keV pos @ 50 mA. Biases exit lens relative to cathode and determines the energy at which electron beam leaves tetrode consisting of cathode, anode, focus, and exit elements.

$V_D$ (beam dump V): 0-2 kV pos @ 100 mA. Biases beam dump relative to cathode.

M1: measures electron current leaving electron gun.

M2: measures cathode emission current.

M3: measures electron current arriving at beam dump.

Another embodiment of the present invention is suited particularly for ion implantation systems which extract ions from a slot between one and three inches long. The embodiment provides an efficient design for the generation of high currents of ions (e.g., 5 mA of each dopant beam is achievable). In this design, a filament approximately the same length as the ion extraction slot provides a one-dimensional "sheet" of low-energy electrons. The filament is oriented parallel to the ion extraction aperture slot, as also indicated in FIG. 6. An electron beam, as contained within the first embodiment, is not required. This geometry has two very significant advantages: 1) A high electron current is attainable, and 2) low electron injection energies can be achieved while still delivering high electron currents. A corollary to 2) is that, since ionization cross sections as approximately 100 eV are a factor of 5 greater than, e.g., 2 keV, very significant ion currents can be achieved. 3) Finally, no magnetic field is used, and magnetic confinement is not necessary to keep the electron beam from diverging, since the electrons are extracted as a one-dimensional beam, significantly reducing space-charge effects.

Figure 6A:
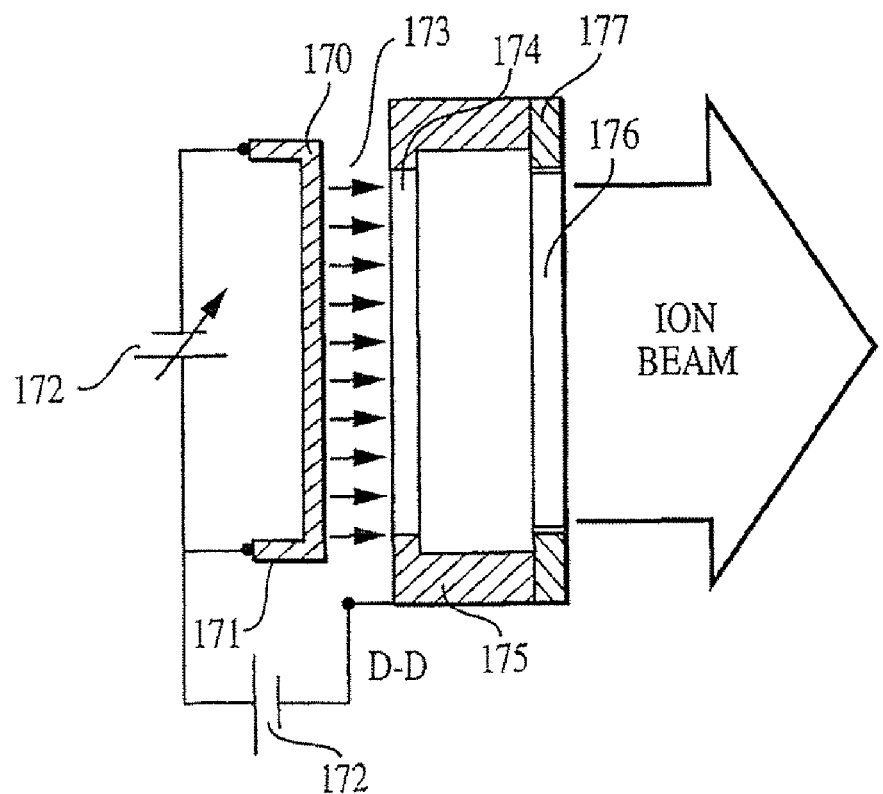
FIGS. 6a and 6b are diagrammatic cross-sectional side and top views, respectively, of an alternate ionization chamber for an implantation source of the present invention.
Figure 6B:
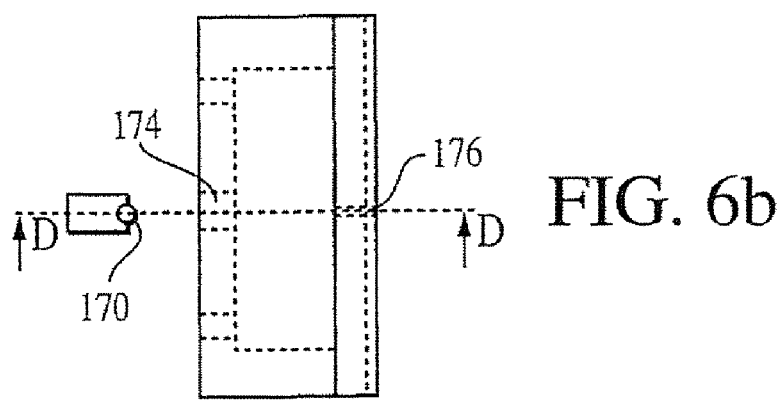

Hence, FIG. 6a shows a simple design for an ion source in which the electrons are injected into an ionization chamber along the same direction as the extracted ion beam. A long filament 170 is heated through filament leads 171 and DC power supply 172 to emit electrons 173 along the length of the filament. The filament may be a ribbon, or a thick tungsten wire, for example. The filament 170 is biased below the potential of the ionization chamber 175 by power supply 172 such that the electrons are accelerated through a rectangular entrance slot 74 centered in the rear of the ionization chamber 175. This constitutes a diode arrangement. A top view of this geometry is shown in projection D-D, FIG. 6b. The extended electron beam will ionize the gas within the ionization chamber 175; the ions are extracted through ion extraction aperture 176 within the ion extraction aperture plate 177. Apart from its simplicity, the advantage of the design of FIG. 6a is that high electron currents can be generated by the long filament 170 and focused uniformly along the ion extraction aperture 176. The ion beam thus produced should be uniform, since the electron path length through the gas within the ionization chamber 175 is the same along the length of the ion extraction aperture 176. Also, since the electron beam is elongated in the vertical dimension, it is less susceptible to space charge blow-up, and thus higher total electron currents of a given energy can be delivered into the ionization chamber 175 than with a small, round electron beam.

To improve performance, a grid electrode 179 with a long rectangular slot can also be inserted between filament 170 and chamber entrance aperture 174 to improve focusing of the electron beam. This constitutes a triode configuration. To prevent the possibility of any transition metal contamination of the ionization chamber due to evaporation of the filament onto the entrance aperture 174 and eventual migration of tungsten or rhenium into the chamber 175, the filament can be further remoted, removing evaporated material from line-of-sight with the ionization chamber.

Figure 7A:
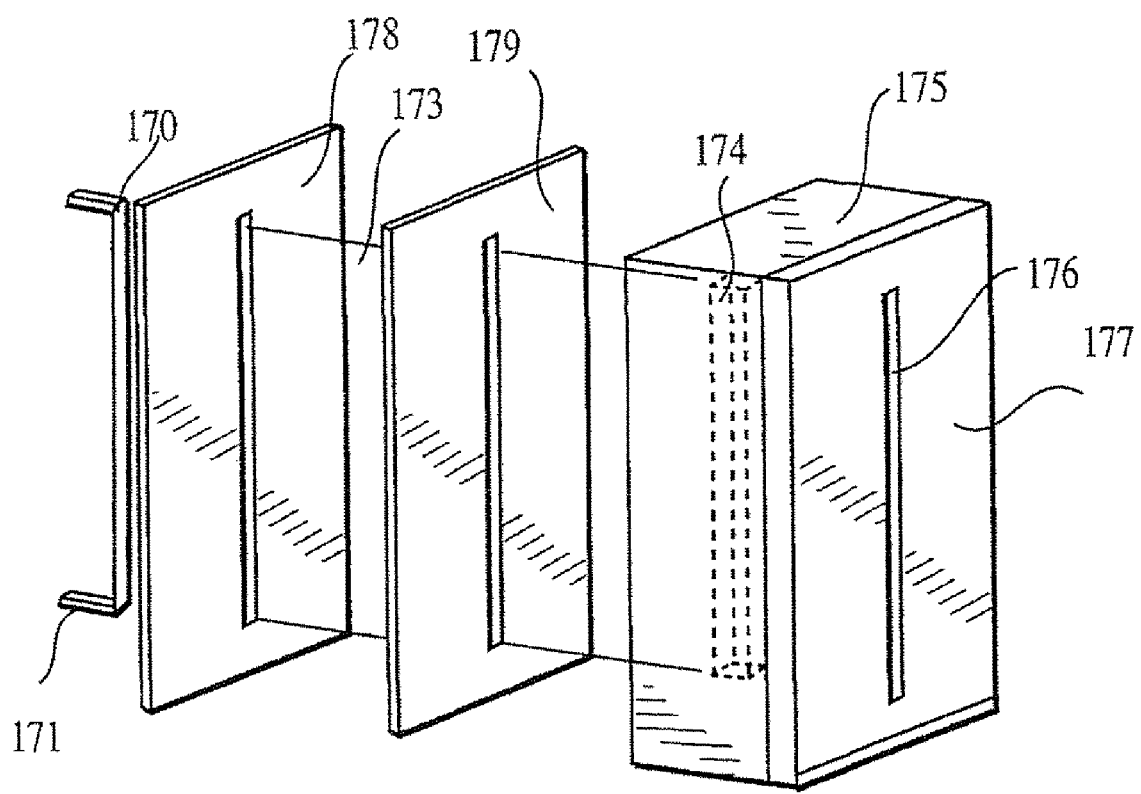
FIGS. 7a and 7b are diagrammatic perspective and top views of an apparatus for improving the focus of the electron beam of the ionization chamber of FIG. 6.
Figure 7B:
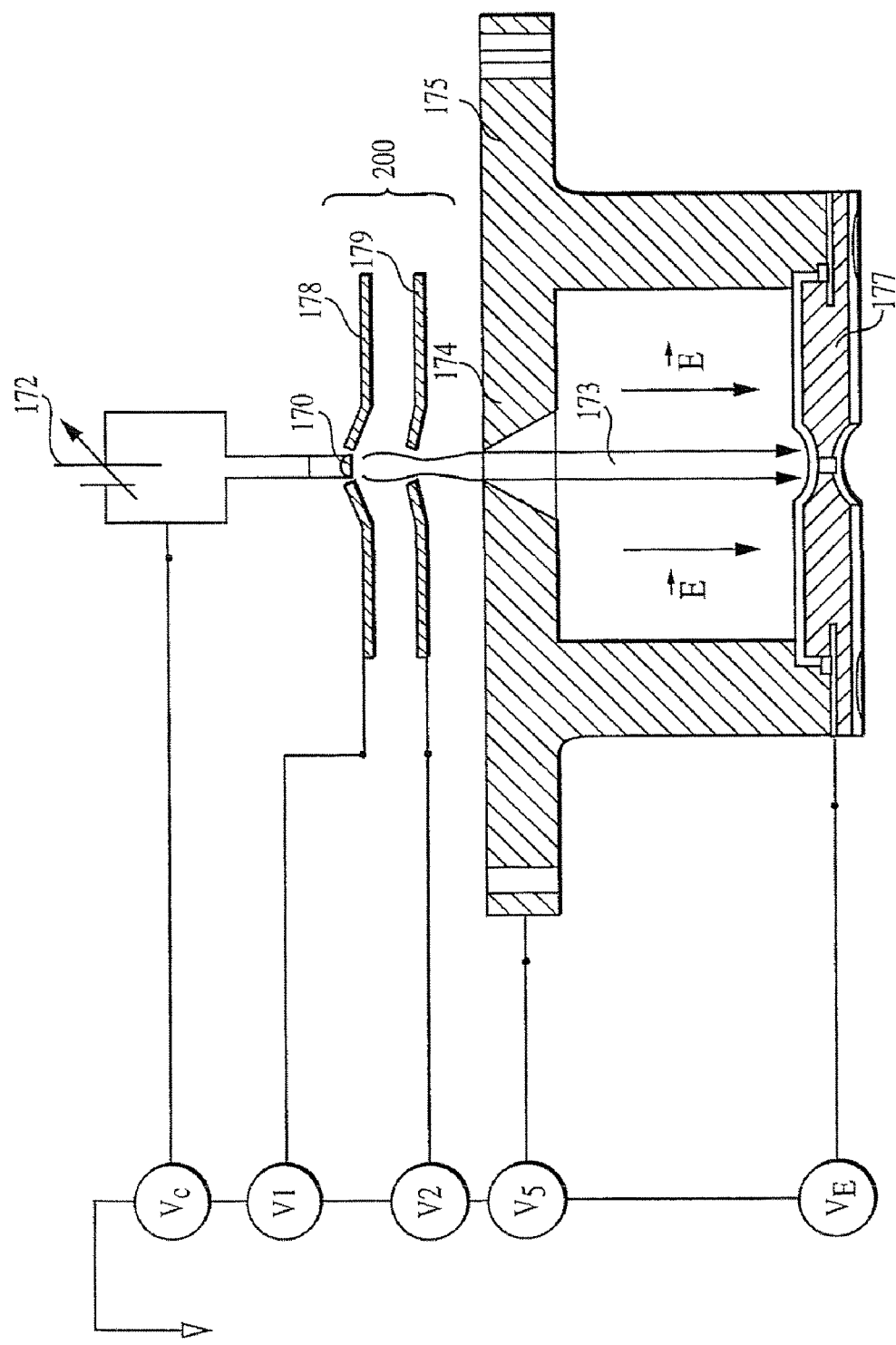
Figure 8:
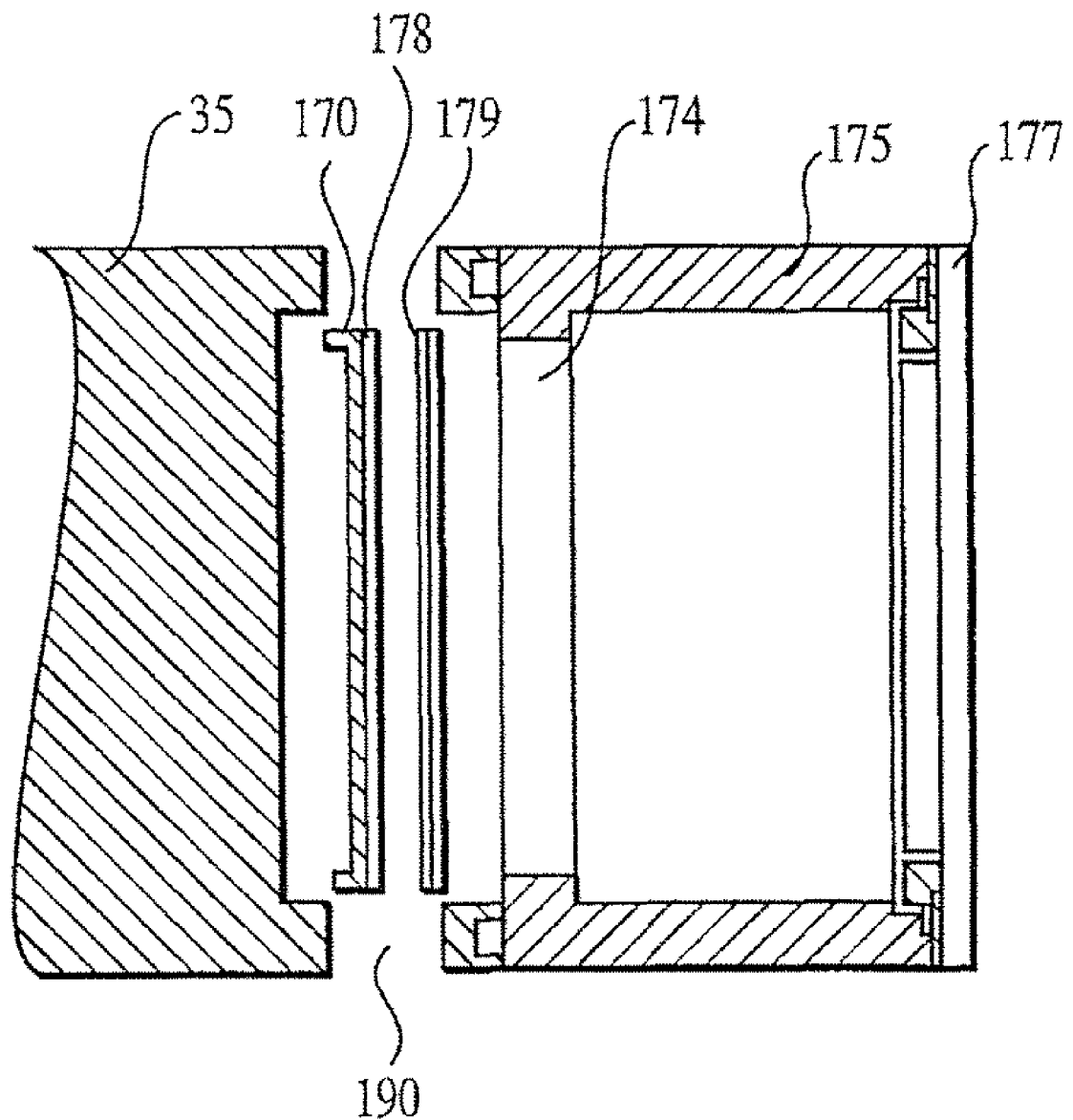
FIG. 8 is a diagrammatic view of the apparatus of FIGS. 7a and 7b incorporated into an ion implantation source similar to that depicted in FIG. 3.

This embodiment is illustrated in schematic FIG. 7a. The filament 170 is remoted away from the ionization chamber 175, and the electron beam is propagated through a lens comprised of a series of long, rectangular apertures. The schematic representation of FIG. 7a shows a triode arrangement in which filament 170, beam shaping electrode 178, grid electrode 179, and ionization chamber entrance aperture 174 are all held at different potentials, but this arrangement is not limited to a triode; more lenses can be added as needed. A top view, showing in greater detail the electron optics of FIG. 7a and the propagation of the electron beam 173, is shown in FIG. 7b. Typical electrode voltages are: cathode potential $V_C$=−100V, beam shaping electrode $V_1$=−102V, grid potential $V_2$=+100V, source potential $V_S$=0 (all voltages are shown relative to the ionization chamber, or source, potential), and ion extraction electrode potential $V_E$=−5V, for example, although the lens system $V_C$ through $V_S$ can be operated over a broad range of voltages and electron energies to optimize performance in producing the ions of interest to a particular implantation process. $V_E$ is a bias voltage on the ion extraction aperture 177, which establishes a constant drift field E as also indicated in FIG. 7b. E imparts a drift velocity to the ions created within the ionization chamber, attracting positively charged ions toward the ion extraction aperture plate 177, where they can be efficiently extracted by an external extraction field to form the ion beam. Since the ions are created along the electron beam 173, E tends to provide forward momentum to the ions, such that their lateral component of kinetic energy is essentially thermal, i.e., of magnitude <<1 eV. FIG. 8 shows the triode filament injection embodiment of FIGS. 7a and 7b incorporated into an ion source similar to that depicted in FIG. 3. FIG. 8 shows a detail of the ionization chamber 175 and triode 200, and shows the triode contained within the source block 35. The other elements of FIG. 3 such as low-temperature vaporizer 28, gate valves 100 and 110, mounting flange 36 and gas feed 33, for example, are part of this embodiment as well, although not shown. However, the electron gun 42, magnet coils 90, and beam dump 70 are not part of the embodiment of FIG. 8, since these electron gun-related components have been replaced by the triode 200. Some further advantages of the approach of FIG. 8 are: 1) the filament is remoted to a lower pressure location (by directly exposing it to ambient vacuum within the source vacuum housing through vacuum conductances 190, for example), enhancing filament life; 2) remoting of the filament prevents contamination of the ionization chamber by the filament material; 3) the lens system facilitates accel-decel transport of the electron beam, enabling higher electron currents to be achieved within the ionization chamber. 4) The radiative heat load produced by filament 170 is conveniently conducted away in large part by the water-cooled source aluminum block 35. 5) The electron beam can be made to focus on the ion extraction aperture, resulting in a high ion extraction efficiency, and small lateral momentum. This last is due to the fact that the nominal electron trajectories are along the drift field E in FIG. 7b, such that the ions which are created by electron impact reach the ion extraction aperture having essentially a thermal lateral component of kinetic energy, i.e., <1 eV. 6) The embodiment of FIG. 7b and FIG. 8 results in a low-emittance, high-brightness source of ions, enabling improved control of ion beam propagation through the implanter, and much improved spatial and angular uniformity of the ion beam on the wafer substrate, relative to the prior art.

Figure 7C:
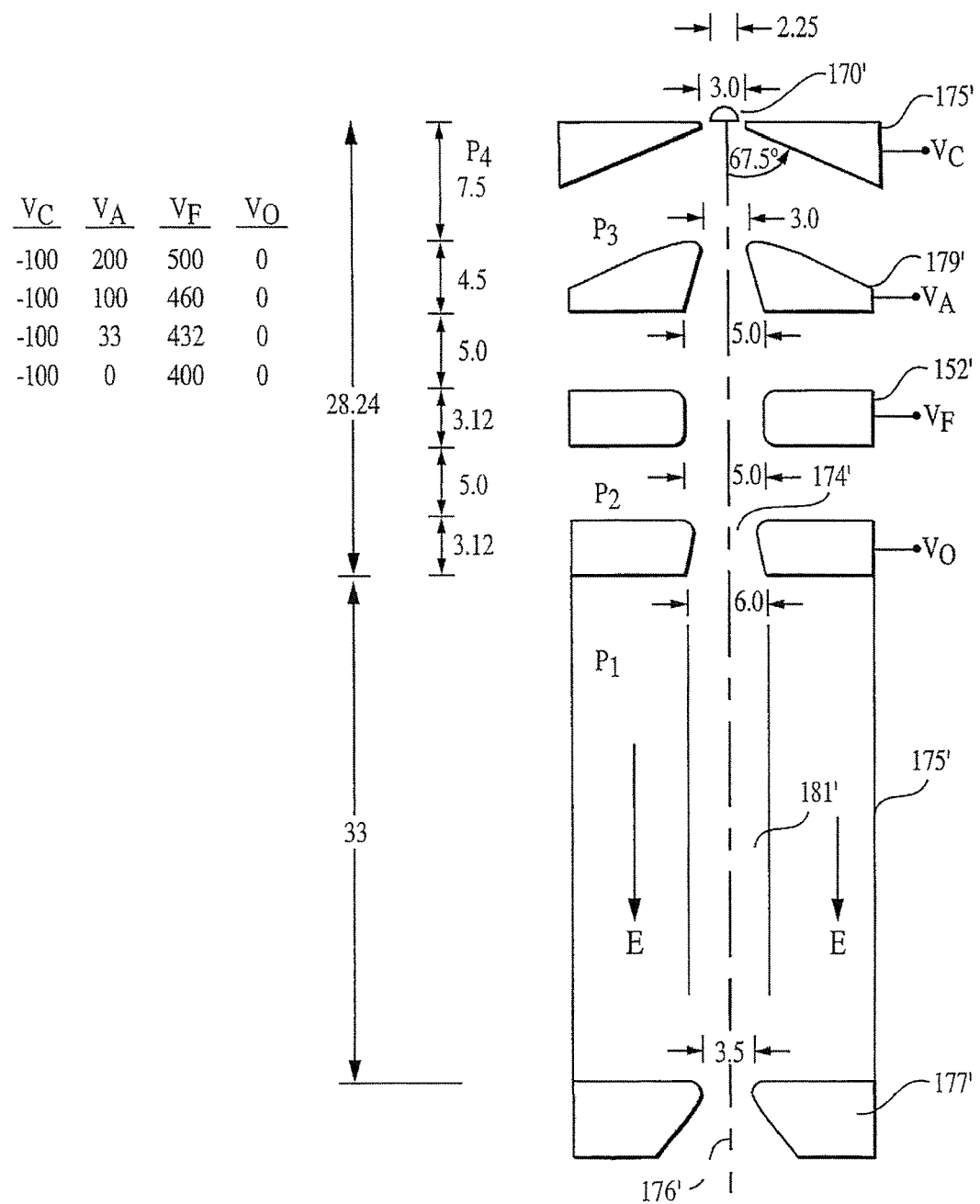
FIG. 7c is a schematic illustration of dimensional geometry of the apparatus FIGS. 7a and 7b.

FIG. 7c shows a tetrode geometry similar to the triode of FIG. 7b, but also having dimensional information. Dimensions are given in mm. The tetrode enables true zoom capability, so that the focusing properties of the lens system are somewhat independent of the final electron energy. This allows for extraction of the electrons emitted from the refractory filament 170' at a higher energy than the electrons entering the ionization chamber 175', i.e., using deceleration to deliver higher, space charge-limited electron currents into the ionization region. Representative lens voltages are shown in Table A, given for an object distance of 4 lens aperture diameters ("D") and an image distance of 6 D from the reference plane of the tetrode. These lens tunings inject 100 eV electrons into the ionization region by extracting the electrons at energies ranging from 300 eV to 100 eV. These tunings assume that the electrons have 100 eV upon entering the ionization chamber. Since these lenses are one-dimensional, they do not focus or confine the beam in the long (γ-direction) dimension of the slot. At high current density, the electron beam expands along γ due to space-charge repulsion, resulting in beam loss through vignetting. Space charge repulsion and beam loss can be much reduced by allowing positive ions to be produced along the beam path by electron-impact ionization. The positive space charge of the ions compensates for the negative space charge of the electrons, reducing the net coulomb repulsion between electrons within the beam, thus reducing beam blow-up and enabling higher electron currents than otherwise possible. In order to prevent ions created in the ionization region 181' from being extracted an lost into the tetrode, lens element 180' is always maintained at a substantially positive potential relative to $V_0$, the ionization chamber potential.

The creation of positive ions in the beam path is an effective means for reducing space charge forces: since the ions are heavy and slow-moving, their depletion rate is low, and a reasonable charge balance can be maintained if the rate of ion production is similar to the ion loss rate. The ion production rate at any point in the electron team path is proportional to the local pressure of ionizable gas at that point. For example, consider local gas pressures P1>P2>P3>P4 shown in FIG. 7c (I note that it is possible to control the local pressures Pi by tailoring the conductance between individual lens elements and the ambient vacuum). Further consider the predominant gas species being decaborane ($B_{10}H_{14}$), a large, heavy molecule with a large electron-impact ionization cross section for the production of positive ions. Within the ionization chamber 175', P1 is highest, approximately $10^{-3}$ Torr, so that space charge compensation is very effective; ideally, the charge density of ions is the same as the electron density. This ensures uniform propagation of the electron beam within the primary ionization region, ensuring good uniformity of the ion density adjacent to the ion extraction aperture 176', and hence a uniform ion density in the extracted ion beam. P4 is the ambient pressure of the source vacuum housing (nominally $10^{-5}$ Torr or less), and because the gas within the ionization chamber 175' propagates through electron beam entrance aperture 174", a large pressure gradient is established between these extrema. Since the deceleration lens 153 is close to 45', P2 is relatively high, and space charge repulsion is reduced substantially. The region P3 is adjacent to the cathode 143', hence it is desired to maintain P3 close to P4, i.e., at a sufficiently low pressure that the arrival rate of decaborane molecules to the cathode surface is less than the desorption rate of decaborane byproducts which can deposit on the cathode surface. This is particularly important for low-temperature cathodes such as $LaB_6$, and for field emitter cathodes. In general, refractory metal cathodes operate at sufficiently high temperatures that deposition of cracked process gases is not a problem.

Figure 9A:
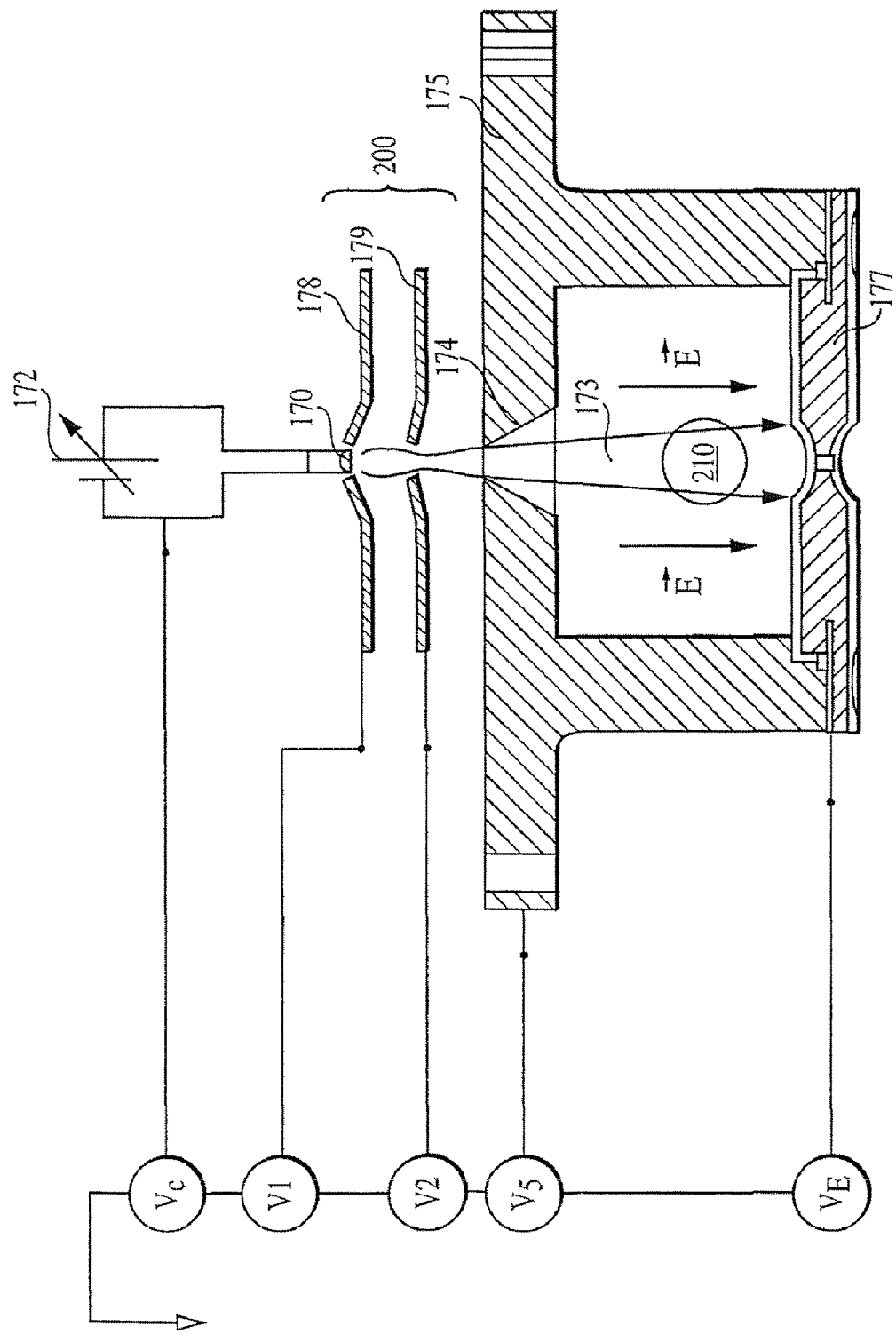
FIG. 9 is a diagrammatic top view of an alternative ionization chamber of the present invention.
Figure 10:
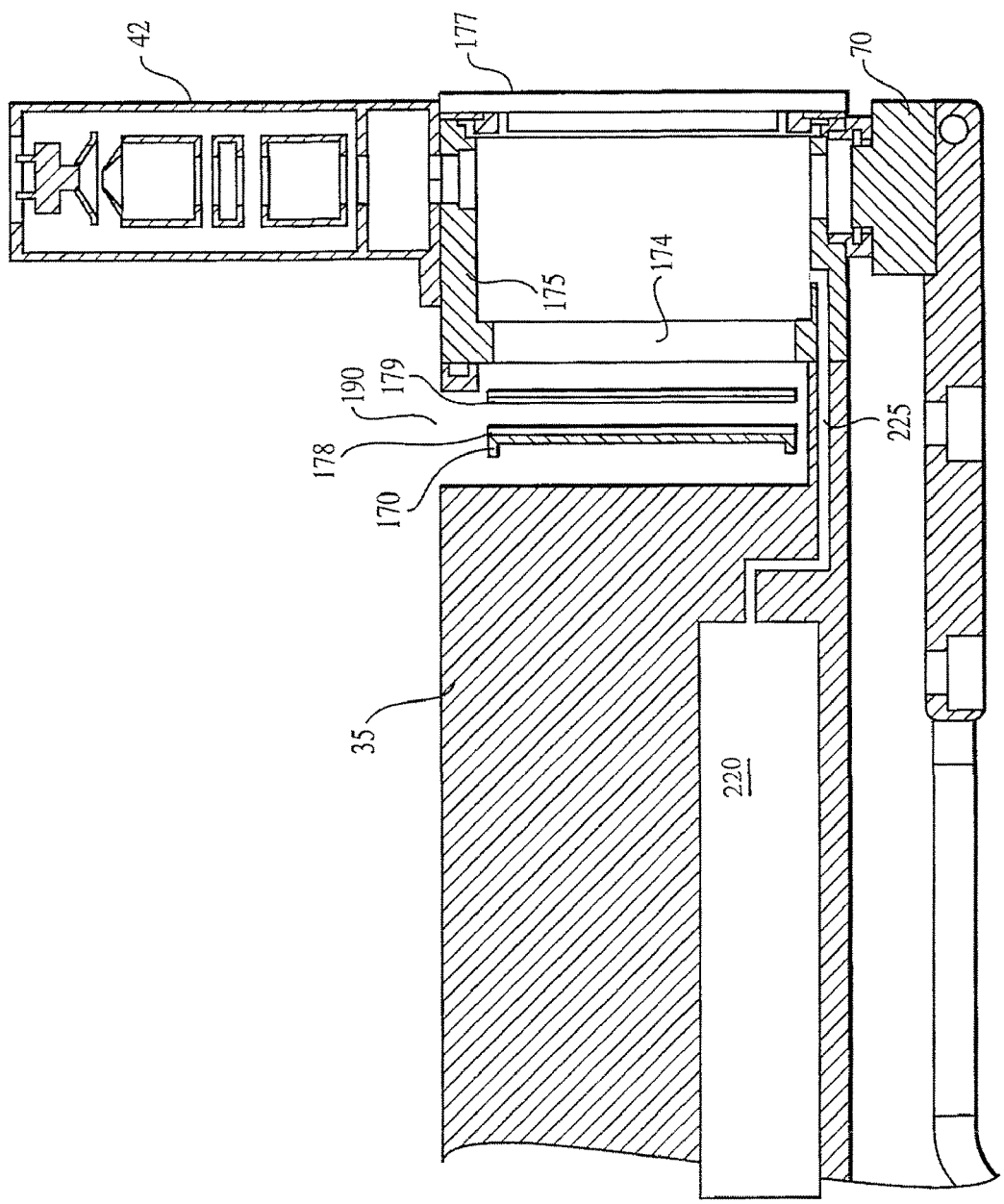
FIG. 10 is a diagrammatic view similar to that of FIG. 3 illustrating the ionization chamber of FIG. 9 incorporated into an ion implantation source.

In another embodiment, FIG. 9 shows the top view of a hybrid source which incorporates the design and operating features of the first two embodiments. It is analogous to FIG. 7b, but shows to intersection of the round electron beam 210 (shown going into the plane of the drawing) with the ribbon electron beam 173 from the long filament emitter-based triode 200. Thus, this third embodiment has both an axially-positioned, long filament emitter and a longitudinal electron beam. FIG. 10 shows a detail of the present embodiment incorporated into the ion source, which is a modification of FIG. 3. In addition to the low-temperature vaporizer 28 shown in FIG. 3, FIG. 10 further incorporates a high-temperature vaporizer 220 enclosed by the source block 35. Vaporizer 210 is positioned within source block 35 such that it does not interfere with the vapor conduit 32 or the gas feed 33 of FIG. 3. Vapor is conducted from vaporizer 220 to the volume within ionization chamber 175 by vapor conduit 225, shown in FIG. 10. The purpose of this second vaporizer 220 is to introduce vapors from solid dopant compounds such as elemental P, As and Sb, and also $Sb_2O_3$ and $InCl_3$, for example. Thus, vapors of these and other commonly-used solid dopants, as well as vapors of special low-temperature materials such as $B_{10}H_{14}$ and trimethyl indium (TMI) can be introduced into the ionization chamber 44 by the embodiment of FIG. 10.

The features and advantages of the embodiment of FIGS. 9 and 10 are: 1) high ion beam currents can be obtained; 2) lack of a magnetic field, combined with a high electron density near the extraction aperture, and the creation of ions in a path along the drift field direction, result in a very low-emittance source of ions. 3) A full complement of solid and gaseous feed materials can be used, and the incorporation of two vaporizers can accommodate both n- and p-type dopants without requiring servicing of the ion source between the different implants; 4) the low-energy electron beam produced by the filament, in conjunction with a higher-energy electron beam provided by the e-gun, enables the production of multiply-charged ion species through a stepwise ionization process in which copious amounts of singly-charged species are produced by the low-energy beam, which are again ionized by the higher-energy beam, resulting in multiply-ionized species. 5) The ability to "tune" the electron beam energy of the several electron sources gives the ion source of FIG. 9 great flexibility in producing different cracking patterns of molecular feed species, allowing the tailoring of the ion beam contents to specific implant requirements.

Drain Extensions

It is proposed that the technology disclosed herein has significant advantages when applied to the process of implanting the drain extension of a transistor that will result in a higher performance device. The basic concept is that the disclosed sources will provide a beam with low emittance, which in turn will create a junction with reduced lateral abruptness, which gives the transistor higher performance in exactly the ways needed for scaled technologies.

The transistor with a more abrupt lateral junction will have improved performance in several ways. First, the junction region contributes a component to the series resistance, and the more abrupt junction will contribute less series resistance, which in turn increases the dive current and transconductance of the transistor. The abrupt junction also reduces subthreshold conduction, which is very important as the supply voltage is reduced. One benefit of this feature is the reduction of off-state current, which would reduce the static current of the entire circuit, extending battery life, for instance. Improved subthreshold characteristics also allow for more freedom in the overall design of the technology, allowing the reduction of the threshold voltage without increasing static current. This allows a direct tradeoff between circuit performance (improved by lower threshold voltages) and the standby power (which is improved by reducing static current). These features are increasingly important as the supply voltage is reduced, as it is with each generation of technology beyond 0.25 um.

Figure 11:
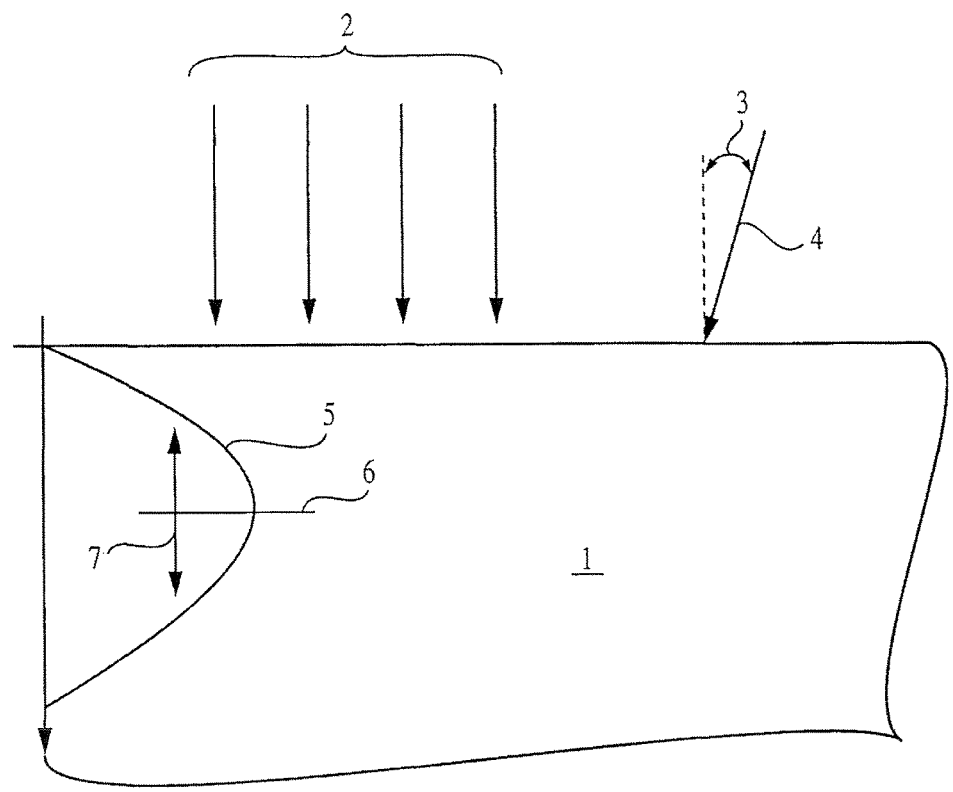
FIG. 11 is a general schematic illustration of ion implantation.

Within the field of ion implantation, a beam of ions is produced and transported to an impact target, with some degree of energy which causes the ions to enter the target material and penetrate to some depth. This is shown diagrammatically in FIG. 11. The target is typically a silicon wafer 1 where a transistor or other structure is being fabricated. The ion beam 2 is directed at the silicon wafer 1 to intentionally place the ions into the silicon into some feature that contributes to the creation of a functional device. The ions do not all travel along the same path, but rather create a distribution of atoms within the silicon, as shown by the depth profile 5 in FIG. 1. The depth profile is generally characterized by two parameters: the projected range 6 which is the average depth of penetration, and the straggle 7 which is a measure of the variation in depth of the atom distribution. These parameters depend strongly on the conditions of the ion beam being used for the implantation process, with heavier ions or those with lower energy producing shallower profiles. Generally analysis of ion implantation processes only consider an ion beam 2 which is entirely parallel, which allows direct computation of the expected profile, projected range and straggle. However, ion beams are not entirely parallel. There always exists some fraction of the beam that is not parallel, such as the illustrated nonparallel ion 4. Nonparallel ion 4 will impact the silicon substrate at a nonzero angle of incidence 3. In general, all ion beams contain non parallel components, the magnitude of which depend strongly on the beam conditions, the implantation equipment details, and the tuning of the implanter. Some of the implications of the various ion angles contained in the ion beam are discussed below.

Figure 12:
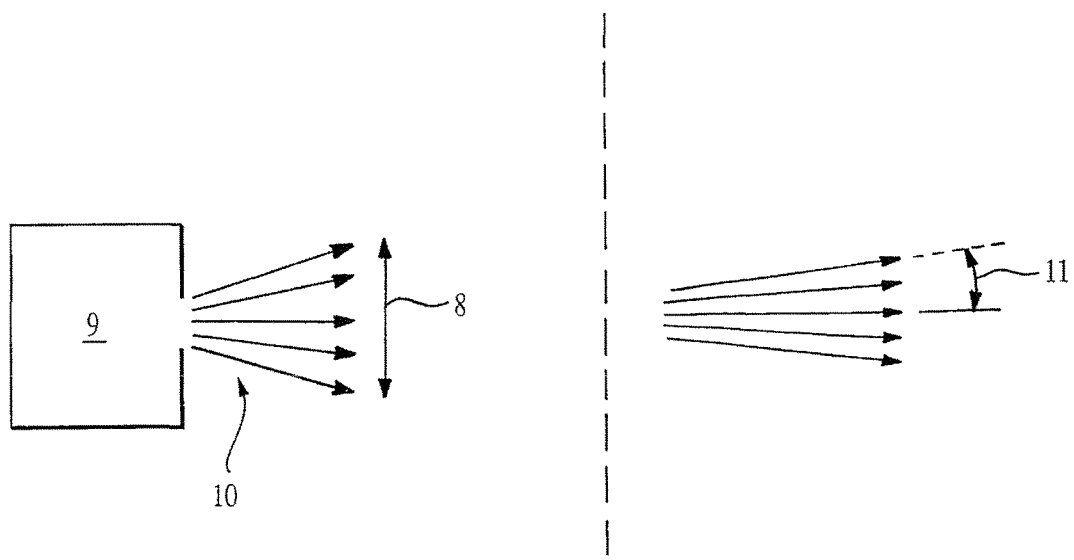
FIG. 12 is a general schematic illustration of an ion source emitting an ion beam.

There are several ways to characterize the non parallel components of the ion beam. First, as the beam 10 is created and leaves the ion source 9, the emittance 8 can be measured to characterize the angular distribution of beam 10, as illustrated in FIG. 12. This parameter is a measure of the total angular distribution of the beam as it is extracted from the source, and is usually expressed in terms of the solid angle. Once the ion beam is being transported down the beamline, the technology generally used to discuss the angular distribution is the divergence 11. Divergence 11 refers to the maximum angle of the beam relative to the beam axis. When the beam reaches the target, each ion has an angle of incidence as described above, because the target might be tilted relative to the beam axis for specific process effects. Thus, beam divergence 11 generates a range of incident angles when the beam reaches the target. It is important to note that these terms and parameters are limiting: the beam actually contains ions traveling at many angles, and there is a distribution function which would describe the beam density as a function of divergence angle. Still, these terms are useful because much of the following discussion relates to the ions with the largest angles.

One exemplary ion implantation process discussed herein is the drain extension implant. This is one step in the formation of a transistor: see FIG. 13. The drain extension implant is very important because it forms the structures that define the most important aspects of transistor functionality. First, it is the means by which self-alignment is accomplished: the gate electrode 13/gate oxide 12 stack is patterned to create a well defined gate edge 14. The feature masks the ion beam 2 which is going to form the drain extension. Where the gate stack has been removed, the implant penetrates into the silicon and forms an implanted layer which is the drain extension 15, but where the gate stack has not been removed the implant penetrates into the gate electrode 16. This process results in the drain extension junction being aligned with the gate electrode, which makes a good transistor structure and is known as a self-aligned gate. As further discussed below, nonparallel ions 4 and especially those that are directed under the gate and impact the silicon at the base of the gate edge, like the ion shown in FIG. 3 are of particular interest.

An important aspect of semiconductor technology is the requirement for constant scaling. Scaling is the process by which all dimensions are reduced so that more transistors can be placed in a given silicon area, reducing the cost per function. For ion implantation, the result is a constant need to reduce the ion energy, because reducing dimensions also includes reducing the ion depth dimension, and this is accomplished by reducing the implant energy. Notably, many aspects of semiconductor technology must continuously develop new methods, equipment and materials to keep up with the industry demands for scaling, and ion implantation is included. This scaling leas progressed sufficiently to create a major issue for ion implantation: challenge to make the junctions shallow enough to meet scaling requirements. The most severe issue relates to the formation of the p-type junctions since the boron atoms used are light and tend to penetrate deep into the silicon. In particular, the p-type drain extension is the most challenging implant because it uses the lowest energy boron beam. It is noted that there are fundamental problems with ion implanters delivering high current beams at low energy, and the methods being used to improve the low energy boron beam currents have adverse effects on the quality of the beam delivered, especially its divergence.

The ion implantation is not the only step required to form the drain extension. In addition, a heat treatment or annealing step must be performed to make the implanted atoms electrically active. Another problem is that this heat treatment must be performed at a high temperature (i.e. >900 C) such that there are also diffusion effects to consider. Diffusion is the movement of implanted ions out of their as-implanted depth profile, and generally deeper and laterally within the substrate. Since the challenge is to make a shallow junction (actually Ultra-Shallow Junction, or USJ), diffusion effects must be minimized. There is also an additional issue as the diffusion time is minimized: an effect known as transient-enhanced diffusion (TED). This effect is a result of silicon interstitials present in the implanted layer due to the implantation damage to the silicon crystal caused by the ion implantation. The result is a strong enhancement of the boron diffusion, which only lasts a short time. However, a short anneal cycle is desirable to minimize diffusion, and so the TED effect increases the need to shorten annealing time. It is noted that diffusion, and TED, move the implanted layer both in depth and laterally. There is much development of advanced annealing equipment and processes to perform this critical process, and whatever is developed to keep the junctions shallow will also provide a benefit in improving the lateral abruptness.

The scaling of the boron implant energy has produced a crisis for boron implantation: low productivity due to low current delivery capability. Since the need is for high ion currents at low ion energy, the result is a situation where the beam has high space charge density, which creates problems. At beam extraction from the source, the space charge density tends to compensate the extraction field and results in the well known $E^{3/2}$ relationship between beam current and energy. This effect dramatically reduces the available beam current as the energy is reduced, In addition, the space charge of the beam during transport tends to create a Coulomb force which pushes the ions laterally out of the beam, resulting in "beam blowup" and a loss of beam current as the beam is transported down the beamline. This effect is also strongly energy dependent, with the result that it is very difficult to deliver Low Energy Boron (LEB) ion beams to the silicon wafer target.

There have been two approaches to addressing the issue of LEB beam current by the implant industry, both of which result in a more divergent beam at the wafer. The first approach is to design a beamline with the shortest possible distance between the source and the silicon wafer, which allows more of the beam to reach the wafer. These short beamline are also made with a more open transport bath, so that a larger beam is able to transit the length. In terms of the beam divergence, this approach results in higher divergence of the beam at the wafer. The second approach to increasing LEB ion current is the use of deceleration. In this approach, the beam is extracted and transported most of the way to the wafer at higher energy, and then the beam is decelerated right before the wafer to implant at the correct energy. This approach also results in higher divergence at the wafer, and also introduces energy contamination to the beam on wafer.

The most important part of the depth profile is at the junctions edge, as shown in FIGS. 14a and 14b. As illustrated, the implanted boron layer interacts with the existing doping concentration to form a P/N junction. The gate edge and drain extension layer is shown in FIG. 14a, where a lateral cut is shown (A-A' 17) which is below and parallel to the silicon surface. In FIG. 14b, the doping concentrations are shown along the A-A cut. In the region of the drain extension, the boron concentration 18 is high, of order 1E20 cm-3, which is shown as a high value on the log scale 19. Prior to the LEB implant for the drain extension, there was an N-type doping concentration 20 already established, which is shown as Phosphorus, but could be any kind of N-type dopant. The critical feature is the spot where the two doping concentrations are equal, which is the junction edge, 21. The value of the concentrations is much lower here, since the N-type concentration is more likely to be of the order E17-E18 cm-3. Thus, the boron concentration 18 is also of this magnitude at this spot. It is now noted that the boron concentration at the junction edge is much less than the concentration within the drain extension, by at least 100X. This is important because is shows that a small component of the beam, of order 1%, can be very influential in determination of the junction edge, as will be further described below. In addition, the slope of the boron profile in the lateral direction at the junction edge is defined as the lateral abruptness of the drain junction. This parameter is usually expressed in units of nm/decade, or the lateral extent of the profile, in nm, required to move up one order of magnitude in boron concentration. A typical value of the drain lateral abruptness, for 0.18 um technology, would be 10 nm/dec, while requirements for future scaling reduce with each generation with a goal of <5 nm/decade.

A low divergence beam, such as that of the present invention, when used to form the drain extension, will improve the lateral abruptness of the drain extension and result in a higher performance transistor. Two mechanisms contribute to this advantage: reduced lateral penetration and reduced lateral straggle.

Figure 13:
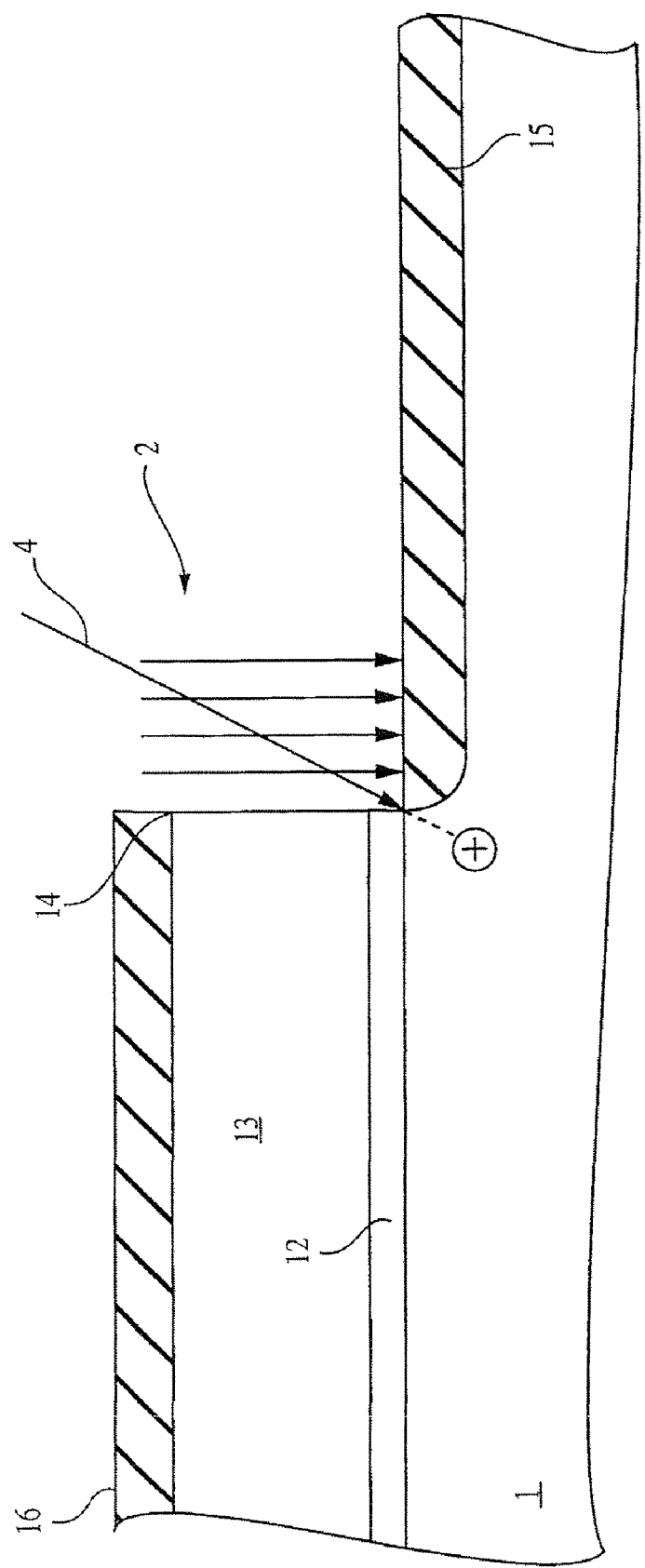
FIG. 13 is a general schematic illustration of ion implantation forming a drain extension adjacent a gate on a target substrate.

The first component, lateral penetration, is strictly geometric. Referring to FIG. 13, a beam with low divergence essentially places all of the incoming ions within the drain extension region, out from under the gate edge, which is desired. A divergent beam will have nonparallel ions incoming, and we are particularly interested in those nonparallel ions positioned exactly as depicted in FIG. 13, where the spot where the ion penetrates the silicon substrate is right at the base of the gate edge 14. This ion, on average, will come to rest at the position marked with the X, which is laterally displaced from the primary distribution of drain extension boron atoms. Since there is a distribution of incident angles within a divergent beam, the result is a lateral extension of the profile under the gate edge. This produces a graded junction in the lateral direction which is not as abrupt as that which would be produced by a low divergence beam. As discussed above, the concentration at the junction edge is much lower than the peak concentration in the drain extension, so it only takes a small fraction (1%) of the beam to have high divergence to significantly extend the junction laterally. In addition, there generally is a distribution of angles within the beam where the higher angles have less intensity, also contributing to a laterally graded junction. For an estimate of the degree of improvement with a low divergence beam, we can estimate the lateral displacement by the sine of the incident angle times the depth to the vertical junction edge. If we use 7 degrees for our divergent beam, the lateral displacement is 12% of the junction depth, while the normal estimate is the lateral junction edge is at 70% of the junction depth. Since this would now place the lateral junction at 82% of the vertical junction depth, the divergent beam produced a junction 17% more extended than a low divergence beam would (for this effect).

Figure 15:
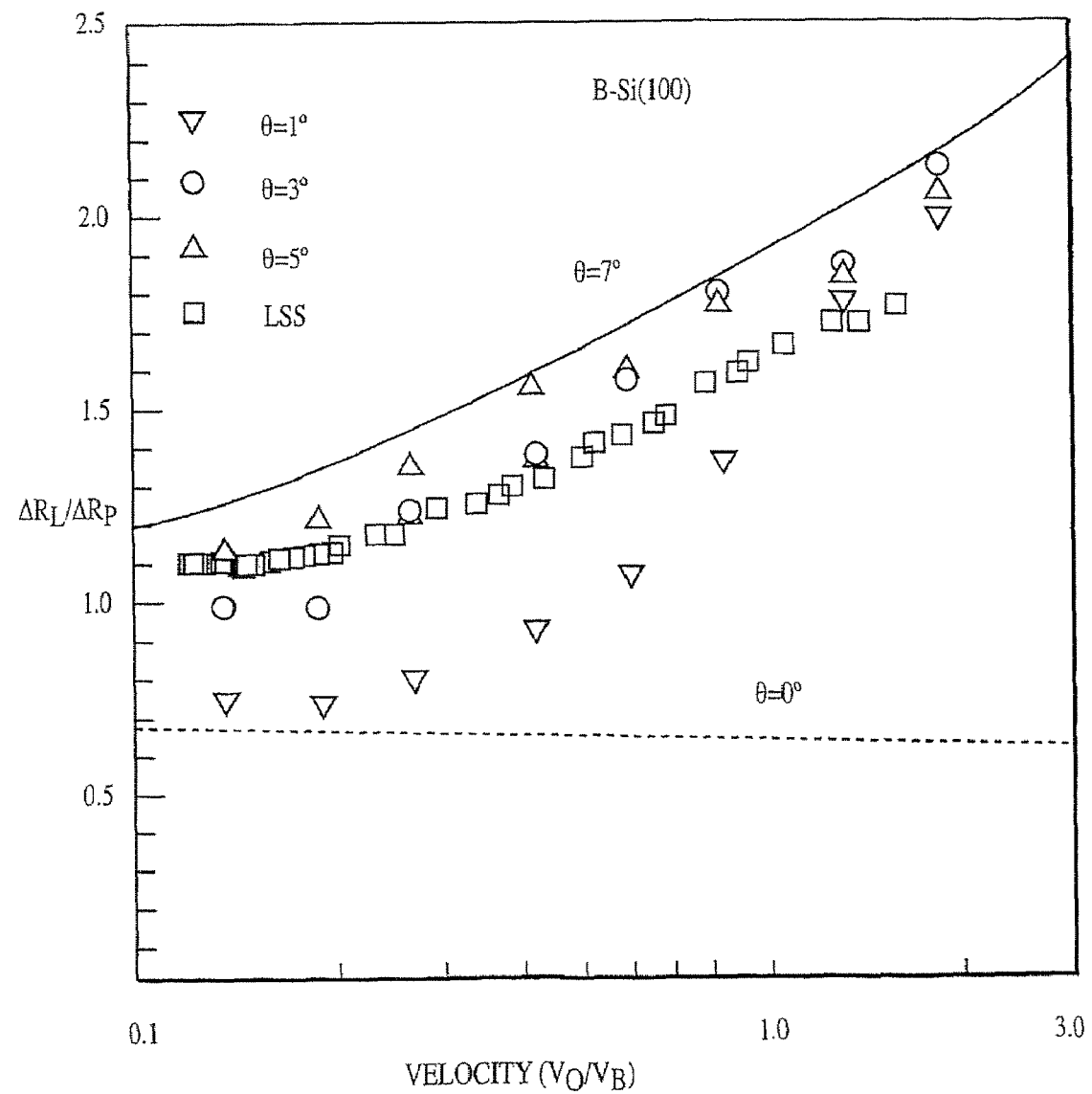
FIG. 15 is a graphical illustration of the lateral straggle exhibited during ion implantation as a function of the incident angle of ion approach to the target and the ion implantation energy.

The second mechanism involved with beam divergence and lateral junction formation is the lateral straggle. Straggle occurs because the silicon target is not a uniform homogenous medium and is rather a crystalline lattice with individual atoms arranged in a regular pattern With space in between. The incoming ions may either hit a silicon atom directly, hit a silicon atom with a glancing incidence, or miss the silicon atoms completely. This statistical process results in a distribution of conditions for the various incoming boron ions. The straggle is normally considered as a vertical variation in the depth profile, but a masked edge like our present case also involves lateral straggle. The important factor is that the lateral straggle is dependent on the incident angle, with divergent ions producing more lateral straggle. For a more detailed discussion of this phenomenon, the reader is referred to reference: Nakagawa, Hada and Thome, IIT '98, p 767. One of the figures from this reference is reproduced as FIG. 15 illustrating the results of calculations of the lateral straggle as a function of the incident angle, θ, and the ion energy. The normal expectation of 70% lateral to vertical straggle is shown as the dashed, relatively horizontal line, which is explicitly noted as assuming a zero angle of incidence. The data points are for various incident angles and energies, but it is seen that it is quite likely that ions incident with an angle of 7 degrees has at least double the lateral straggle of the conventional model. It is also noted that the effect is larger for higher angles, so the distribution spreads out laterally, which is exactly the opposite of the desire to keep the junction abrupt.

Figures 16A, 16B:
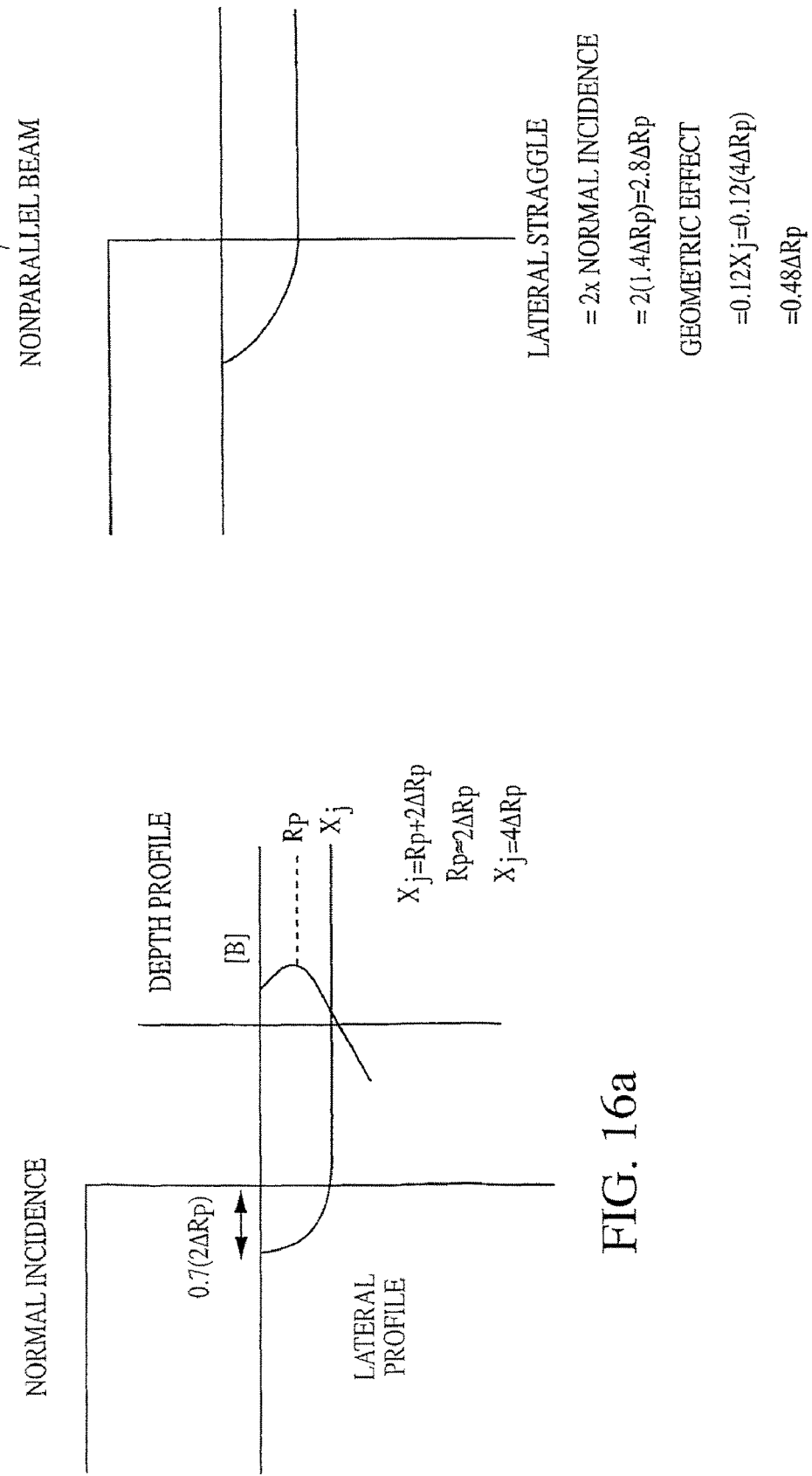
FIGS. 16a and 16b are schematic illustrations of predicted lateral straggle exhibited during ion implantation for normal incidence and 7 degree nonparallel incidence angles, respectively.

Referring now to FIGS. 16a and 16b, in order to make numerical estimates of the relative magnitudes of these effects, a model is constructed which resolves these effects into the same terms. The first step in the model is to reduce the variables by making an approximation: the vertical junction depth is equal to the projected range (Rp) plus two times the vertical straggle (ΔRp) or $$Xj = Rp + 2\Delta Rp$$

This allows the expression of the lateral junction position in terms of the vertical straggle, since the relationships have already been expressed.

The low divergence lateral junction edge occurs at a position which is two times the lateral straggle by this model. Since we already know that the lateral straggle is 0.7 times the vertical straggle, the lateral junction edge occurs at 1.4 ΔRp inside the gate edge. Now, the divergent beam case includes two teams, which add to produce the lateral junction edge. The first term is that the lateral straggle is twice the normal incidence case, so the this contribution is 2.8 ΔRp. The second term is the geometric effect which was 12% of the junction depth, which is now 0.48 ΔRp. Adding this to the other term produces a lateral junction edge which occurs at a position 3.28 ΔRp inside the gate edge, or 2.3 times more extended in the lateral direction. The lateral abruptness will also be improved by a similar ratio. This is a dramatic advantage which directly results from having a source with low emittance.

Another critical parameter associated with an MOS transistor is the channel length. The channel length is the distance between the source and drain, that is, between the lateral junction edge of the source and the drain. While the discussion so far has centered on the drain side of the transistor, there is another region on the other side of the gate which forms the source at the same time that the drain is formed. It is important to note that it is the lateral extension of the source and drain that determine the channel length. The implantation profile is determined by the implantation parameters, most importantly species and energy, but also tilt, twist, mask edge, and beam divergence. Once again, the beam emittance determines the beam divergence, and thus has an impact on the transistor formation. It is clear that the channel length will be longer for the low divergence beam, since there is less ion beam penetrating under the gate stack. It is not a benefit to have longer channel lengths in general, but the low divergence case produces a transistor closer to the ideal situation where the channel length is the same as the gate length.

For this case, the problem with the high divergence beam is that the divergence is not always the same. This is a natural result for beam conditions with significant divergence, because of the natural variation with beam tuning and setup. The variation comes because any time that the beam intersects an aperture, some of the beam is lost, and part of the divergence envelope is also lost, because there is a direct relationship between the position in space and the angle that that part of the beam will have with the substrate when it gets there. For example, take two conditions: one with the beam setup centered on an aperture and one where the aperture clips part of the beam. For the centered case, the divergence will also be centered, and so the beam intersects the wafer with the nominal angle plus or minus the same amount, say +/−5 degrees. For the second case, the edge of the beam, which is clipped by the aperture, is also the extreme of the angular spread, which is only taken off of one side. So, in this case, the angle at the substrate might be the nominal angle with asymmetric divergence, say +2/−5 degrees. Now, if the side where the divergence has been clipped is the side which is defining the edges of the transistor channel, we have changed the junction profile by eliminating the high angle ions, such that the channel would now likely be longer because the ions did not penetrate as far under the gate edge. This variation in channel length is highly undesirable, and a beam with low emittance would not be subject to this variability. It is noted that the variations discussed are normal, and are a result of the automation of modern equipment. In today's production tools, an automatic routine establishes the beam conditions, running a sequence of prescribed steps to establish and optimize the beam conditions. It is normal that this system does not reach the same beam conditions each time; its task is to create a beam consistent with the requirements, and there are always many solutions to the tuning problem. These tuning solutions produce different divergences in the beam itself, it is not necessary to have an off center beam, or any abnormal condition, to create beams with variable divergence.

Another benefit of the low emittance ion beam would be the ability to design the process so that the channel lengths are uniformly small, rather than having to design so that the shortest channel only occurs for worst case conditions. Since the performance of the circuit is directly connected to the channel length, the ability to produce uniformly short channels directly allows higher performance to be realized, for all other process steps being unchanged.

Note that channels too short are likely to fail, either because the drain to source voltage cannot be sustained because the channel is too short, or that the threshold voltage falls out of the operational range due to short channel effects. So, in the process of designing the process and the circuit, the distribution of channel lengths produced by the normal range of process variation must be conservatively considered, so that none of the transistors fail (failure rates of even one ppm are too large). Stated another way, the distribution of channel lengths shows less variation, and this allows the average channel length to be designed to be smaller, resulting in higher performance at no additional cost.

Extended Ribbon-Beams

There is currently great interest in extending the design of conventional ion implanters to produce ribbon beams of larger extent than heretofore. This interest in extended ribbon beam implantation is generated by several factors: 1) the recent industry-wide move to larger substrates, i.e., 300 mm-diameter silicon wafers; 2) the expectation that even larger substrates, i.e., 450 mm-diameter silicon wafers, will be put into production for conventional CMOS and other device manufacturing, and 3) the recent industry-wide move towards serial implanter designs which can benefit greatly from the incorporation of electromagnetically-scanned extended ribbon beams in order to increase wafer throughput, and to improve dose uniformity across the substrate. Since in conventional ion implant the wafer throughput tends to decrease with increasing substrate size and is inversely proportional to substrate area, and further, since the expected economic benefits inherent in the use of large-area substrates cannot be realized unless wafer throughput is kept roughly constant, the ability to deliver significantly higher ion beam currents is critical to the continued success of ion implant in silicon device manufacturing. While the beam current (hence dose rate) delivered to the wafer can scale with the length of the ribbon beam, this requirement is hindered by prior art ion sources for the following reasons: 1) prior art ion implantation sources can only produce ribbons of a limited extent (up to between two and three inches long), and 2) if the extended ribbon beam is produced by beam expanding optics, the current density in the beam drops in proportion to the magnification, such that the total current delivered to the large substrate is unchanged.

Figure 17:
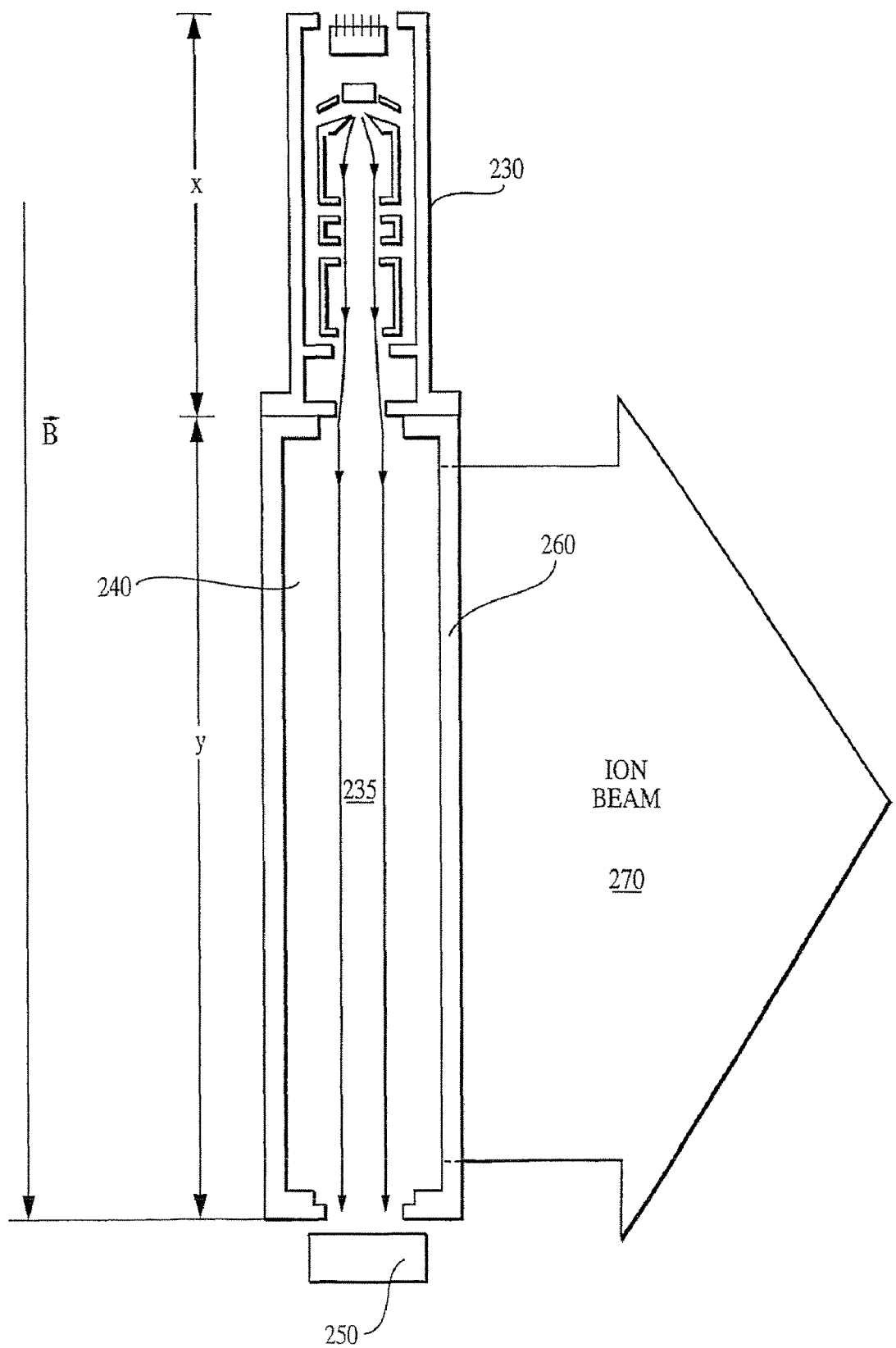
FIG. 17 is a view similar to that of FIG. 4, illustrating an alternative ion implantation source of the present invention for producing extended ribbon beams.

By utilizing the technology I described previously in embodiment 1, 2, and 3, I can produce ribbon beams of almost arbitrary extent as extracted directly from the ion source. This is accomplished by simply scaling the length of the ion source as indicated in FIG. 17. FIG. 17 shows an embodiment similar to that of FIG. 4, namely an electron gun 230 delivering a variable-energy electron beam 235 into a ionization chamber 240 filled with dopant-containing gas, and intercepted by a water-cooled beam dump 250. The electron beam propagates parallel to, and adjacent to, ion extraction aperture 260 from which an ion beam is extracted by extraction optics. An optional external magnetic field B is provided by magnet coils (not shown). The use of a longitudinal magnetic field oriented parallel to the path of the electron beam will confine the electron beam 235 over even a very long path length. The path length is given by (x+y) as indicated in FIG. 17, where x is the extent of the electron gun, and y is the extent of the ionization chamber (y is also roughly the length of the ion extraction aperture, and the desired length of the extracted ribbon ion beam 270). I envision the profile of the ionization chamber 240 to be cylindrical with the extraction aperture occupying a flat face of the cylinder.

The arrangement of FIG. 17 can be advantageously used as an ion source for the ion doping of that panel displays. For example, the ion extraction aperture 260 can be 850 mm long for producing ribbon beams to implant rectangular panels having a short dimension of 750 mm. In this case, the ionization chamber length y in FIG. 17 would be longer than 850 mm, for example 900 mm. Electron gun 230 is designed to deliver a high current, low energy electron beam 235 into ionization chamber 240. Typical specifications are: cylindrical lens diameter=1 inch, electron beam energy=100 eV (adjustable between 20 eV and 250 eV), maximum electron current =200 mA, electron current dynamic range =400 (i.e., electron current is adjustable between 500 μA and 200 mA). The electron beam is confined both in the electron gun and in the ionization chamber by an external magnetic field B produced by a pair of magnet coils. It is important that the electron beam be well-confined and collimated by B because of the long electron beam path length through the ion source. A magnetic flux density of between 50 G and 200 G is applied in order to maintain good uniformity of ion production (ion density) across the length of the ion extraction aperture 260 by limiting spreading of the electron beam diameter as it propagates through the ionization chamber 240 due to space-charge forces within the low-energy electron beam. The uniformity of ion generation along the aperture is further improved by reducing the feed gas pressure (relative to typical prior art ion source pressure which ranges between about $4 \times 10^{-4}$ Torr and $4 \times 10^{-3}$ Torr) within the ionization chamber 240 so that a smaller fraction of electrons are scattered out of the beam, for example an ionization chamber pressure of $1 \times 10^{-4}$ Torr or less. We note that prior art, plasma-based ion sources cannot operate at significantly reduced pressure since the plasma cannot be sustained at low pressure. This low-pressure operating mode can reduce process gas consumption in ion doping systems by more than an order of magnitude, significantly reducing tool cost of ownership (COO).

Figure 18A:
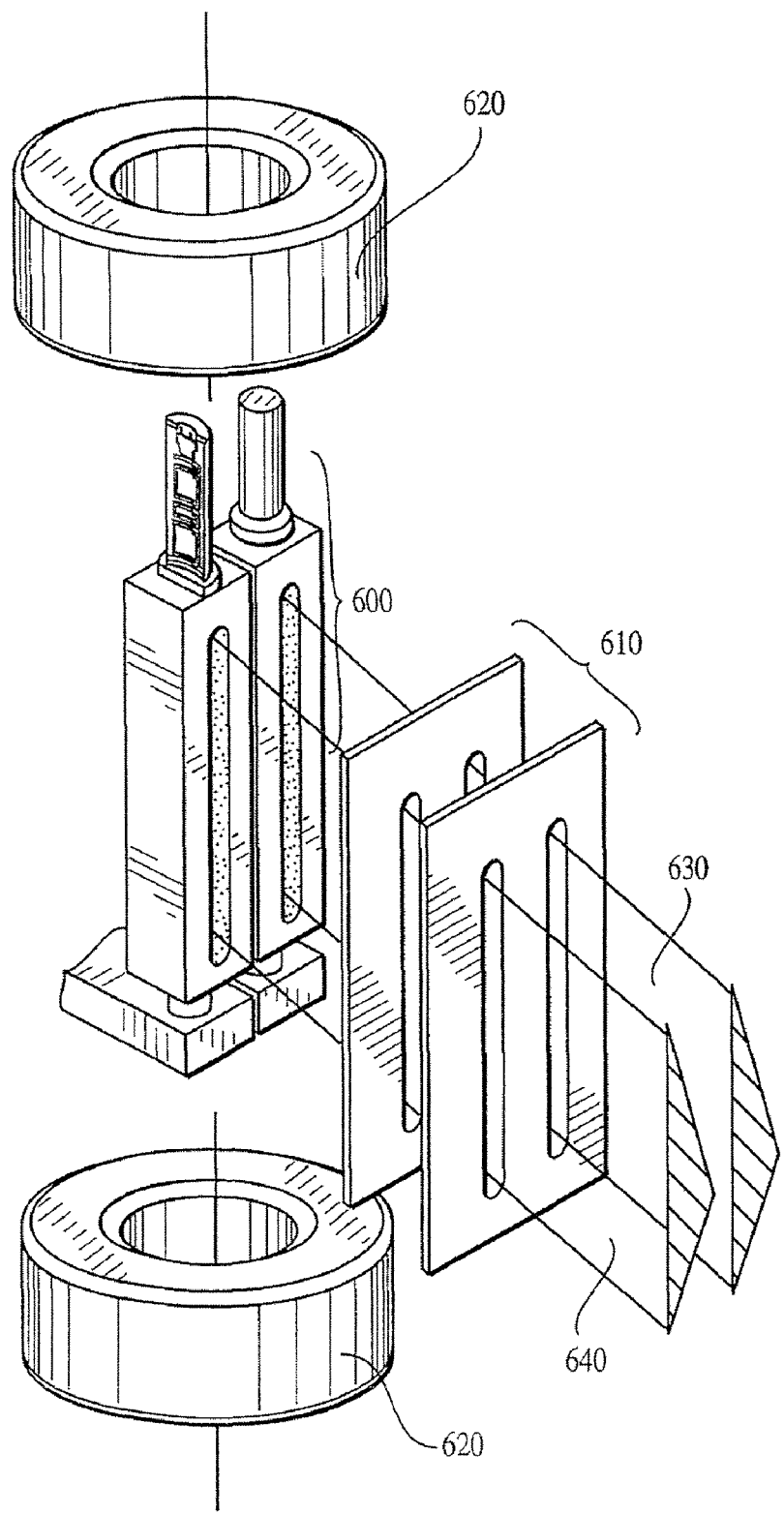
FIG. 18a is a diagrammatic view of a dual ion source system of the present invention for enabling both n- and p-type dopants to be implanted in a single ion doping tool.
Figure 18B:
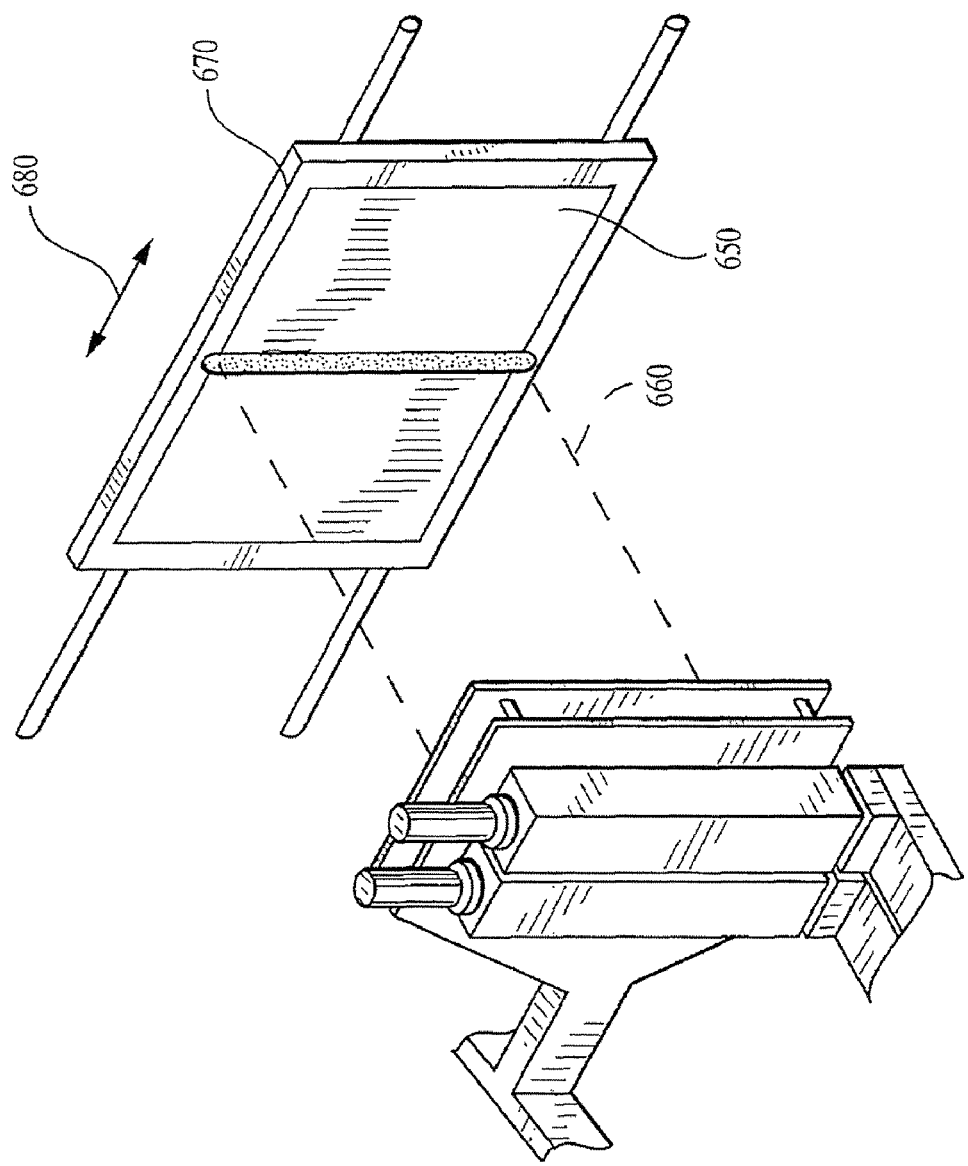
FIG. 18b is a diagrammatic view of the ion source of FIG. 18a implanting ions onto a flat panel substrate.

A further, dramatic reduction of COO is illustrated in FIG. 18b, which shows a dual ion source system 600 with dual-slit extraction optics 610. A single pair of large-diameter magnet coils 620 provides a uniform magnetic field which encompasses both ion sources. The embodiment of FIG. 18b enables both n- and p-type dopants to be implanted in a single ion doping tool by dedicating n-type (e.g., phosphorus) materials in source 1, and p-type materials (e.g., boron) in source 2. Sources 1 and 2 are not typically run at the same time. If desired, both ion sources can be run simultaneously with the same dopant, producing two ribbon beams, doubling the implanted dose rate. FIG. 18b illustrates two ribbon ion beams being generated, beam 630 (e.g., boron-containing), and beam 640 (e.g., phosphorus-containing).

FIG. 18b shows the dual ion source of FIG. 18a doping a rectangular panel 650 with ribbon beam 660. In this illustrative example, panel 650 is mounted on scan stage 670 and mechanically scanned along direction 680, along the long dimension of the panel 650. Note that in this case, ion beam 660 is indicated as longer than the short dimension of the panel.

Figure 19:
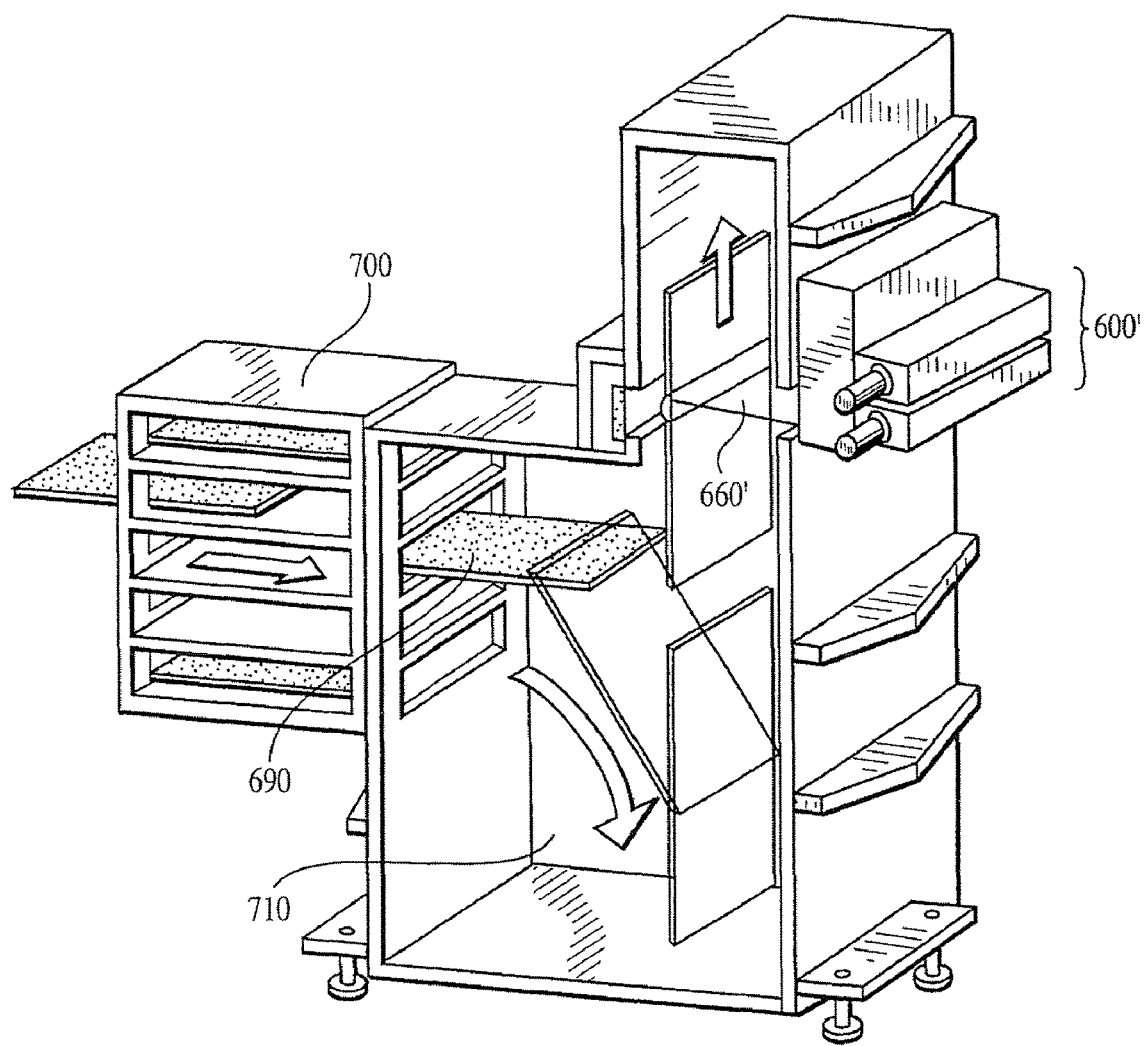
FIG. 19 is a diagrammatic view of a doping tool for flat panel displays into which the arrangement of FIG. 18a can be incorporated.

FIG. 19 shows a generic ion doping system for the doping of flat panels. Panel 690 is loaded from vacuum cassette 700 into process chamber 710, rotated through 90 degrees, and scanned vertically in front of ion beam 660'. The dual ion source 600' of FIG. 18a, 18b is shown integrated onto the system in schematic. Magnet coils and details of mechanical feedthroughs are not included, for clarity.

The p-type feed gases of choice in ion doping are diborane (B2H6) and boron triflouride (BF3). Since there is no mass analysis between the ion source and the substrate, all ions produced in the ion source are implanted into the substrate. This makes the use of BF3 problematic, since fluorine is detrimental to oxides, for example, and has undesirable process effects. Also, there is three times as much fluorine as boron in the source plasma, so much F can *be implanted. In the case of B2H6, which most manufacturers prefer to BF3 since there is not much process effect from H implantation (H implantation causes excess heating of the substrate, for example), there are two major complaints: 1) extensive cracking pattern (many different ions produced, for example, significant fractions of $H^{30}$ and $BH_x^+$, as well as $B_2H_x^+$. This results in a broad end-of-range implantation due to the variety of effective boron energies implanted into the sample. 2) Insufficient beam current resulting in low throughput, due to the fact that, in a conventional bucket-type source, most of the boron-containing ions produced are deposited on the walls of the ion source chamber.

Figure 19A:
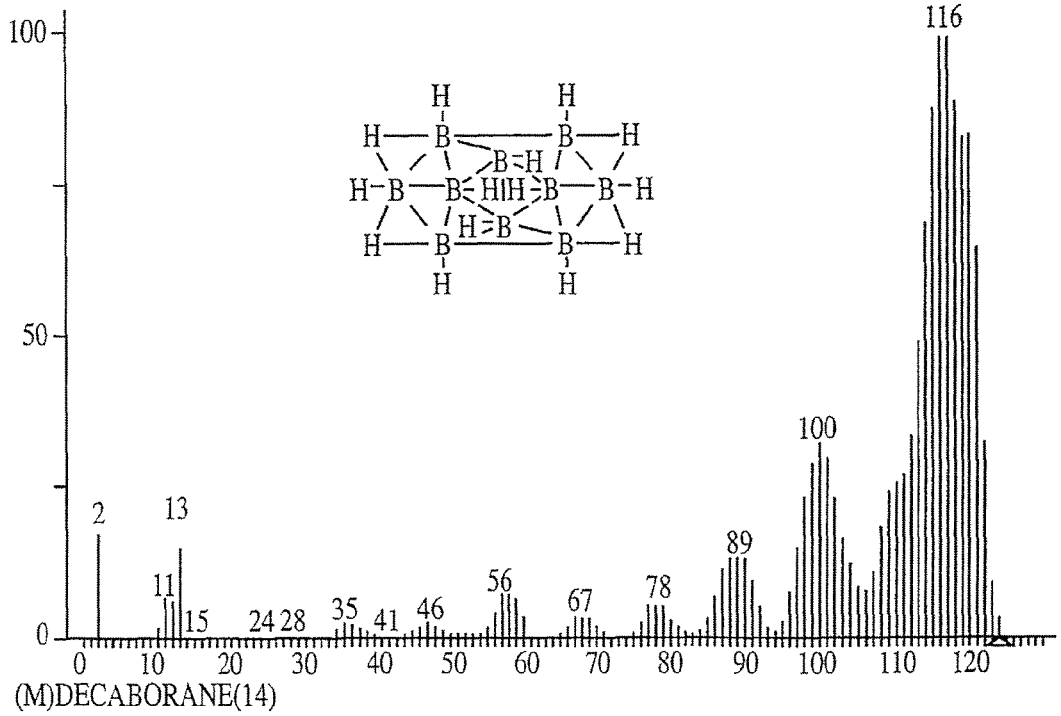
FIG. 19a is a graphical illustration of a cracking pattern for decaborane.

The use of the ion source of FIG. 17 and the substitution of decaborane as a feed gas material solves problems 1) and 2), since high currents of a 70% pure B10Hx beam is produced (as shown in FIG. 19a, a NIST-traceable spectrum of decaborane), the surface area of my ion source is orders of magnitude smaller than in a bucket source, and the ion source of FIG. 17 demonstrates a high ion extraction efficiency. The net result is that the use of the ion source of FIG. 17 running decaborane enables much higher throughput, much lower COO, and much less particulate formation (since less material is accumulated in the ion source) than the prior art.

Acceleration/Deceleration Techniques

The production of high-brightness ion beams is very important in ion implanters which employ deceleration of the ion beam prior to its impact with the substrate, since both the angular divergence of the decelerated beam and its spatial extent are increased after deceleration. To produce a small angular divergence beam on the target substrate with good spatial uniformity after deceleration, an initially low-emittance beam is required. Since the beam emittance (product of the beam diameters and angular divergences in two orthogonal directions) is inversely proportional to energy, the emittance of the upstream beam must be smaller than that desired at the substrate by at least an amount equal to the deceleration ratio. While the beam emittance can always be kept below a given value by the addition of a series of apertures, the resulting beam flux is unacceptably low. Therefore, the use of a high-brightness ion source is desirable, where brightness is defined as beam current divided by emittance (i.e., beam current per unit area per unit solid angle). The brightness is unchanged by such a series of apertures, and hence is a useful figure of merit.

Certain production implants, such as creation of drain extensions, require both low angular divergence at the substrate and low energy ions, which work against each other unless a high-brightness source is used. The net result is that a much higher implanted dose rate is achieved with the high brightness beam than with a beam of lesser brightness. This directly leads to higher product throughput, and lower cost devices.

The use of ionized clusters, which contain a single charge but multiple dopant atoms, enables higher brightness beams especially if we replace beam current by dose rate, or "effective" beam current. Since a singly-charged cluster of n atoms must be accelerated to n times the energy, the emittance of a cluster beam is n times smaller than that of a process-equivalent monomer beam. Since the dose rate is also n times the electrical ion current, the total increase in brightness of a given current of cluster beam is $n^2$, when brightness is defined as dose rate divided by emittance. Thus, the use of a high-brightness ion source which can produce cluster ion beams is an enabling technology which allows decelerated beams to perform well-controlled implants with small angular divergence, good spatial uniformity, and high throughput.

Figure 20:
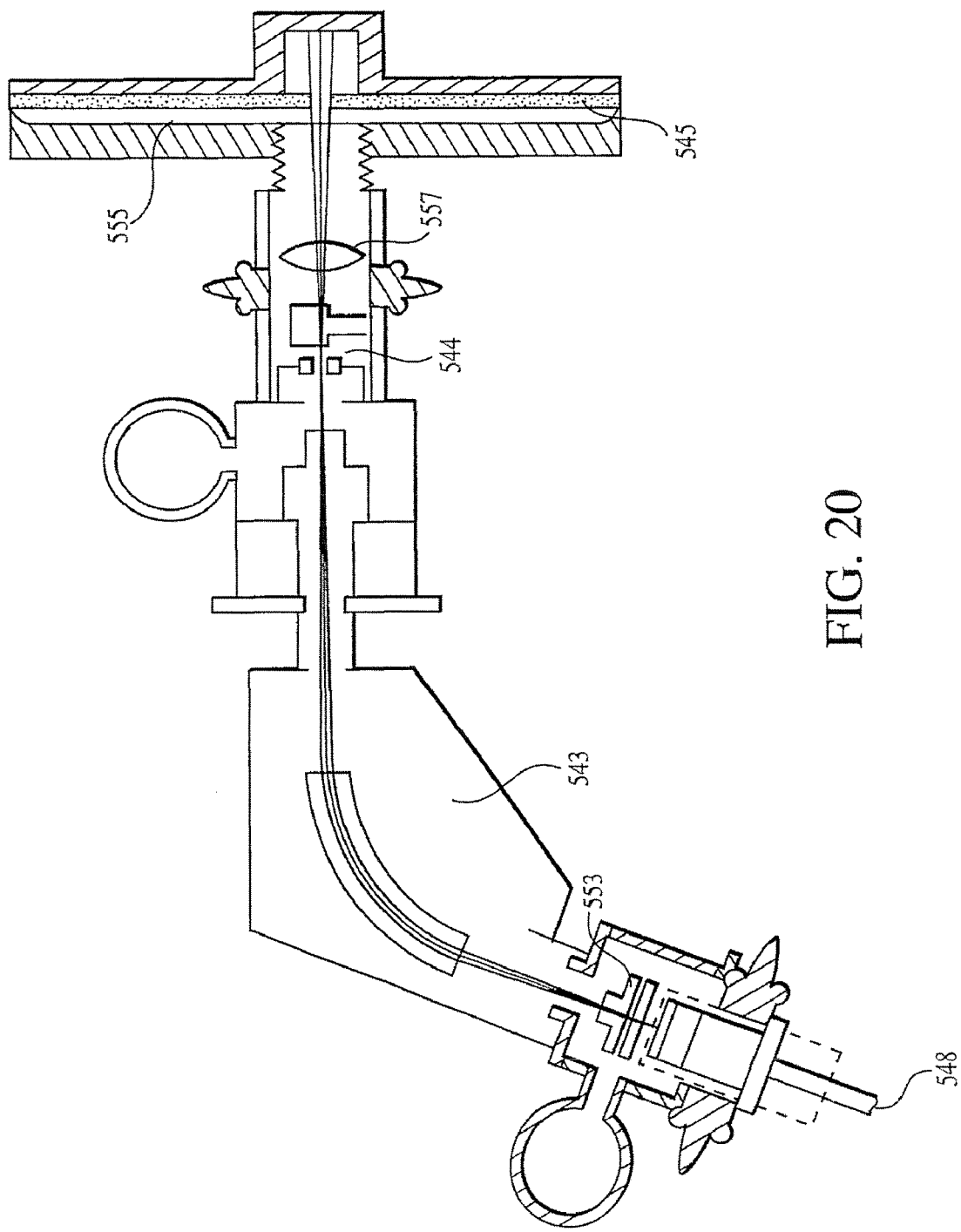
FIG. 20 is a side cross-sectional view of an acceleration/deceleration ion implantation system, of the kind having a fixed beam line, wafers being carried on a spinning disk.

In particular, FIG. 20, which is substantially the same as FIG. 1 of above-incorporated PCT Application Serial Number US00/33786 and described more thoroughly therein, shows a general schematic of a decel implanter such as is used with conventional boron implantation. FIG. 20 describes a conventional, non-decel implanter. For example, the ion source 548 produces ions which are extracted from a one-dimensional aperture (i.e., an elongated slot) and accelerated to a transport energy significantly greater than the desired final implantation energy by an electrode 553, and are injected into analyzer magnet 543 which disperses the beam laterally according to the mass-to-charge-ratio of the ions. A mass-resolving aperture (slot) 544 allows only the ion of interest (the ion having a preselected mass-to-charge ratio) to pass downstream to a moveable Faraday for measuring ion beam current, or (when the Faraday is retracted) to the deceleration electrode 557. The deceleration electrode 557 decelerates the ion beam to the desired implantation energy, which then impacts the wafer substrate 555. The schematic of FIG. 1 illustrates a batch-style implanter with a mechanically rotating and scanning disk 545, but the general approach of decel can also be adopted in serial implanters.

Since there is a finite probability that some of the ions in the ion beam will undergo charge-exchange interactions with the residual gas molecules in the implanter beam line or with other ions in the beam prior to reaching the decel electrode, most acceleration/deceleration implanters also incorporate a neutral beam filter (not shown in FIG. 20) or other type of energy filter (for example, E×B filter, electrostatic deflector, dogleg, etc.) to make sure that only ions of a predetermined energy reach the wafer, as is known in the art.

Typically, a batch style decel implanter will utilize a stationary ion beam, the scanning of the beam across the wafers being accomplished by the rotating and mechanically scanning disk 545; however, other embodiments are possible. For example, the present invention can, with advantage, be incorporated in a serial-style implanter (one wafer at a time) which accomplishes fast scanning (by either electrostatic scanning plates, or by a directional magnetic field) in one direction, while the wafer holder accomplishes a slower mechanical scan in the orthogonal direction. Alternatively, dual electromagnetic scanning of a stationary wafer is also possible. Serial-style decel implanters have never to my knowledge been commercialized, I realize such a design would have distinct advantages by being able to accommodate single-wafer processing, as well as enabling high tilt angles (up to 60 degrees) of the wafer holder (not currently possible with batch implanters). High tilt implants can be important in many processes, being preferred, for example, in "quad" implants for the fabrication of well structures, and for profiling of the S/D extensions. In addition, newer wafer fabrication facilities are expected to adopt single-wafer processing in the future to reduce the risks to expensive 300 mm process wafers incurred by batch processing.

Serial implantation requires a much higher degree of uniformity of the beam profile than in batch-style implantation to maintain good uniformity of the implant across the wafer, and this requirement becomes more difficult to achieve for 300 mm versus 200 mm diameter substrates. A feature of my invention is combining cluster beam implantation with the acceleration/deceleration technique by a serial, high-current beam line implantation system, the improved profile of the beam, as described, meeting the beam profile uniformity demands needed for the serial implanter to be production worthy.

Figure 21:
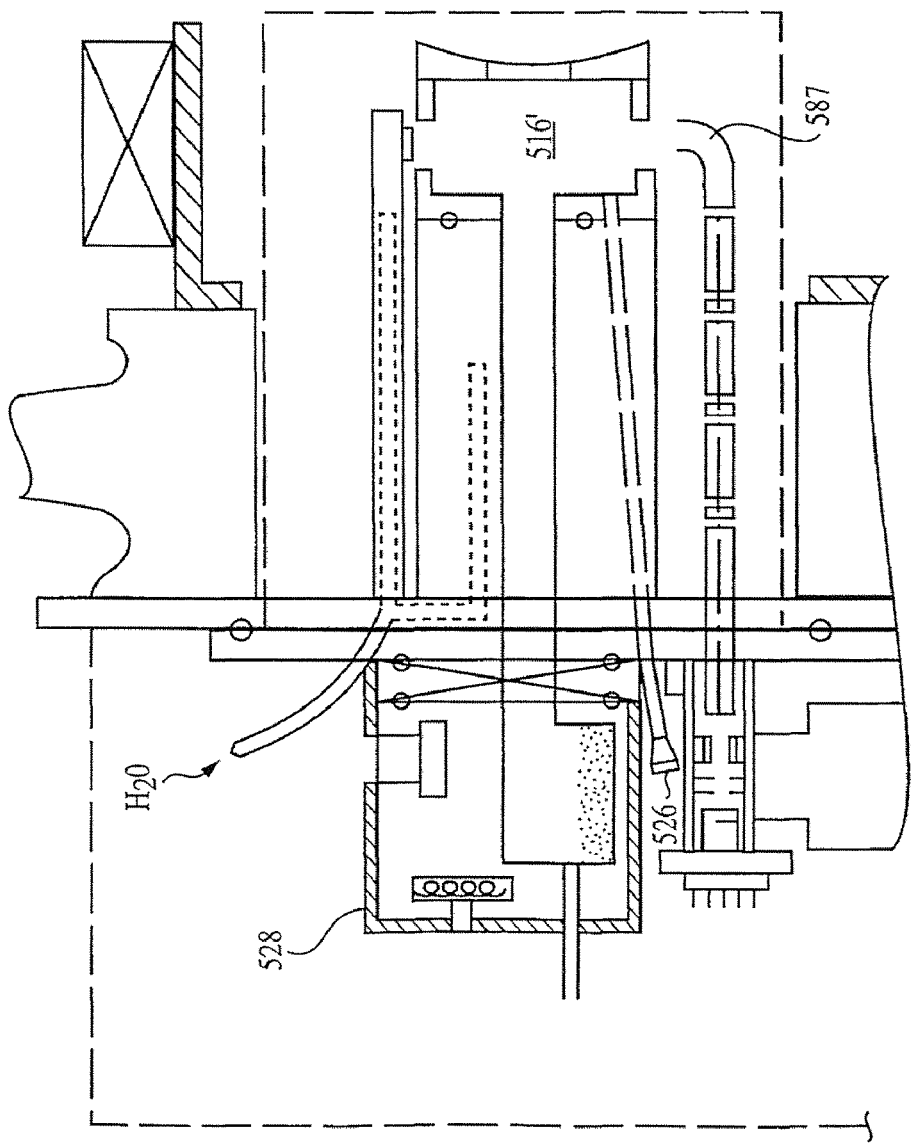
FIG. 21 is a side view of an ion source, suitable for decaborane, etc., retrofittable into the ion source housing of a pre-existing acceleration/deceleration ion implantation system, such as shown in FIG. 1.

FIG. 21 shows one preferred embodiment of the ion source used in the present invention, mounted onto the vacuum housing of a conventional ion implanter. This ion source is fully described in the above referenced PCT Application Serial Number US00/33786, in which it is included as FIG. 9B. The ion source operates on a different principal than conventional ion sources presently in use in commercial ion implantation, in that the ions are produced not by an arc discharge or by a plasma, but by direct electron-impact ionization by a broad directed beam of energetic primary electrons that transit an ionization volume $516'$. This ion source is an enabling technology for ionizing molecular compounds, and provides high currents of decaborane ions, as well as of the dimer-containing compounds of Table 1a. The source incorporates a low-temperature vaporizer 528 for producing vapors from solid materials having a low melting point such as indium hydroxide, trimethyl indium, and decaborane, for example, and also incorporates a gas feed 526 which allows the ionization of gaseous compounds such as $PH_3$, $AsH_3$, $GeH_4$, $B_2H_6$, as well as more common implanter gases such as $BF_3$, $SbF_5$, and $PF_3$. The embodiment of FIG. 21 shows an extended electron gun which incorporates a 90 degree bending stage or mirror 587 to reduce the footprint of the source assembly for retrofit into existing ion implanters, and to conserve space while enabling a full complement of electron optics to be incorporated into the electron gun to achieve variation of the electron energy to match the ionization needs of the selected molecular species.

Figure 22:
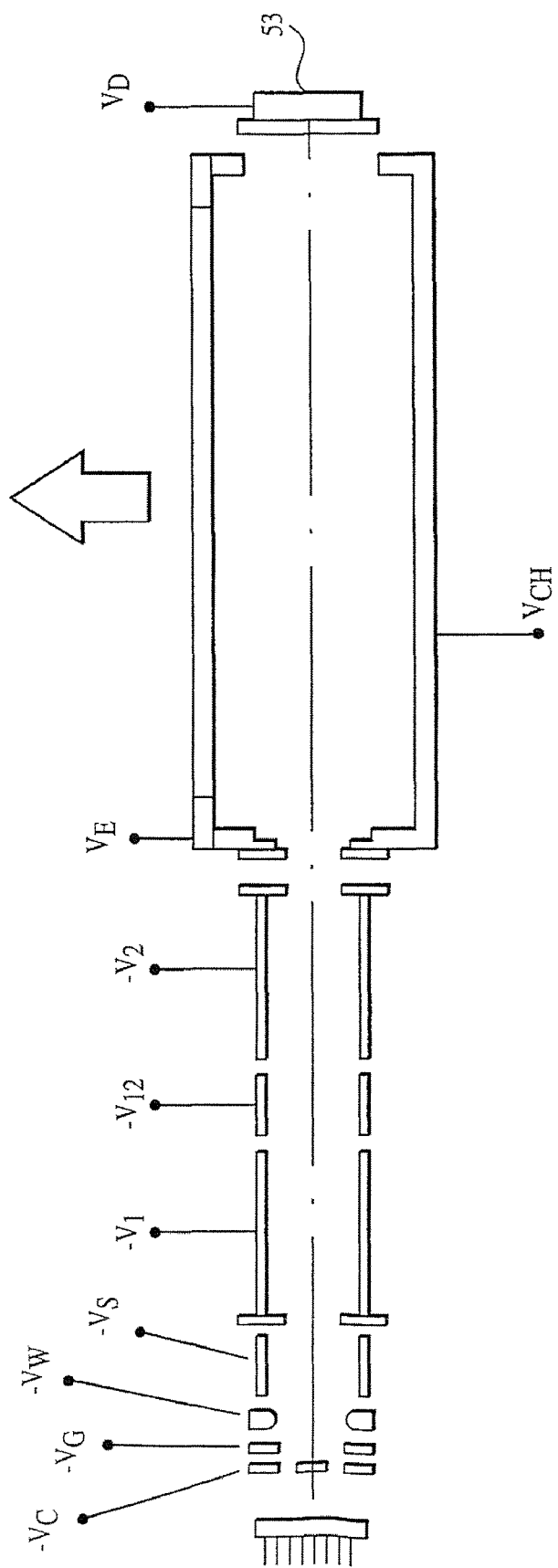
FIG. 22 is a side view of another ion source suitable for decaborane, etc., used in an acceleration/deceleration ion implantation system, featuring a highly elongated extraction aperture for producing an initial beam of ions having a highly extended cross-section.
Figure 23:
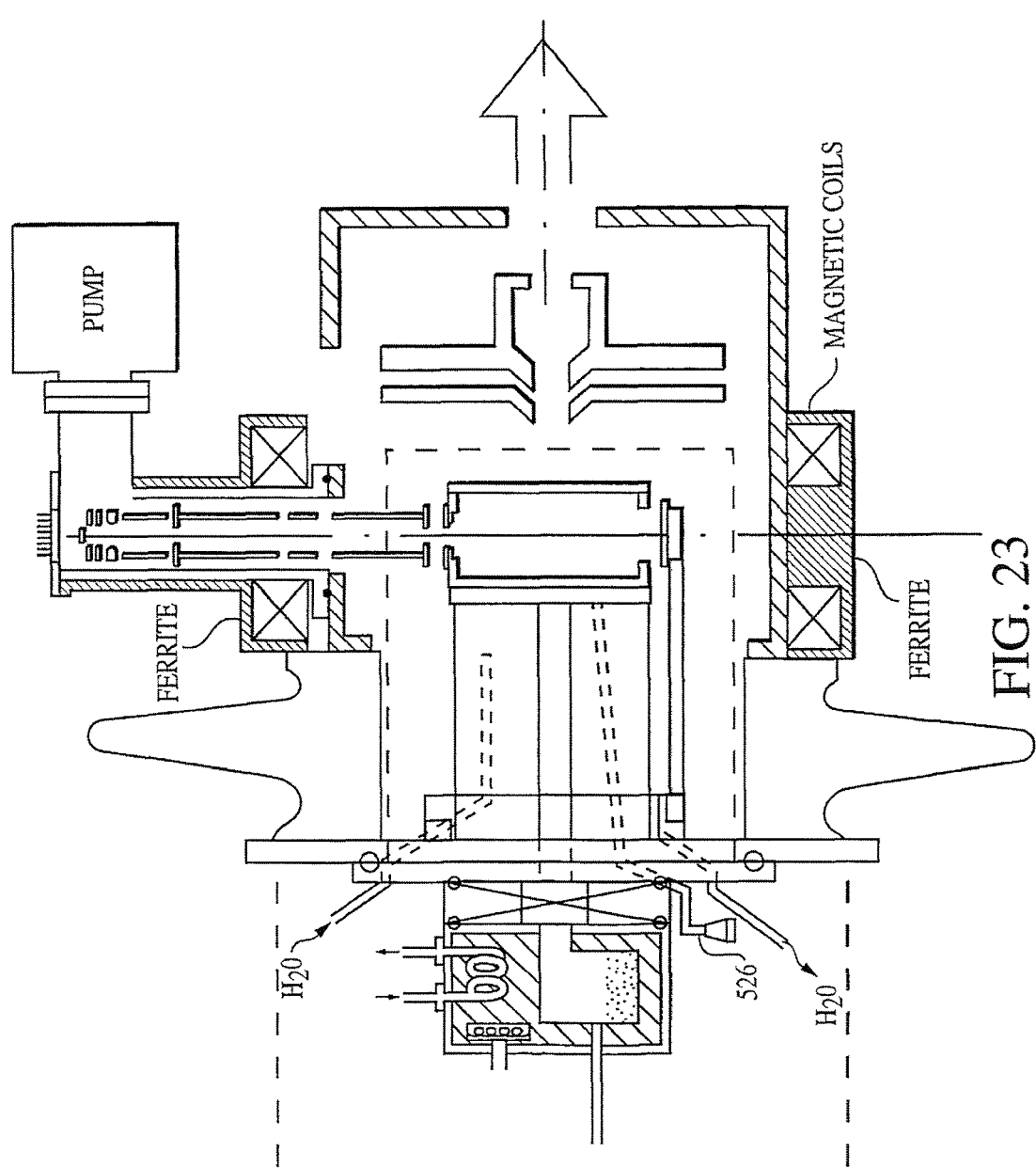
FIG. 23 is a view, similar in kind to FIG. 2, of an ion source capable of magnetically confining, an electron beam passing through the ionization chamber.

FIG. 23 shows another different embodiment of an ion source and it's electron gun, which is also fully disclosed in the above-referenced application. The electron gun operates, itself, on an acceleration/deceleration principle, and does not use a turning stage. FIG. 23 shows the ion source mounted in a volume of the vacuum housing similar to FIG. 21, but with the housing modified to accommodate the straight-through electron gun design. The embodiment of FIG. 23 also has a set of magnet coils to provide confinement for primary electrons within the ionization volume of the ion source. Thigh electron currents at a controllably variable electron energy can be injected into the ionization chamber by the electron gun; the majority of electrons which transit the ionization volume are intercepted by a beam dump $536'$ (FIG. 22).

Figure 24:
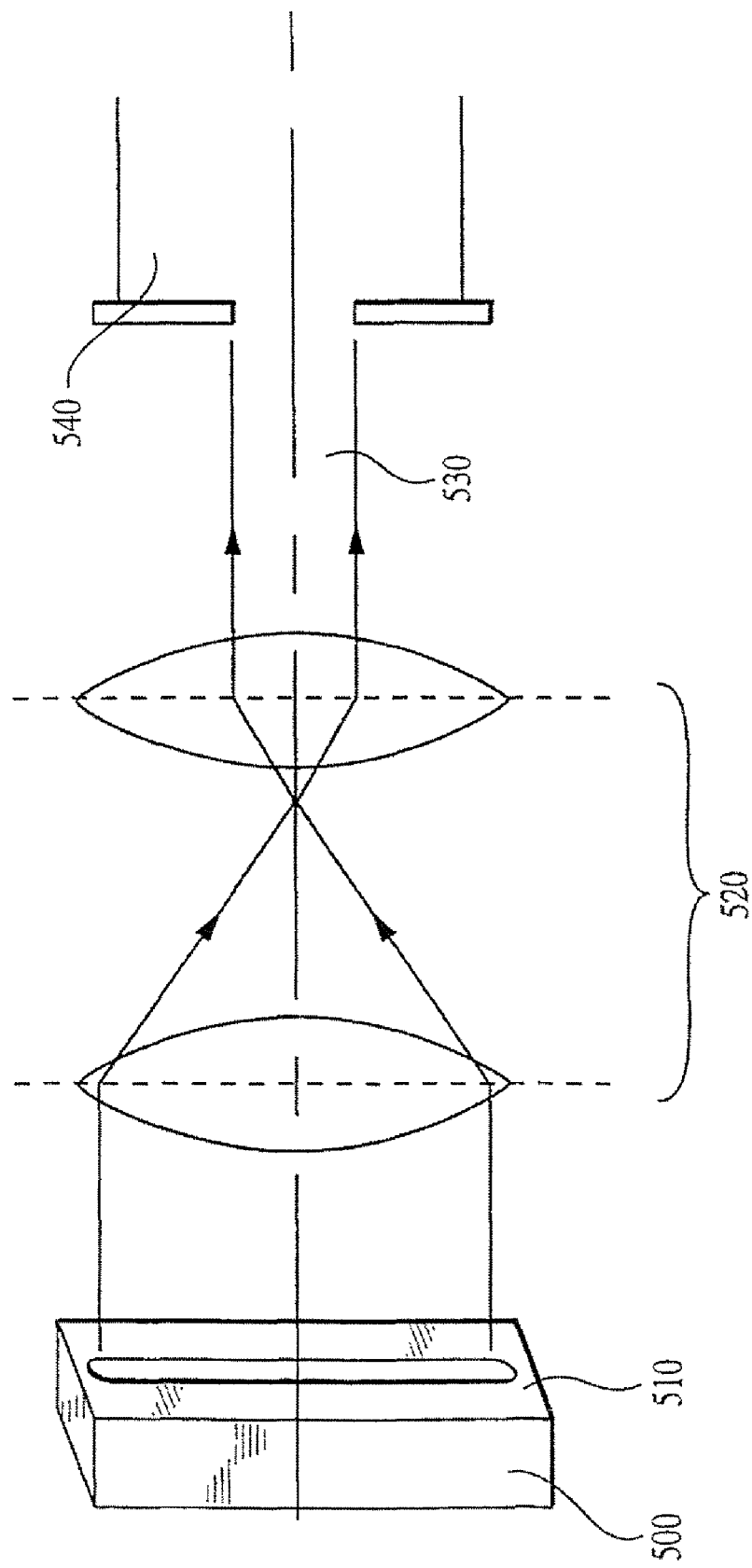
FIG. 24 is a diagrammatic representation of ion optics combined with an ionization chamber from which a beam of ions of highly extended cross-section is extracted.

In the embodiment of FIG. 22, the length of the ionization chamber and the corresponding elongation of the ion extraction aperture is greatly extended, such extended length of the ionization chamber having little negative effect and a very positive advantage on the successful operation of the ion source. This great elongation is in sharp contrast to the conventional Bernas-style arc discharge ion sources commonly used in ion implantation. In these the arc becomes unstable if the chamber length (and hence the separation between the cathode and repeller) is made significantly longer than the common length while the arc current required to operate the Bernas source would increase dramatically (a conventional Bernas source has a cathode-repeller separation of about 2 inches, and draws up to 5 A of arc current). By greatly extending the length of the ionization volume and the ion extraction slot aperture, according to the present invention, more ion current can be extracted than in the previous embodiment. Special optics are provided, constructed to reduce the length of the beam profile thus produced as the beam progresses away from the aperture. This approach is illustrated by FIG. 24. Elongated ionization chamber 500 has an elongated ion extraction aperture 510 from which the ion beam is extracted and accelerated by extraction lens 520. I presently contemplate the extraction aperture 510 to be about six inches in length, three times the length of the extraction slit of a conventional arc discharge chamber of a high-current ion implanter. Extraction lens 520 has the special property of being telescopic; it is a two-stage acceleration lens in which the second focal point of the first lens and the first focal point of the second lens roughly coincide, enabling telescopic focusing. By constructing the lens 520 to achieve a three-to-one demagnification, the height of the ion beam is substantially reduced while preserving a well-collimated beam trajectory 530 for injection into the implanter's analyzer magnet 540. Heretofore such an ion optical approach would be unsuccessful, since if the ion extraction aperture of a high-current implanter were made much longer to increase extracted beam current of a monomer beam, space-charge forces would not permit lens 520 to function properly, and the beam trajectory 530 would not be well-collimated; that is, the beam would simply blow up. In fact, the net result would be to extract and inject into the analyzer magnet less useful beam current than with a conventional, two-inch aperture! The reason is that in a conventional Bernas arc discharge source used in a conventional high-current implanter, beam transport is fully space-charge limited at extraction, since up to 50 mA of ion current (in a $BF_3$ plasma, about 30% or up to 15 mA is boron, $B^+$) can be readily produced from a two-inch aperture. The ion source of the present invention, in contrast, can produce 1 mA or more of ion current from a two-inch aperture, of which about 70% is decaborane, so that even from a six-inch aperture, between about 3 mA and 5 mA of ion current should be obtainable. Since this low ion current can be extracted at a much higher energy than possible in a decel implanter using boron (the deceleration ratio is not arbitrary, but is selected to be within desired energy contamination, and transport limitations, and to achieve desired levels t of beam current), it follows that the transport depicted in FIG. 24 is not space-charge limited. Hence, by elongating the extraction aperture of the ion source of the present invention as depicted by FIG. 24, it is anticipated to be possible to triple the beam current, and yet maintain good beam emittance properties.

Electron Gun

As an introduction, to the electron gun construction now to be described, it is important to observe that using hot cathode based electron guns of the type disclosed is problematic in a vacuum environment since radiative loads from the hot cathode and also conductive heat transfer between the cathode lead and the surroundings, and in particular electron bombardment of the individual lens elements, all conspire to make heat dissipation a significant problem in lens designs which isolate the lenses from objects which are at thermal equilibrium with a cold reservoir. Efforts to create electrically isolating and thermally conductive mechanical paths to conduct heat away from the individual lens elements, the most important of which would be the cathode assembly since it dissipates much of the heat which is dissipated throughout the electron gun, are also highly problematic since the mechanical construction of electrically insulating and thermally conductive paths to a cooled heat reservoir are difficult to achieve in practice and are prone to failure. One possible solution to this problem is to allow the lens elements to float to whatever temperature allows them to be in thermal equilibrium with their surroundings, however, this approach, too, is problematic. Even if one were to construct the lens elements out of refractory materials that could easily maintain an operating temperature of 1000° C. or more, interactions with process gas make this an unsatisfactory solution. In particular the use of decaborane in such an environment would cause cracking of the decaborane upon contact with lens elements and deposition of boron onto the lens elements creating particulates which are deleterious to the implant process in general, could create electrical shorts by the coating of insulators and can also reduce the cathode and ion source lifetime significantly. According to the invention, an elegant temperature control arrangement is achieved by radiative heat transfer and vacuum to a cool body which subtends nearly $4\pi$ steradians surrounding the lens elements and more specifically heat transferable holders which also accomplish precise registration of the lens elements with each other and also with the ion source per se.

Figure 25:
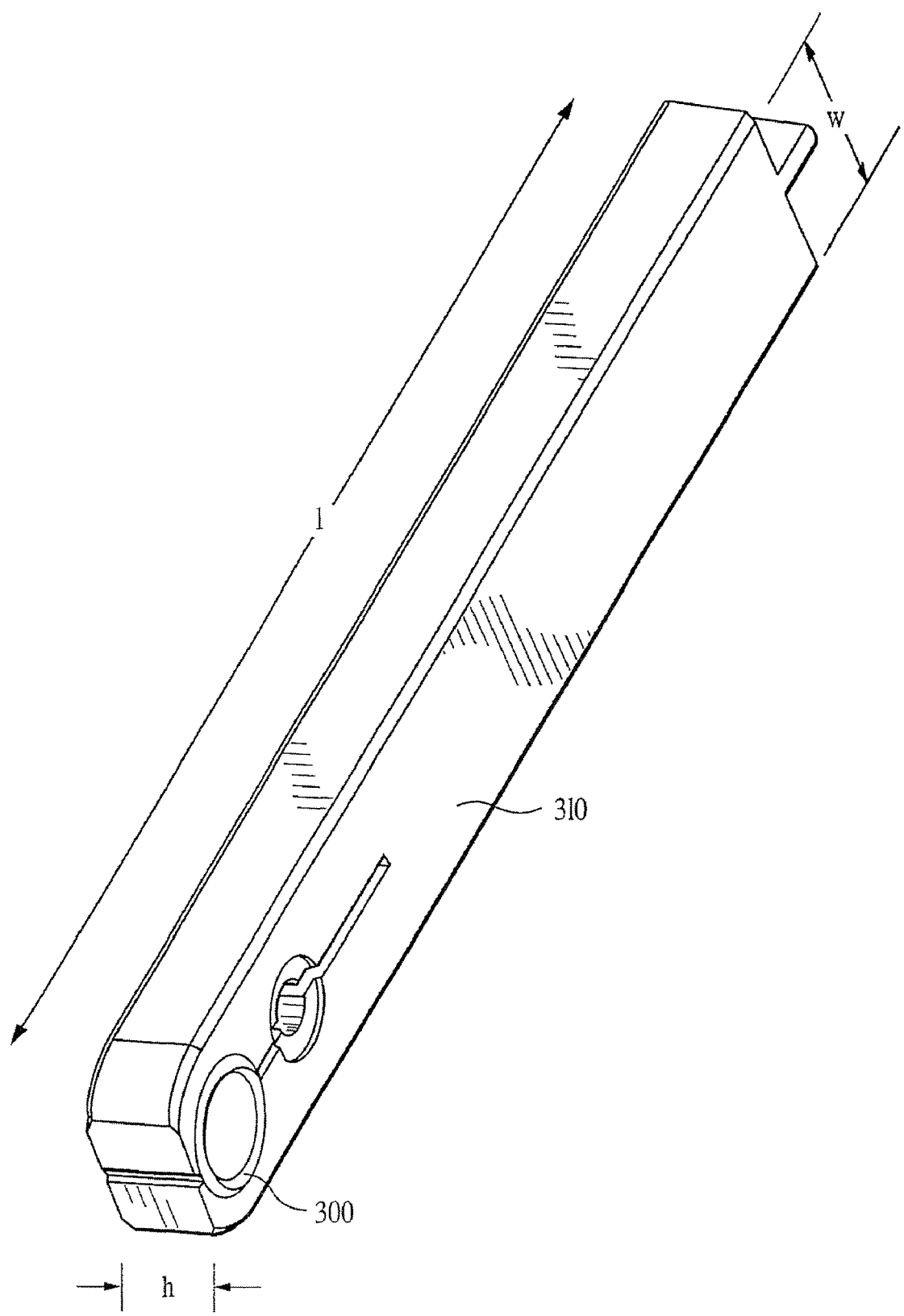
FIG. 25 is an unscaled perspective view of a lens and lens holder combination of the present invention.

Referring to FIG. 25, a lens element 300 is held by clamping holder 310. Holder 310 is comprised of an elongated rectangular cross-section aluminum rods having large radiative surface which grasps lens 300 via a clamping arrangement. In the embodiment shown, the lens 300 is inserted into a bore by spreading of the clamp through the insertion of a spreading tool, not shown. Alternatively, clamp 310 and lens 300 may be joined through extreme cooling of lens 300 to shrink it to a smaller size than the bore, for example by immersion in a liquid nitrogen bath, and insertion of the cold, reduced diameter lens 300 into clamp 310, subsequently allowing lens 300 to expand to room temperature, thus cold welding the assembly together. These means of mounting and holding lens elements such as lens element 300 produces effective heat transfer across the mated, contacting surfaces and enables radiative heat dissipation from the large surface area of clamp holder 310. To improve the emittance properties of the aluminum holder 310, the services can be anodized or coated with a colloidal suspension of carbon such as Aquadag®. An additional benefit of the assembly of lens holder 310 and lens element 300 is that the holder and the lens element may be of different material. For example, lens 300 may be constructed of stainless steel which is chemically inert or molybdenum which has very good structural characteristics at high temperature.

Figure 26:
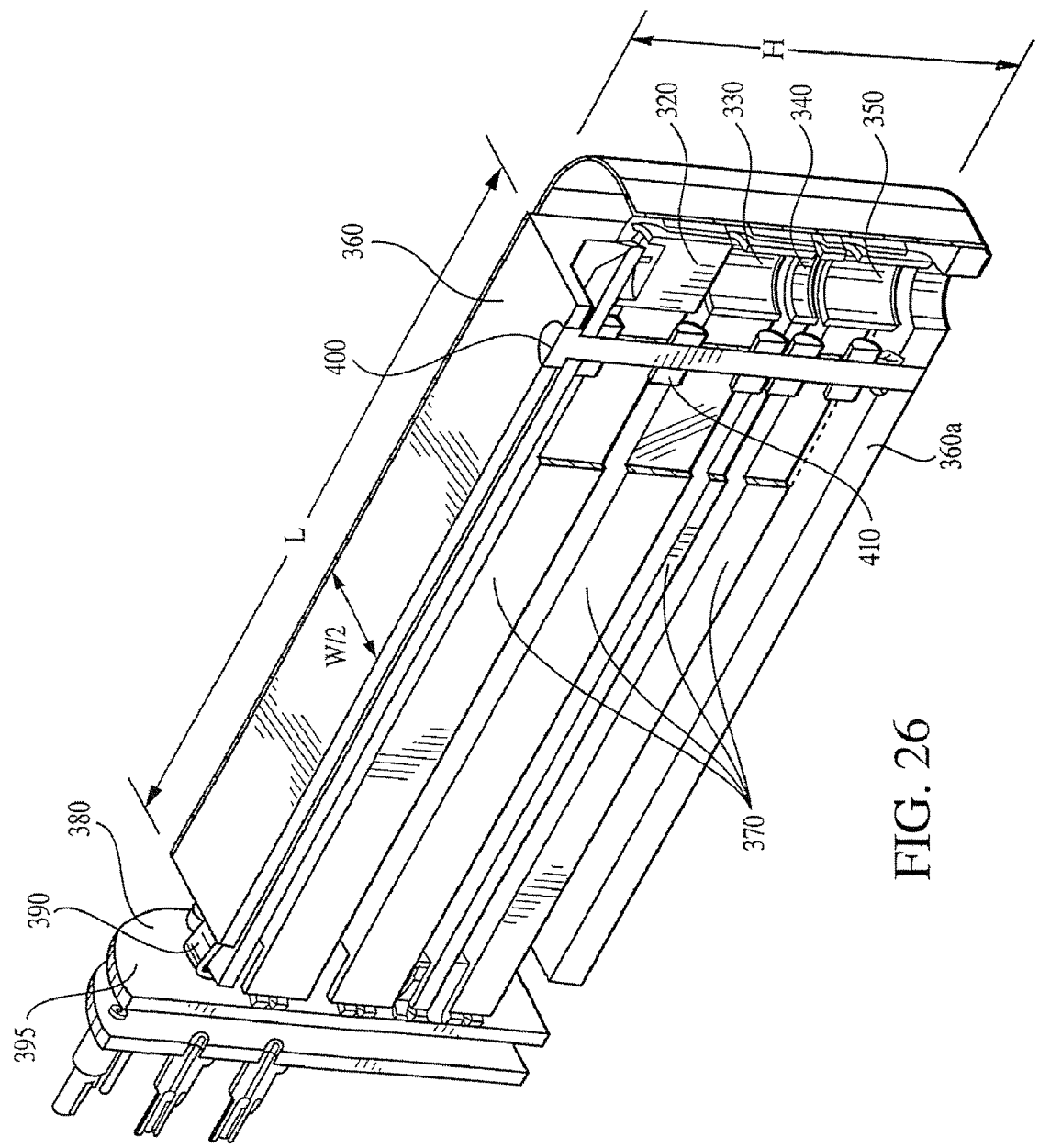
FIG. 26 is an unscaled cross-sectional perspective view of the electron gun of FIG. 27.
Figure 27:
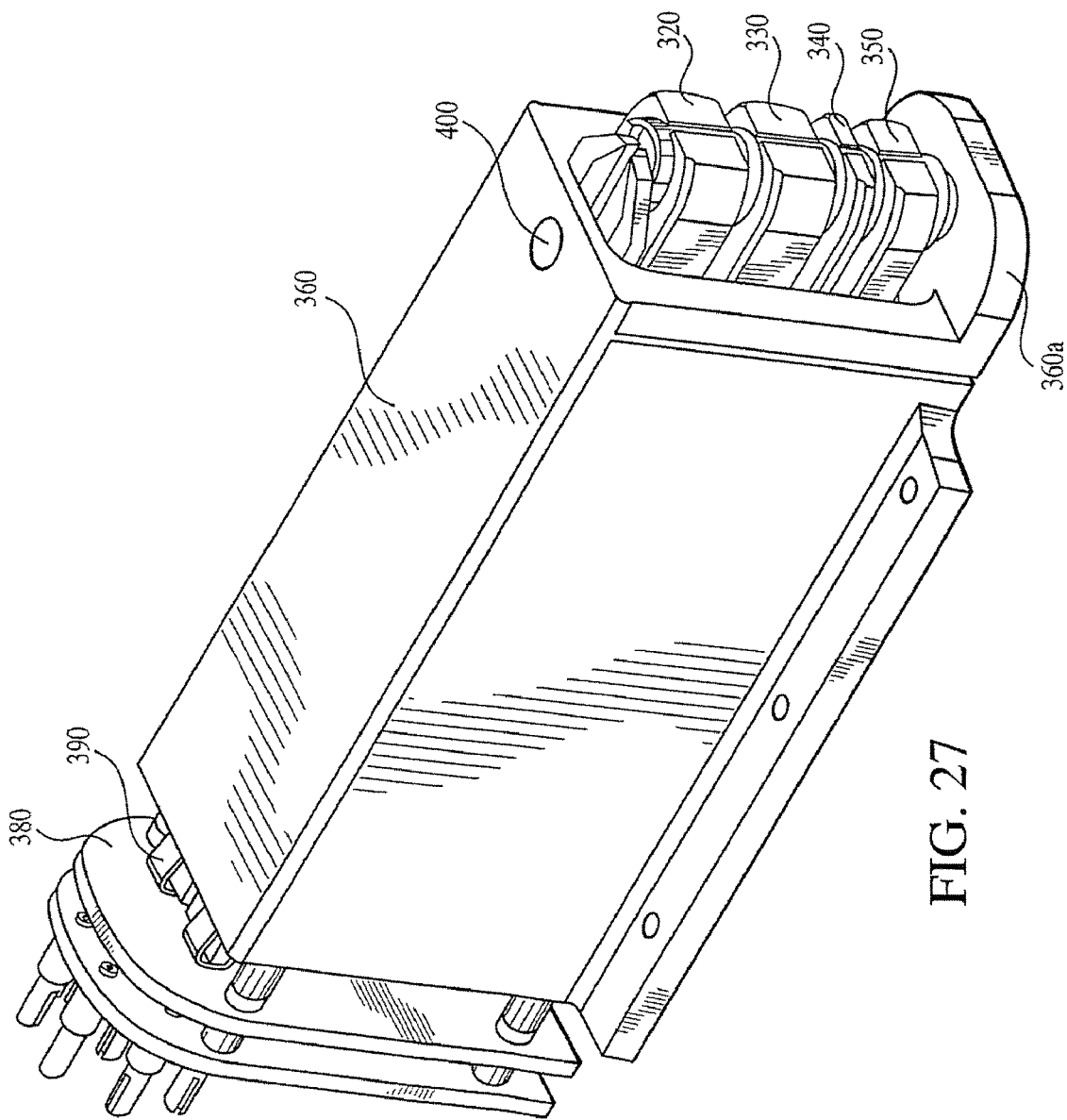
FIG. 27 is an unscaled perspective view of an electron gun of the present invention.

Referring to FIGS. 26 and 27, the electron gun consists of four discrete and separated lens elements: the cathode assembly 320 followed, in sequence, by first anode 330, focus electrode 340, and exit lens 350, each lens in array to be at different potential held by a respective holder of the general construction just described for holder 310. A gap is provided between lens element 350 and the base of a housing 360 which completely surrounds the assembly of four spaced-apart lens holders. The housing 360 of aluminum maintained at much colder temperature than lens elements 320-350 and allows radiative coupling between the several lens holders 370. This is accomplished by close coupling the base 360a of housing 360 in good thermal contact with a water cooled or temperature controlled source block which has been previously described.

Because of the large contact surface area and the good thermal coupling, which is accomplished by thermally conductive elastomeric seals between base 360a and source block which is temperature controlled, the housing 360 can be maintained at a temperature not too different from the temperature of the source block. Thus, a temperature difference is maintained between the several lens holders 370 and the housing 360, enabling good radiative transfer from the broad radiative surface of the lens holder. Furthermore, the use of radiative cooling enables a stable operating temperature for the electron gun, that is somewhat independent of power dissipated in the gun elements. This stability is due to the nonlinear effect of radiative cooling which is much less efficient at low temperatures than at the very efficient high temperatures. Thus the assembly is, to a degree, self regulating and allows for consistent operating temperature of the electron gun elements.

The several lens holders 370 are constructed in a mostly rectangular profile so that significant surface area is exposed both to neighboring surfaces of the other lens element holders as well as to the surface of the housing 360. This arrangement accomplishes two functions. The first function is that the regions where the highest power dissipation is expected (namely the uppermost lens element comprising the cathode assembly 320 and the bottommost lens, exit lens 350) are directly cooled by close proximity to the heat reservoir represented by housing 360, whereas some of the power dissipated in the lens element 330 and 340 shown in FIG. 26 is distributed among the lens elements, enabling a more uniform operating temperature to occur. Nevertheless, there is significant radiative loss area exposed to the cooled housing 360 for all the lens elements since four sides of the holders are radiatively exposed to opposing surfaces of the housing. If two or fewer sides of a holder are exposed to neighboring elements and two or greater sides are exposed to the cooled housing 360.

Referring now to FIG. 25, typical dimensions of holder 310 are a length l of 170 millimeters, width w of 26 millimeters, and height h of 12 millimeters. Lens element 300 typically has an inside diameter of 12.5 millimeters and an outside diameter of 16 millimeters.

Turning now to FIG. 26, the overall dimensions of the gun assembly are shown with length L of 6 inches, height H of 3 inches, and width W of 1.5 inches. Feed through 380 contacts the individual lens elements through metal springs indicated by 390 which are electrically isolated from each other by a holder plate 395 of ceramic, which allows mechanical stability of the clips such that when the clips are engaged to the several lens holders 370 they accomplish both electrical contact to the individual elements and also provide indexing and registration to maintain alignment of the lens elements. The lens elements are further constrained and insured to be coaxial by an alumina rod 400 which passes through several alumnus spacers 410 that are individually counterbored into each of the lens holders 370. This accomplishes both electrical isolation and also controls the spacing between the lens elements and insures alignment in three dimensions.

The lens elements 320, 330, 340, 350 and any subsequent lens must be maintained in a coaxial relationship to a high degree of tolerance to ensure proper focusing of the electron beam and to limit aberrations. The fields that are set up between the lens elements are very sensitive to this alignment, especially in the polar angular coordinates defined by the cylindrical symmetry of the lens system (the z-axis being along the mechanical axis, i.e., the direction being the direction of propagation of the electron beam), and also the two dimensional spatial coordinates that are transverse to this axis. However, it must be said that the degree of alignment required for the *correct direction and focusing of the electron beam is within the normal limits of machining practices and most importantly, of the alignment techniques accomplished by alumna rod 400, individual spacers 410, precision machining of both lens elements 320 through 350 and the several holders 370. The construction of the lens elements in correct alignment ensures that the beam will propagate in the correct direction through the desired volume in the ionization chamber and also that the beam will be well defined, propagating parallel to the long dimension of the ion extraction aperture. Thus, a small volume ionization region is precisely located adjacent to the ion extraction aperture to achieve high brightness and low emittance, as described above. In addition, proper temperature control of the lens elements is important for the operation of the ion source as a whole to prevent either condensation or decomposition of process gas or process vapor which normally occupies the ionization chamber and therefore penetrates into the electron gun region. Should excessive decomposition or condensation occur in the lens elements it will degrade the overall life time of the ion source and have a negative impact on preventive maintenance intervals. In order to ensure proper ion beam characteristics of the ion extracted from the ion extraction aperture it is important that the ionization region be uniformly located with respect to the ion extraction aperture. Misalignment or defocusing of the electron beam will cause variation in proximity and size of the electron beam and hence the ionization region along the long axis of the ion extraction aperture which is undesirable. However, proper alignment of the electron beam and proper focusing of the electron beam, as achieved by the alignment and Coupling features, and temperature stability which have been described for the holders, ensure that ion beam created in the ionization chamber is bright, the transverse energy of the ions is limited, and the ions are created mostly located in front of the aperture, and in a uniform density across the long axis of the aperture. The brightness of the ion beam that is extracted from the ion source which is proportional to the total current and inversely proportional to the emittance of the ions as they exit the ion extraction aperture, becomes higher as the ionization volume is decreased as long as the total current remains constant. Thus with the design described, by achieving a dense electron beam which is well controlled within a small ionization volume, a much brighter source of ions is obtained than would be obtained with a diffuse ionization region created by a defocused or misaligned electron beam.

The brightness properties enabled by this lens and lens holder design, where the brightness of the ion source is maximized is very important when used in an accel-decel (acceleration-deceleration) type ion implanter where the performance of the implant on wafer is directly proportional to the brightness of the ion beam. That is, the characteristics of devices formed by the implanter and also the productivity of the implanter, are directly related to the level of brightness of the ion beam. Therefore this design enables high brightness beams for accel-decel type implanters to be achieved and thus improves the performance of accel-decel designs.

In the case of using decaborane or similar Clusters to further enhance the brightness of beams delivered in any kind of implanter and in particular with respect to accel-decel implant ions, excellent temperature control of all parts of the ion source including the electron gun elements which are in contact with the decaborane vapor, as achieved here, is critical to the success of the ion source. In particular, it will enable high ion currents to be produced. It will also enable much longer life time and much higher production worthiness in the final ion source and in the implants. Decaborane in particular will dissociate to boron components when it meets a wall temperature in excess of 350 C. Decomposed boron particles can deposit on cathodes and lens elements. If significant boron becomes deposited on the cathode it can degrade the performance of the cathode and significantly reduce ion production, thus limiting lifetime of the cathode. Also boron components can cause lens elements to charge and become less effective at controlling the electron beam and hence reduce the brightness of the ion beam generated by the ion source. Therefore, good temperature control as achieved by the design just described is critical to successful implementation of decaborane, particularly for accel-decel applications.

What is claimed is:

1. A method of ion implantation by producing a high brightness ion beam that extends along an axis by ionizing molecules of a gas or vapor, the molecules containing an implantable species, the method comprising:

providing an ionization chamber having a restricted outlet aperture, providing in said ionization chamber said gas or vapor at a pressure substantially higher than the pressure within an extraction region into which the ions are to be extracted external to the ionization chamber, ionizing the gas or vapor in said ionization chamber by way of an electron source outside of said ionization chamber, extracting ions formed within the ionization chamber via the outlet aperture into the extraction region downstream of the aperture, transporting the beam to a target surface, and implanting the ions of the transported ion beam into the target.

2. The method of claim 1 in which conditions are maintained within the ionization chamber to prevent formation of a plasma.

3. The method of claim 1 in which the brightness of the ion beam upon extraction is more than about $1mA\text{-}cm^{-2}\text{-}deg^{-2} \times (E_0/E)^{1/2}$, where E=beam energy and $E_0$=10kEv.

4. The method of claim 1 in which the x-emittance of the beam upon extraction is less than about 70 mm-mrad×(Eo/E), where E is the beam energy and Eo=10keV, for an ion current density of at least 1 mA/cm2, even for an ion mass of 120 amu.

5. The method of claim 1 in which a beam noise of a stream of ions extracted through the outlet aperture is maintained below 1%.

6. The method of claim 1 in which a field strength of any magnetic field present in the ionization chamber is less than 70 gauss.

7. The method of claim 6 in which the field strength of any magnet field present in the ionization chamber is less than 20 gauss.

8. The method of claim 7 in which there is substantially no magnetic field present in the ionization chamber.

9. The method of claim 1 in which any magnetic field present in the extraction region has a field strength of less than about 20 gauss.

10. The method of claim 1 in which the consumption of said gas or vapor is maintained less than 10 sccm.

11. The method of claim 1 in which said electrons are introduced into the ionization chamber by electron optics in a directed beam generated external to said ionization chamber.

12. The method of claim 1 in which each of the molecules to be ionized respectively comprises at least two atoms of the implantable species.

13. A method of ion implantation comprising producing a high brightness ion beam that extends along an axis by providing an ionization chamber having an outlet aperture, providing in the ionization chamber molecules of a gas or vapor, in which each molecule to be ionized comprises at least two atoms of an implantable species, ionizing said molecules and extracting ions formed from said molecules under conditions to produce a beam having a brightness of upon extraction is more than about $1 mA\text{-}cm^{-2}\text{-}deg^{-2} \times (E_0/E)^{1/2}$, where E=beam energy and $E_0$=10kEv and an x-emittance of less than about 70 mm-mrad×(Eo/E) 2 (where E is the beam energy and EO=10keV), for an ion current density of at least 1 mA/cm2, even for an ion mass of 120 amu, thereafter, with ion beam optics, transporting the beam to a target surface, and implanting the ions of the transported ion beam into the target.

14. The method of claim 13 in which the molecules are dimers.

15. The method of claim 13 in which the molecules comprise decaborane.

16. The method of claim 13 conducted in a manner to cause the high brightness ion beam to have a low angular divergence at contact with the target of less than about one degree relative to said axis.

17. The method of claim 16, wherein the step of implanting the ions of the transported ion beam into the target is employed to cause the high brightness, low divergence beam to form a drain extension region of a transistor structure on the target, in which the transistor structure comprises a source, a gate and a drain.

18. The method of claim 17 in which the target further comprises a well dopant and the gate of the transistor structure has a gate length of 0.20 um or less, a drain extension intersecting the gate at a lateral junction edge, the drain extension having a lateral abruptness of 3 nm/decade or less, wherein lateral abruptness is defined as a lateral extent required to accomplish a one decade change in a volume concentration of an implanted species at a lateral junction edge, the junction edge being defined as the region where the volume concentrations of the implanted ions and the well dopant are equal.

19. The method of claim 18 wherein the drain extension has a lateral abruptness of 2 nm/decade or less.

20. The method of claim 17 in which ions of the high brightness, low angular divergence beam are implanted at opposite ends of the gate, sharply defining a channel beneath the gate.

21. The method of claim 20, wherein sharply defining a channel beneath the gate includes sharply defining the length of the channel.

22. An ion implantation system for implanting at a desired low implant energy into a target substrate comprising an ion source for producing molecular ions (based on a molecule having a cluster of atoms of a desired species to be implanted), an acceleration stage enabling the ions to be accelerated to a transport energy substantially greater than a desired implant energy, and prior to the target substrate, a deceleration stage for lowering the energy of the ions to the desired implant energy in which a lengthy elongated ionization chamber has a correspondingly elongated slot-form extraction aperture, and electron optics following the extraction aperture are constructed to reduce a length of the profile of the resultant beam, relative to a corresponding length of the extraction aperture, prior to the beam entering the analyzer.

23. The ion implantation system of claim 22 in which the electron optics comprise a telescope.

24. The ion implantation system of claim 22 in which the extraction aperture of the ionization chamber is of the order of about 6 inches in length.

25. An ion implantation system comprising: an ion implanter having an ion extraction system; an ion source for providing ions in commercial ion current levels to the ion extraction system, the ion source including an ionization chamber defined by walls enclosing an ionization volume, one of said walls defining an extraction aperture of a length and width sized and arranged to enable an ion current to be extracted from said ionization volume by said extraction system; an electron gun constructed, sized and arranged with respect to the ionization chamber to project a directional beam of primary electrons along an axis through the ionization chamber; a beam dump aligned with the electron gun to receive a directional beam, the beam dump being maintained at a substantial positive voltage relative to the emitter voltage of the electron gun, the axis of the beam path of said primary electrons extending in a direction generally adjacent to the extraction aperture, the electron beam having a dimension in a direction corresponding to the direction of the width of the extraction aperture that is about the same as or larger than the width of the extraction aperture.

26. The ion implantation system of claim 25 further comprising a vaporizer arranged to introduce vapor to the ionization volume, a gas passage for introducing gas from a gas source to the ionization volume and a control system enabling control of an energy associated with the primary electrons to ionize individual vapor or gas molecules principally by collisions with primary electrons from the electron gun.

27. The ion implantation system of claim 26 wherein the vapor comprises decaborane.

28. The ion implantation system of claim of claim 25 in which the directional beam is a ribbon ion beam.

29. The ion implantation system of claim 28 in which the ribbon ion beam is of shorter extent than the length of the ion extraction aperture.

30. The ion implantation system of claim 28 in which the ribbon ion beam is longer than the ion extraction aperture.

31. The ion implantation system of claim 28 in which the ribbon beam is about the same length as the length of the ion extraction aperture.

32. The ion implantation system of claim 30 in which the length of said aperture is at least as long as the length oi width of a target substrate.

33. A method of irradiating an extended panel of predetermined dimensions, the method comprising generating a ribbon ion beam with the ion implantation system of claim 25 and directing the ribbon ion beam onto a surface of the extended panel.

34. The method of claim 33 in which the extended panel is a flat panel, the method including irradiating the flat panel across substantially an entire panel surface.

35. The method of claim 34 wherein the ribbon ion beam produced is stationary, the flat panel being mechanically scanned across the beam to accomplish ion doping of the panel.

36. The method of claim 30 in which the length of the ribbon beam is selected to be longer than the flat panel substrate dimension orthogonal to the scan direction.

* * * * *